(12) United States Patent
Mitsumori et al.

(10) Patent No.: US 6,517,635 B2
(45) Date of Patent: Feb. 11, 2003

(54) LIQUID FEED NOZZLE, WET TREATMENT APPARATUS AND WET TREATMENT METHOD

(75) Inventors: Kenichi Mitsumori, Miyagi-ken (JP); Yasuhiko Kasama, Miyagi-ken (JP); Akira Abe, Miyagi-ken (JP); Oh Eui Yeol, Kyongki-Do (KR); Tadahiro Ohmi, Miyagi-ken (JP); Takayuki Imaoka, Tokyo (JP); Masayuki Toda, Yamagata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/803,588

(22) Filed: Mar. 9, 2001

(65) Prior Publication Data

US 2001/0037819 A1 Nov. 8, 2001

Related U.S. Application Data

(62) Division of application No. 09/083,348, filed on May 22, 1998, now Pat. No. 6,230,722.

(30) Foreign Application Priority Data

| Nov. 29, 1996 | (JP) | 8-334632 |
| Dec. 18, 1996 | (JP) | 8-338695 |
| Jul. 24, 1997 | (JP) | 9-198313 |

(51) Int. Cl.[7] .............................. B08B 3/04; B08B 3/12
(52) U.S. Cl. .............................. 134/1; 134/15; 134/34
(58) Field of Search .............................. 134/64 R, 64 P, 134/122 R, 122 P, 186, 198, 199, 15, 34, 1

(56) References Cited

U.S. PATENT DOCUMENTS

| 2,956,494 A | 10/1960 | Tyler et al. |
| 3,958,587 A | 5/1976 | Brown |
| 5,339,842 A | 8/1994 | Bok |
| 6,047,715 A | 4/2000 | Mooney et al. |

FOREIGN PATENT DOCUMENTS

JP   3-259523 (Abstract)   11/1991

*Primary Examiner*—Philip Coe
(74) *Attorney, Agent, or Firm*—Brinks Hofer Gilson & Lione

(57) ABSTRACT

The wet treatment liquid feed nozzle of the invention comprises an introducing path having an introducing port, a discharging path having a discharging port, a crossing section formed by causing the introducing path and the discharging path to cross at the other ends thereof, a nozzle assembly having an opening section opening to an object to be treated, provided at the crossing section, and pressure control means, for controlling the difference between the pressure of the wet treatment liquid in contact with the object to be treated and the atmospheric pressure provided at least on the discharging path side so that the wet treatment liquid having been in contact with the object to be treated via the opening section does not flow to outside the discharging path.

8 Claims, 50 Drawing Sheets

WATER DISCHARGE

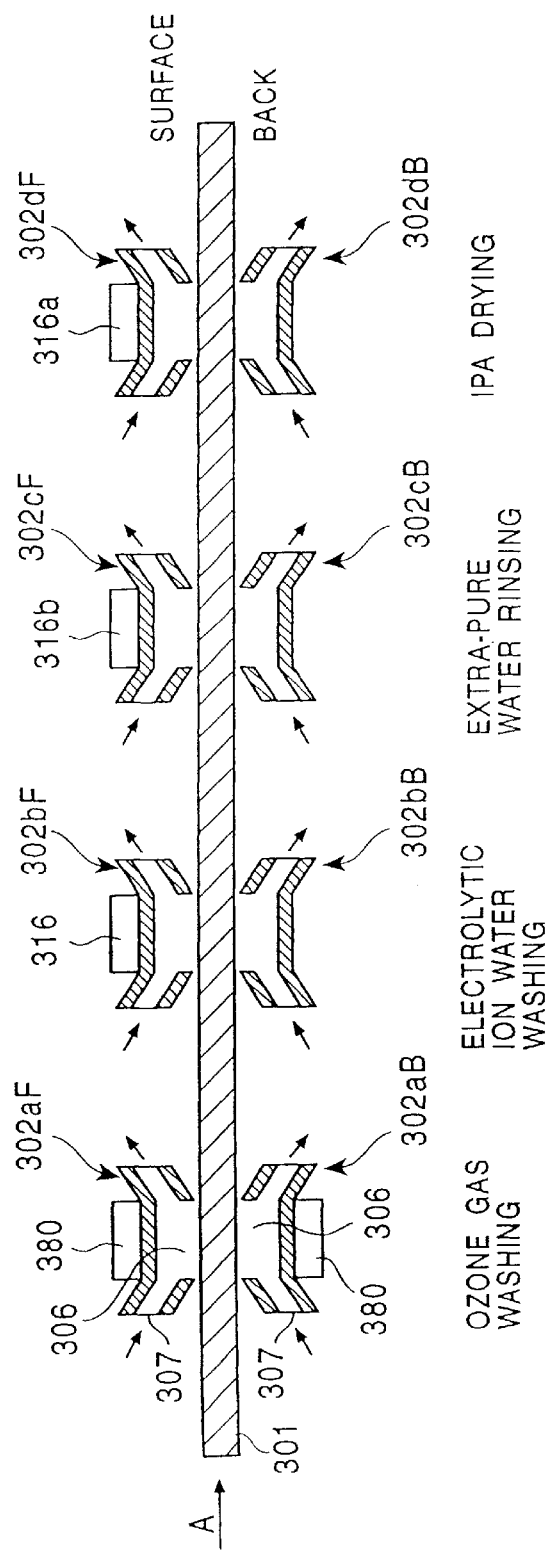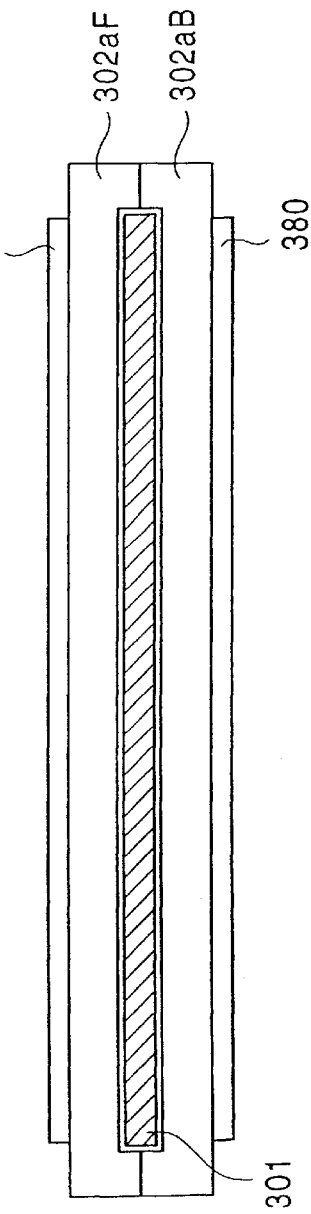

LIQUID FEED NOZZLE, WET TREATMENT APPARATUS AND WET TREATMENT METHOD

This application is a divisional application of U.S. application Ser. No. 09/083,348 filed on May 22, 1998, and now U.S. Pat. No. 6,230,722, entitled "Liquid Feed Nozzle, Wet Treatment Apparatus and Wet Treatment Method".

BACKGROUND OF THE INVENTION

1. Field of the Invention

The present invention relates to a fluid saving type fluid feed nozzle, a fluid saving type treatment fluid feed nozzle apparatus, a washing treatment system, and a treatment apparatus used for a wet treatment or a dry treatment such as washing, etching, development or stripping.

2. Description of the Related Art

From the point of view of washing from among the surface fluid treatments of large-sized substrates such as a substrate for solar cell, a substrate for liquid crystal, a substrate for plastic package and the like, the conventional art and problems will be described below.

A washing apparatus shown in FIG. 52 has conventionally been commonly used. FIG. 52A is a side view, and FIG. 52B is a plan view.

Washing is carried out by feeding a washing such as extra-pure water, electrolytic in water, ozone water or hydrogen water by means of a wet treatment liquid feed nozzle 2 onto the upper surface of a substrate 1 while moving the substrate 1, for example, in the arrow A direction.

A washing liquid feed chamber 4, an opening section 6 guiding the washing liquid onto the substrate and a washing liquid introducing port 7 for introducing the washing liquid into the washing liquid feed chamber 4 are formed, as shown in FIG. 53 in this wet treatment liquid feed nozzle 2.

An ultrasonic element 16 is provided above the washing liquid feed chamber 4 to improve washing effect by imparting an ultrasonic wave of the order of MHz band to the washing liquid.

A washing liquid such as extra-pure water, electrolytic ion water, ozone water or hydrogen water is introduced from a washing liquid introducing port 7 into the washing liquid feed chamber 4 and fed to the substrate surface which is an object to be washed through the opening section 6 to wash the same. After washing with the washing liquid, rinsing is performed with a rinsing liquid (extra-pure water in general) by means of a nozzle having a structure similar to that of the wet treatment liquid feed nozzle 2 shown in FIG. 53 with a view to removing the washing liquid from the surface of the object to be washed, and to eliminating residual particles and the like.

However, the aforesaid conventional art has the following problems.

(1) First, it requires a large consumption of a washing liquid or a rinsing liquid.

For example, in order to achieve a cleanliness as represented by a amount of residual particles (for example, $Al_2O_3$ particles) remaining on the substrate 1 on a level of 0.5 particles/cm$^2$, when a 500 mm square substrate 1 is washed with a washing liquid such as electrolytic ion water, and then rinsed with a rinsing liquid, the washing liquid and the rinsing liquid must be fed at a flow rate within a range of from about 25 to 30 L/min. The flow rate within a range of from 25 to 30 L/min is selected to permit imparting a stable ultrasonic wave. With a rate of under 25 to 30 L/min, therefore, it becomes impossible to stably impart an ultrasonic wave, and hence to wash cleanly. The consumption of the washing liquid must currently be large for the reason as described above. A liquid consumption of 25 to 30 L/min is still required because the frequency of the ultrasonic wave is raised and the nozzle slit width of ultrasonic washing is reduced. Here is a limit of the existing art.

(2) The second problem is that applicability of ultrasonic wave near the MHz band is limited. There is currently available ultrasonic wave within a range of from 0.7 to 1.5 MHz. In all cases of wet treatment, occurrence of a damage to the object to be treated should be avoided. For this purpose, it is the usual practice to use ultrasonic wave near the MHz band which does not cause a damage resulting from cavitation in washing. A lower limit of usage is adopted from the point of view of avoiding occurrence of a damage to the object to be treated. An upper limit is selected in view of the fact that an effective power available for washing cannot be derived with ultrasonic wave of a frequency of over 2 MHz. Conceivable reasons of impossibility to derive an effective power applicable for washing include the facts that the effective power is low because of a problem in circuit of the ultrasonic element and that, as shown in FIG. 53, the ultrasonic element is distant from the object to be wet-treated, resulting in a large attenuation of ultrasonic power.

(3) The third problem is that, because the washing liquid imparted with an ultrasonic wave as in the washing liquid feed chamber 4 is fed via the narrow opening section 6 onto the object to be washed, there occurs a considerable damping of ultrasonic output, this to the necessity to increase the input power beyond necessity and therefore to a shorter service life of the ultrasonic oscillator. With an ultrasonic wave having a frequency within a range of from 0.7 to 1.5 MHz, while it is possible to derive an effective power applicable for washing, the ultrasonic element is distant from the object to be washed as shown in FIG. 53, and damping of the ultrasonic power is still serious. Load on the adhering surface of the ultrasonic oscillator is very large so that only a slight change in the feed amount of washing liquid or the like may often cause a failure.

(4) The fourth problem lies in cleanliness after washing. Even when a large amount of washing liquid (25 to 30 L/min) is used and a sufficient rinsing is carried out after washing as described above, the resultant cleanliness is limited to a level, resulting in an average cleanliness of about 0.5 particles/cm$^2$.

When a higher cleanliness (about 0.05 particles/cm$^2$) is demanded, the conventional washing technology cannot cope with this demand. Even within a substrate, furthermore, there are fluctuations of cleanliness, and therefore, the portion on the side (b) opposite to the travel of the substrate 1 as shown in FIG. 52 shows a cleanliness lower than that of the portion (a) on the travelling side. As is clear from the distribution of cleanliness shown in FIG. 52B, a problem is that the portion closer to the leading end (a) in the travelling direction has a higher cleanliness, and cleanliness worsens toward the rear end (b) in the travelling direction.

This is attributable to the fact that particles once removed adhere again to the substrate surface while the washing liquid fed from the feed nozzle to the substrate surface flows in the form of a liquid film on the surface of the large-sized substrate to the substrate edge.

The present inventors obtained the following findings regarding washing, a form of wet treatment. Consideration on reasons why a high cleanliness could not be obtained from washing by means of a conventional washing apparatus as shown in FIG. 52b led to a conclusion that it was caused by the following reasons. When the washing liquid is fed from the nozzle opening section 6, the leading end side (a) of the substrate 1 is washed. However, since the substrate 1 travels in the arrow A direction, the washing liquid having washed the surface is transferred smoothly along the surface of the substrate 1 to the rear end (b) of the substrate 1. Because the washing liquid after washing contains particles, these particles adhere again to the surface of the substrate 1 during travel toward the (b) end side. The amount of accumulated particles is larger in the washing liquid after washing at a position closer to the rear end so that the amount of adhesion is larger, leading to a poorer cleanliness.

The present inventors thus clarified that the cause of a poorer cleanliness and an increased consumption of rinsing liquid lay in re-adhesion of once removed particles.

The present invention is therefore to prevent, in a wet treatment method for gradually feeding a wet treatment liquid to an object to be wet-treated, re-adhesion of a wet treatment liquid fed from the wet treatment liquid feed nozzle to the object to be wet-treated, by removing the same from the object to be wet-treated without allowing it to come substantially into contact with portions other than the portion to which the wet treatment liquid has been fed. More particularly, re-adhesion is prevented by immediately removing the wet treatment liquid having contributed to a wet treatment to outside the system.

The present inventors developed a wet treatment liquid feed nozzle, a wet treatment apparatus and a wet treatment method as described above as a technique for preventing re-adhesion.

The invention has therefore an object to pre-liquid-saving type treatment liquid feed nozzle, a treatment liquid feed nozzle apparatus, a washing system and a treatment apparatus which solve the problems of the conventional wet and dry treatment apparatuses and wet and dry treatment methods, permit reduction of the consumption of the treatment liquid to under a tenth the conventional consumption, and allow to obtain a higher cleanliness than the conventional one.

Another object of the invention is to provide a treatment liquid feed nozzle, a treatment liquid feed nozzle apparatus and a treatment apparatus in which leakage of the treatment liquid from the treated surface of the object to be treated to outside is non-existent or very slight, if any.

SUMMARY OF THE INVENTION

To solve the foregoing problems, the wet treatment liquid feed nozzle of the invention comprises a nozzle assembly which has an introducing path having an introducing port for introducing a wet treatment liquid at an end thereof, a discharging path having a discharging port for discharging the wet treatment liquid after a wet treatment to outside the wet treatment system and an opening section opening to an object to be wet-treated provided at a crossing section formed by causing introducing path and the discharging path to cross at the other ends thereof; and pressure control means for controlling a difference between pressure of the wet treatment liquid in contact with the object to be wet-treated and the atmospheric pressure so as to prevent the wet treatment liquid in contact with the object to be wet-treated via the opening section after the wet treatment from flowing to outside the discharging path.

By using this configuration, the treatment liquid comes into contact only with the object to be treated and is therefore effectively utilized. Further, because the treatment liquid after use is immediately removed to outside the system, inconveniences in the treated object caused by the treatment liquid after use can be eliminated.

The wet treatment liquid feed nozzle of the invention may be provided with means for imparting an ultrasonic wave to the wet treatment liquid.

According to this nozzle, it is possible to impart an ultrasonic oscillation via the wet treatment liquid appropriately to the object to be wet-treated, leading, for example in washing, to a remarkable improving effect of cleanliness.

The wet treatment apparatus of the invention comprises at least:

a wet treatment liquid feed nozzle comprising a nozzle assembly which has an introducing path having an introducing port for introducing a wet treatment liquid at an end thereof, a discharging path having a discharging port for discharging the wet treatment liquid after a wet treatment to outside the wet treatment system and an opening section opening to an object to be wet-treated provided at a crossing section formed by causing the introducing path and the discharging path to cross at the other ends thereof; and pressure control means for controlling a difference between pressure of the wet treatment liquid in contact with the object to be wet-treated and the atmospheric pressure so as to prevent the wet treatment liquid in contact with the object to be wet-treated via the opening section after the wet treatment from flowing to outside the discharging path;

means for causing a relative displacement of the wet treatment liquid feed nozzle and the object to be wet-treated;

a wet treatment liquid feed source; and means for feeding a wet treatment liquid from the wet treatment liquid feed source to the introducing port of the wet treatment liquid feed nozzle.

According to the wet treatment apparatus invention, it is possible to optimize the relative position of the wet treatment liquid feed nozzle and the object to be wet-treated, and hence to accomplish a wet treatment while easily preventing leakage of the wet treatment liquid and moving throughout the entire surface of the object to be wet-treated.

When moving the wet treatment liquid feed nozzle relatively to the object to be wet-treated, in a structure in which the nozzle assembly and the pressure controller are integrally formed, it suffices to move the integral wet treatment liquid feed nozzle, and in a structure in which a part of the pressure controller is composed, for example, of a large-sized pump, it is not necessary to move the pressure controller, but it suffices to move only the nozzle assembly.

The wet treatment method of the invention comprises the steps of:

gradually feeding a set treatment liquid from a wet treatment liquid feed nozzle to an object to be wet-treated while causing a relative displacement of the object to be wet-treated and the wet treatment liquid feed nozzle, and discharging the wet treatment liquid fed from the wet treatment liquid feed nozzle to the object to be wet-treated without causing the wet treatment liquid to be in contact with portions other than the portion to which the wet treatment liquid has been fed, by controlling a difference between the pressure of the wet treatment liquid in contact with the object to be wet-treated and the atmospheric pressure.

According to the wet treatment liquid feed nozzle of the invention, it is possible to apply wet treatment to the entire surface of even an object to be wet-treated larger in size than the wet treatment liquid feed nozzle by causing a relative displacement of the object to be wet-treated and the wet treatment liquid feed nozzle.

The wet treatment liquid feed nozzle of the invention may be provided with means for imparting an ultrasonic wave to the wet treatment liquid.

According to the wet treatment liquid feed nozzle of the invention, it is possible to effectively apply a wet treatment to an object to be wet-treated by imparting an ultrasonic wave via the wet treatment liquid to the object to be treated.

In the wet treatment liquid feed nozzle of the invention, a portion of a ceiling opposite to the treatment surface of the object to be wet-treated should preferably be formed into a waved shape having a plurality of steps, and a plurality of ultrasonic elements should preferably be provided at an angle to the treatment surface of the object to be wet-treated on the stepped portion.

By using this structure, the gap between the ultrasonic elements and the object to be treated becomes substantially uniform, and it is possible to cause the ultrasonic vibration to act uniformly on the object to be treated.

In the wet treatment liquid feed nozzle of the invention, two introducing paths may be formed to the right and the left of the crossing section, with the discharging path in between.

By using this nozzle, the wet treatment liquid is fed in opposite directions from the right and the left introducing paths, further reducing leakage of the treatment liquid.

In the wet treatment liquid feed nozzle of the invention, two discharging paths may be formed to the right and the left of the crossing section, with the introducing path in between.

By using this nozzle, the wet treatment liquid after use is discharged through the right and the left discharging paths, thus reducing leakage of the treatment liquid.

The wet treatment liquid feed nozzle may be provided with a measuring section capable of measuring the length of the distance to the wet treatment surface of the object to be wet-treated.

With this nozzle, it is possible to accurately determine the distance to the object to be wet-treated, thus ensuring accurate control of the flow of the wet treatment liquid.

Further, another embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, and an opening section opening in a mesh shape toward an object to be wet-treated, provided at the crossing section.

According to this wet treatment liquid feed nozzle of the invention, in which the opening has a mesh shape, the wet treatment liquid is prevented from dropping by surface tension of the wet treatment liquid even when the wet treatment liquid feed nozzle is kept away from the object to be wet-treated.

A further embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, an opening section opening in a mesh shape toward an object to be wet-treated, provided at the crossing section, and cilia or a film provided around the opening section in parallel with the normal of a treatment surface of the object to be wet-treated.

According to the nozzle of this configuration, leakage of the wet treatment liquid in contact with the treatment surface of the object to be treated to outside the system can be prevented by the cilia or the film.

Another embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, an opening section opening in a mesh shape toward an object to be wet-treated, provided at the crossing section, and at least an auxiliary path communicating with the crossing section between the discharging path and the object to be wet-treated on the side of the discharging path.

According to this wet treatment liquid feed nozzle of the invention, when the treatment liquid at the crossing section is in short, it is possible to keep pressure balance between the pressure of the wet treatment liquid and the atmospheric pressure by injecting the treatment liquid by the use of an auxiliary path communicating with the crossing section at which the introducing path and the discharging path cross each other.

Further, another embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, an opening section opening in a mesh shape toward an object to be wet-treated, provided at the crossing section, and a parallel flow section permitting flow of the wet treatment liquid provided in parallel with the treatment surface of the object to be wet-treated.

According to this wet treatment liquid feed nozzle of the invention, there occurs no disturbance in the flow of the wet treatment liquid after use and the wet treatment liquid introduced anew from the introducing port, ensuring efficient replenishing.

Another embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, an opening section opening toward an object to be wet-treated, provided at the crossing section, and an outer surface of the periphery of the opening section made parallel to the treatment surface of the object to be wet-treated.

According to this wet treatment liquid feed nozzle of the invention, there is available a wide contact surface between the wet treatment liquid and the object to be wet-treated, thus leading to a higher treatment efficiency.

Further, another embodiment of the wet treatment liquid feed nozzle of the invention comprises an introducing path having at an end an introducing port for introducing a wet treatment liquid, a discharging path having at an end a discharging port for discharging the wet treatment liquid after a wet treatment to outside the wet treatment system, a crossing section formed by causing the introducing path and the discharging path to cross at the other ends, an opening section opening in a mesh shape toward an object to be wet-treated, provided at the crossing section, and a sealing member for sealing the crossing section from outside provided on a peripheral edge of the opening section, in a state in contact with the object to be wet-treated or with a support for supporting the object to be wet-treated.

According to this wet treatment liquid feed nozzle of the invention, it is possible to seal the portion to be treated of the object to be treated from outside, thus permitting complete prevention of leakage of the liquid.

A wet treatment apparatus of the invention comprises at least a wet treatment liquid feed nozzle or a wet treatment liquid feed nozzle apparatus of any of the aforesaid embodiments; means for causing a relative displacement of the wet treatment liquid feed nozzle or the wet treatment liquid feed nozzle apparatus; a wet treatment liquid feed source; and means for feeding from the wet treatment liquid feed source to the introducing port of the wet treatment liquid feed nozzle.

According to this wet treatment apparatus, it is possible to appropriately treat the entire surface to be treated of the object to be treated larger in size than the nozzle or the nozzle apparatus by causing a relative displacement of the nozzle or the nozzle apparatus of any of the aforesaid embodiments, to optimize the distance between the nozzle or the nozzle apparatus and the object to be treated, and to appropriately keep the wet treatment liquid.

A further embodiment of the fluid treatment apparatus of the invention comprises a fluid treating path for bringing fluid introduced from an opening and returning the treating fluid to the opening; an introducing path for introducing the treating fluid to the fluid treating path; and a discharging path for discharging the treating fluid brought back from the fluid treating path into the opening.

According to the fluid treatment apparatus of the invention, the consumption of the treating fluid can be reduced to under a tenth the conventional consumption of the same.

The scope of this treatment covers washing with a liquid, etching, polishing, electroless plating, coating, development and stripping of resist of an object to be treated, patterning of a thin film, and analysis of a surface deposit. In other words, the fluid treatment apparatus of the invention is applicable for a washing apparatus, an etching apparatus, a polishing apparatus, an electroless plating apparatus, an apparatus for coating, developing and stripping of resist, a thin film patterning apparatus, and an analyzer.

To apply in a washing apparatus, an etching apparatus, a polishing apparatus, a plating apparatus, or a resist coating apparatus, it suffices to feed a washing liquid, an etching liquid, a polishing liquid, a plating liquid, or a resist stripping liquid, respectively, to a fluid treating path as a treating fluid.

To use as a resist coating apparatus, it suffices to feed a fluid resist as a treating fluid to the fluid treating path, and in order to harden the resist, it suffices to irradiate a light onto the resist by providing light irradiating means as described later (infrared-ray irradiating means, for example).

To achieve a developing apparatus, it suffices to provide, for example, laser irradiating means as light irradiating means, and to irradiate a laser onto the resist through a pattern mask.

A thin film patterning apparatus may be achieved by opening the resist, and then feed a CVD gas to the fluid treating path. For optical CVD, it suffices to provide light irradiating means.

In the case of an analyzer, it suffices to feed a high-purity (for example, an impurity concentration of a few ppt) inert gas to the fluid treating path, incorporate substances to be measured on the object to be treated into the gas, and feed the incorporated gas from the discharging path into an external analyzer to analyze the kinds and the number of elements to be measured.

When using for any of the aforesaid applications, it is convenient to build the fluid treatment apparatus as follows. After bringing a treating build introduced from the opening into contact with the object to be treated, a fluid treating path for bringing the treating fluid back to the opening, an introducing path for introducing the treating fluid to the fluid treating path, and a discharging path for discharging the treating fluid brought back from the fluid treating path into the opening are provided, and light irradiating means for irradiating a light onto the treating fluid is provided in the fluid treating path.

According to the fluid treatment apparatus of the invention, it is possible to reduce the consumption of the treating fluid to under a tenth the conventional consumption, and to improve the light irradiation efficiency.

When using the fluid treatment apparatus of the invention, in order to bring the treating liquid back to the opening after bringing the treating fluid introduced from the opening into contact with the object to be treated, it suffices to appropriately adjust the diameter of the opening, the distance between the object to be treated and the opening, and the pressure of the treating fluid, and to previously determine these values for each fluid treatment apparatus.

For further simplification, it suffices to provide pressure control means for bringing the treating fluid back to the opening of the fluid treating path by controlling the difference between the pressure of the treating fluid in contact with the object to be treated and the atmospheric pressure.

Any of a visible light and a non-visible light may be used as a light. For example, ultraviolet rays, infrared rays, or a laser beam (such as excimer laser beam) are used appropriately in response to the purpose of treatment of the object to be treated.

When the light irradiating means is detachably provided in the fluid treating path, it is possible to impart general-purpose property because of the applicability as a washing apparatus provided with an ultrasonic element having a high washing efficiency by detaching the light irradiating means and attaching the ultrasonic element, thus providing an economic merit.

The washing treatment system of the invention comprises a gas treating path for bringing a treating gas introduced from an opening and returning the treating as to the opening; an introducing path for introducing the treating as to the gas treating path; a discharging path for discharging the treating gas brought back from the gas treating path into the opening; and light irradiating means for irradiating a light onto the treating gas in the gas treating path; the gas treating apparatus communicating with a washing treatment apparatus for washing the object to be treated having been treated in the gas treating apparatus.

As a washing treatment apparatus, it is desirable to use a washing treatment apparatus comprising a washing treating path for bringing a treating liquid introduced from an opening and returning the treating liquid to the opening; an introducing path for introducing the treating liquid to the washing treating path; and a discharging path for discharging the treating liquid brought back from the washing treating path into the opening.

It is needless to mention that this washing treatment apparatus should preferably be provided with pressure control means bringing the washing liquid back to the opening of the washing treating path by controlling the difference between the pressure of the washing liquid in contact with the object to be treated and the atmospheric pressure.

Further, in the invention, the light is irradiated at a higher irradiating efficiency by irradiating the light by the light irradiating means onto the treating fluid, thereby improving the ozone producing efficiency and the sterilizing rate in the treating fluid.

In the invention, the distance between the light irradiating means and the object to be treated is far shorter than in the conventional art. It is therefore possible to feed ozone to the object to be treated before exhaustion of the life of ozone, thus leading to an efficient treatment of the object to be treated. In the fluid treatment apparatus of the invention, the opening area of the opening may be variable.

For example, in a semiconductor wafer, the diameter of the object to be treated may vary. In this case, feeding the treatment fluid always in a constant rate, in spite of the variation in diameter requiring a varied amount of treatment fluid from the opening to the object to be treated would be a waste of the treatment fluid. By making the opening area variable in response to the diameter of the object to be treated, therefore, the amount of feed of the treatment fluid can be reduced for a smaller diameter, contributing to further reduction of the consumption of the treatment fluid. In order to make the opening area variable, it suffices to provide a movable cover onto the opening.

In the fluid treatment apparatus of the invention, a liquid sump should preferably be provided around the opening.

When such a liquid sump is provided around the opening, the treatment fluid after treatment is collected uniformly into the liquid sump from the portions surrounding the opening, not flowing through the discharging path alone, and is discharged from the liquid sump. As a result, the flow of the treatment fluid becomes uniform, permitting uniform treatment of the object to be treated.

Because the treatment fluid in the fluid treating path, which may leak to outside the fluid treatment apparatus, is once collected in the liquid sump, it is possible to prevent the fluid from leaking to outside.

Provision of fine grooves causing capillary action in the liquid sump is more effective for preventing leakage of the treatment liquid to outside since the treatment fluid collected in the liquid sump is sucked up in the fine grooves by the capillary action.

Further, in the fluid treatment apparatus of the invention, the fluid treating path and the discharging path should preferably communicate with each other via the liquid sump.

When treating the object to be treated by means of the treatment fluid, bubbles may be produced in the treatment fluid. For example, the treatment fluid reacts with the object to be treated or a substance adhering to, or formed on, the surface thereof, generating a gas as a reaction product.

As the treatment fluid has the discharging path as the only exit, the generated gas has no escape and remains contained in the treatment fluid. The gas, if present in the treatment liquid, adheres to the surface of the object to be treated and causes a delay in the progress of the essential reaction between the treatment fluid and the surface of the object to be treated, thus leading, for example, to a poorer washing efficiency of the object to be treated. This makes pressure control in the fluid treating path difficult. Further, when imparting an ultrasonic wave to the treatment liquid still containing the gas in an amount exceeding the necessity, cavitation causes the ultrasonic wave to show a considerable damping, causing a decrease in the power serving to remove particles, thus making it impossible to achieve a sufficient washing effect.

In the invention, in contrast, there is provided a pressure adjusting port for positional adjustment of the gas-liquid interface communicating with the fluid treating path. By adjusting the pressure at the pressure adjusting port, therefore, it is possible to form a gas phase and a liquid phase in the fluid treating path. As a result, the gas produced by the treatment of the object to be treated is transferred from the liquid phase to the gas phase, and is as required discharged from the gas phase through the pressure adjusting port to outside. This permits control of the amount of gas present in the treatment fluid, thus making it possible to derive necessary and sufficient cavitation effect.

When imparting an ultrasonic wave, the gas-liquid interface between the gas and liquid phases forms an oscillation free interface, resulting in a more remarkable cavitation effect, thus assisting achievement of an improved washing effect.

By appropriately adjusting the pressure at the pressure adjusting port, it is possible to arbitrarily adjust the ratio of the gas phase to the liquid phase. By ensuring that the gas phase does not communicate directly with the discharging path, the gas does not flow into the discharging path, but is discharged exclusively through the pressure adjusting port. The pressure adjusting port should preferably be provided at the ceiling of the fluid treatment apparatus.

On the other hand, the treatment liquid after the treatment is collected in the liquid sump provided around the opening, and is discharged through the discharging path. When the liquid sum communicates with the discharging path through capillary fine grooves, the treatment liquid collected in the liquid sump after the treatment is sucked up into the discharging path under the effect of capillary phenomenon, without dropping from the liquid sump.

In the invention, the treatment fluid is not limited to any particularly form, but may be a gas a liquid, a gas-liquid mixture, any of various suspensions, or a paste.

According to the fluid treatment apparatus of the invention, the consumption of the treatment fluid can be reduced to under a tenth the conventional consumption, thus permitting improvement of the light irradiating efficiency.

According to the washing treatment system of the invention, the consumption of the treatment fluid can be reduced to under a tenth the conventional one, thus permitting achievement of a higher degree of treatment.

BRIEF DESCRIPTION OF THE DRAWINGS

FIG. 4B is a plan view of the embodiment shown in FIG. 4;

FIG. 33 illustrates sectional side view of a wet treatment liquid feed nozzle of a further embodiment of the invention.

FIG. 50A is a sectional side view of a washing treatment system of an embodiment of the invention; and FIG. 50B is a front view of the same;

DESCRIPTION OF THE PREFERRED EMBODIMENT

Figure 1:
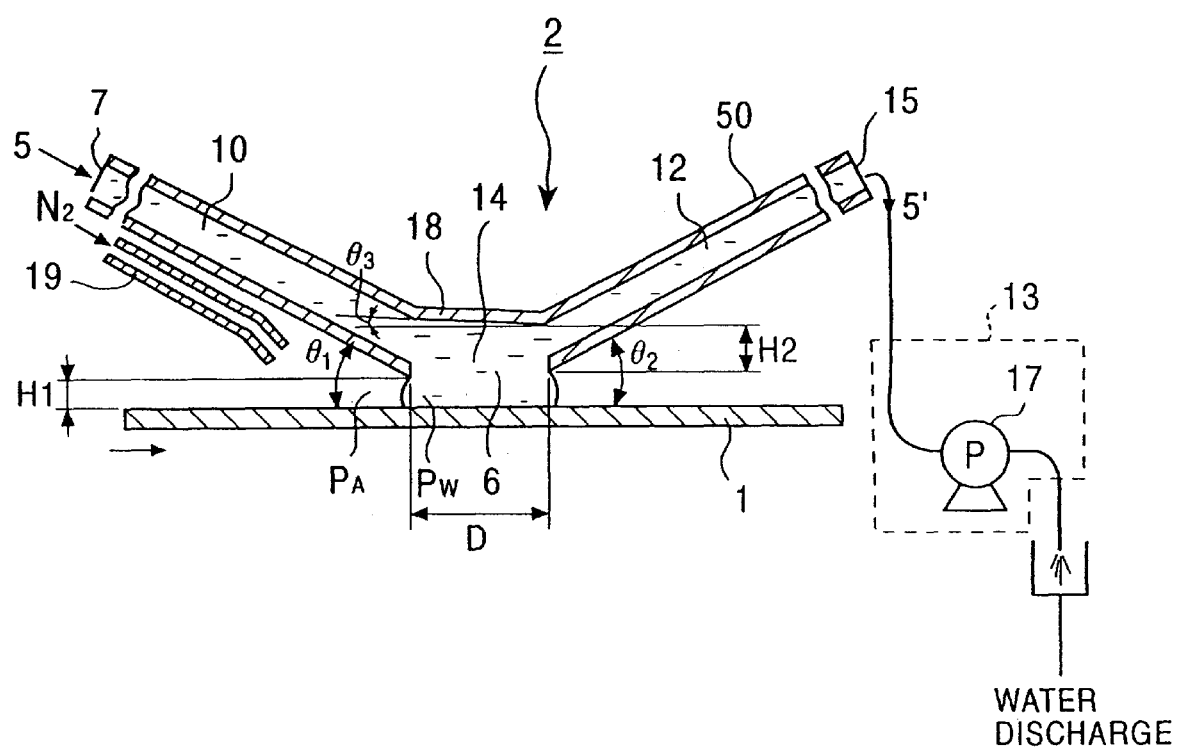
FIG. 1 is a sectional side view of a wet treatment liquid feed nozzle of an embodiment of the invention.

A first embodiment of the wet treatment liquid feed nozzle of the present invention is illustrated in FIGS. 1 and 2.

Figure 2A:
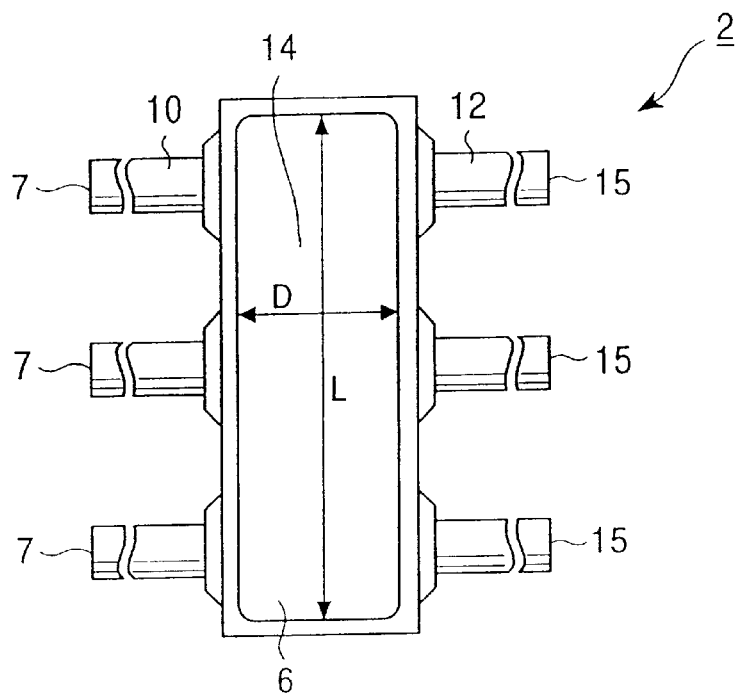
FIG. 2A is a bottom view of the embodiment shown in FIG. 1.
Figure 2B:
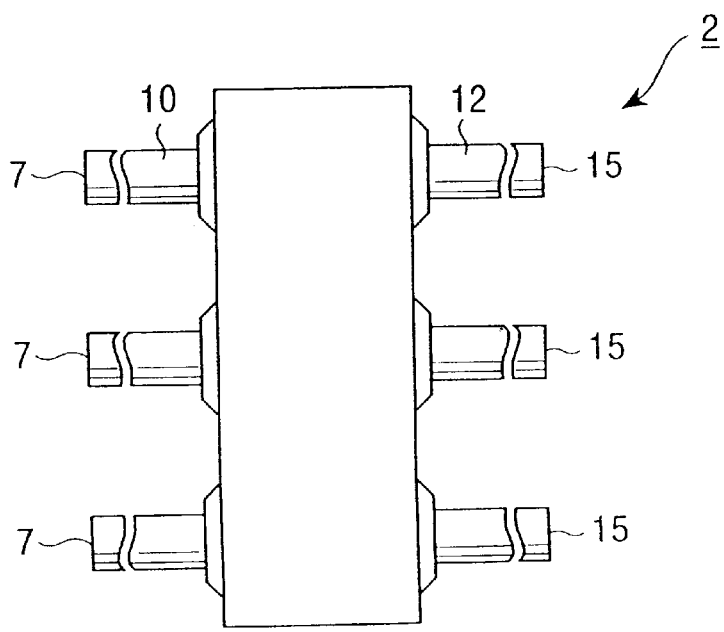
FIG. 2B is a plan view of the embodiment shown in FIG. 1.

FIG. 1 is a sectional side view; FIG. 2A is a bottom view, and FIG. 2B is a plan view.

In FIG. 1, 2 is a wet treatment liquid feed nozzle. This wet treatment liquid feed nozzle 2 comprises mainly a nozzle assembly 50 and a pressure controller 13.

More particularly, the nozzle assembly 50 comprises an introducing path 10 having an introducing port 7 for introducing a wet treatment liquid 5 at an end thereof, a discharging path 12 having a discharging port 15 for discharging the wet treatment liquid 5 after a wet treatment to outside the wet treatment system and an opening section 6 opening to an object to be wet-treated (substrate) 1 provided at a crossing section 14 formed by causing the introducing path 10 and the discharging path 12 to cross at the other ends thereof. A pressure controller 13 is provided at least on the side of the discharging path 12 so as to take balance between the pressure of the wet treatment liquid in contact with the open air of the opening section 6 (including the surface tension of the wet treatment liquid and the surface tension of the treated surface of the object to be wet-treated) and the atmospheric pressure and so that the wet treatment liquid having been in contact with the object to be wet-treated 1 after a wet treatment.

In this embodiment, the pressure controller 13 comprises a reduced-pressure pump provided on the discharging port 15 side. By controlling the sucking pressure of the reduced-pressure pump, the pressure of the wet treatment liquid, and hence the difference between the atmospheric pressure and the pressure of the wet treatment liquid are controlled.

More particularly, with the use of the reduced-pressure pump for the pressure controller 1 on the discharging path 12 side, the force of sucking the wet treatment liquid of the crossing section 14 is controlled by means of this reduced-pressure pump to take balance between the pressure of the wet treatment liquid in contact with the open air at the opening section 6 (including the surface tension of the wet treatment liquid and the surface tension of the treated surface of the object to be wet treated) and the atmospheric pressure. That is, by assuming that the relationship between the pressure Pw of the wet treatment liquid in contact with the open air at the opening section 6 (including the surface tension of the wet treatment liquid and the surface tension of the treated surface of the object to be wet-treated) and the atmospheric pressure Pa is Pw≈Pa, the wet treatment liquid fed to the substrate 1 via the opening section 6 and in contact with the substrate 1 is discharged into the discharging path 12 without leaking to outside the wet treatment liquid feed nozzle.

The ceiling of the crossing section should preferably have a shape producing Coanda effect, which makes it easier to take balance of pressure.

In other words, the wet treatment liquid 5' fed from the wet treatment liquid feed nozzle to the object to be wet-treated (substrate) 1 is removed from the object to be treated (substrate) without being brought into contact with portions other than the portion to which the wet treatment liquid has been fed (opening section 6).

In this embodiment, as is known from FIG. 2, three introducing paths 10 are provided in parallel with each other.

Three discharging paths 12 are also provided in parallel with each other to correspond to the introducing paths 10. By providing a plurality of introducing paths and discharging paths in the longitudinal direction of the wet treatment liquid feed nozzle 2 (up-down direction in FIG. 2) as described above, it is possible to achieve a uniform washing efficiency in the longitudinal direction.

The surface of the wet treatment liquid feed nozzle 2 should preferable be formed with stainless steel having an outermost passive film comprising chromium oxide alone, stainless steel provided with a mixed film of aluminum oxide and chromium oxide on the surface thereof, or against ozone water, titanium having an electrolytically polished surface, because of the absence of elution of impurities into the washing liquid. A surface in contact with the liquid, made of quarts, is suitable for feeding of all wet treatment liquids except for fluoric acid.

The angle $\theta_1$ between the introducing path 10 and the substrate 1 can be appropriately selected within a range of from 0 to 90°.

On the other hand, the angle $\theta_2$ between the discharging path 12 and the substrate 1 can be selected appropriately within a range of from 0 to 90°.

The angle $\theta_1$ between the introducing path 10 and the substrate 1 and the angle $\theta_2$ between the discharging path 12 and the substrate 1 are arbitrarily set in view of the contact efficiency of the wet treatment liquid with the substrate, the discharging efficiency of the treated product, the shape of the crossing section, the shape of the opening section, the area thereof and the like.

The distance H2 between the portion of the ceiling 18 of the crossing section 14 facing the object to be wet-treated (substrate) 1 the closest thereto, on the one hand, and the opening section 6 closest to the object to be wet-treated (substrate) 1, on the other hand, should preferable be within a range of from 1 to 50 mm, or more preferably, from 2 to 20 mm. A distance H2 smaller than 1 mm makes it difficult for the wet treatment liquid to flow, leading to poorer contact efficiency of the wet treatment liquid with the substrate and discharging efficiency of the treated substrate. A distance H2 of over this range causes presence of wet treatment liquid in a large quantity in the wet treatment liquid feed nozzle 2, leading to a heavier wet treatment liquid feed nozzle 2, thus causing troubles in the displacement of the wet treatment liquid feed nozzle 2.

The distance H1 (distance between the object to be treated 1 and the opening section 6) should preferably be within a range of from 0.1 to 5 mm, or more preferably, from 1 to 2 mm.

The value of H1 may sometimes vary because of vibration of the transfer machine or one uneven surface of the substrate. It is therefore desirable to provide a sensor for measuring Hi and means for separating or bringing nearer the wet treatment liquid feed nozzle 2 in response to a signal from the sensor relative to the object to be treated. At least two such length measuring units should preferably be provided at two positions with the nozzle assembly 50 in between in FIG. 2A. This is with a view to ensuring accurate control of the flow of the wet treatment liquid while keeping a constant distance between the object to be wet-treated 1 and the opening 6 for the entire wet treatment liquid feed nozzle. The length measuring accuracy should preferable be smaller than 0.1 mm. Because the lower limit of the distance between the wet treatment liquid feed nozzle and the object to be wet-treated should preferably be 0.1 mm, and this distance should accurately be controlled.

In FIG. 1, 19 is a contact preventing gas ejecting section. The contact preventing gas ejecting section is provided at least in any of the introducing path 10 and the discharging path so that the opening section 6 does not come into contact with the object to be wet-treated upon lifting up the object to be wet-treated, because of unbalance between the pressure of the wet treatment liquid in contact with the open air at the opening section and the atmospheric pressure. The gas used for this purpose should preferably be nitrogen gas or an inert gas, or may be air free from impurities (particularly water).

Figure 3:
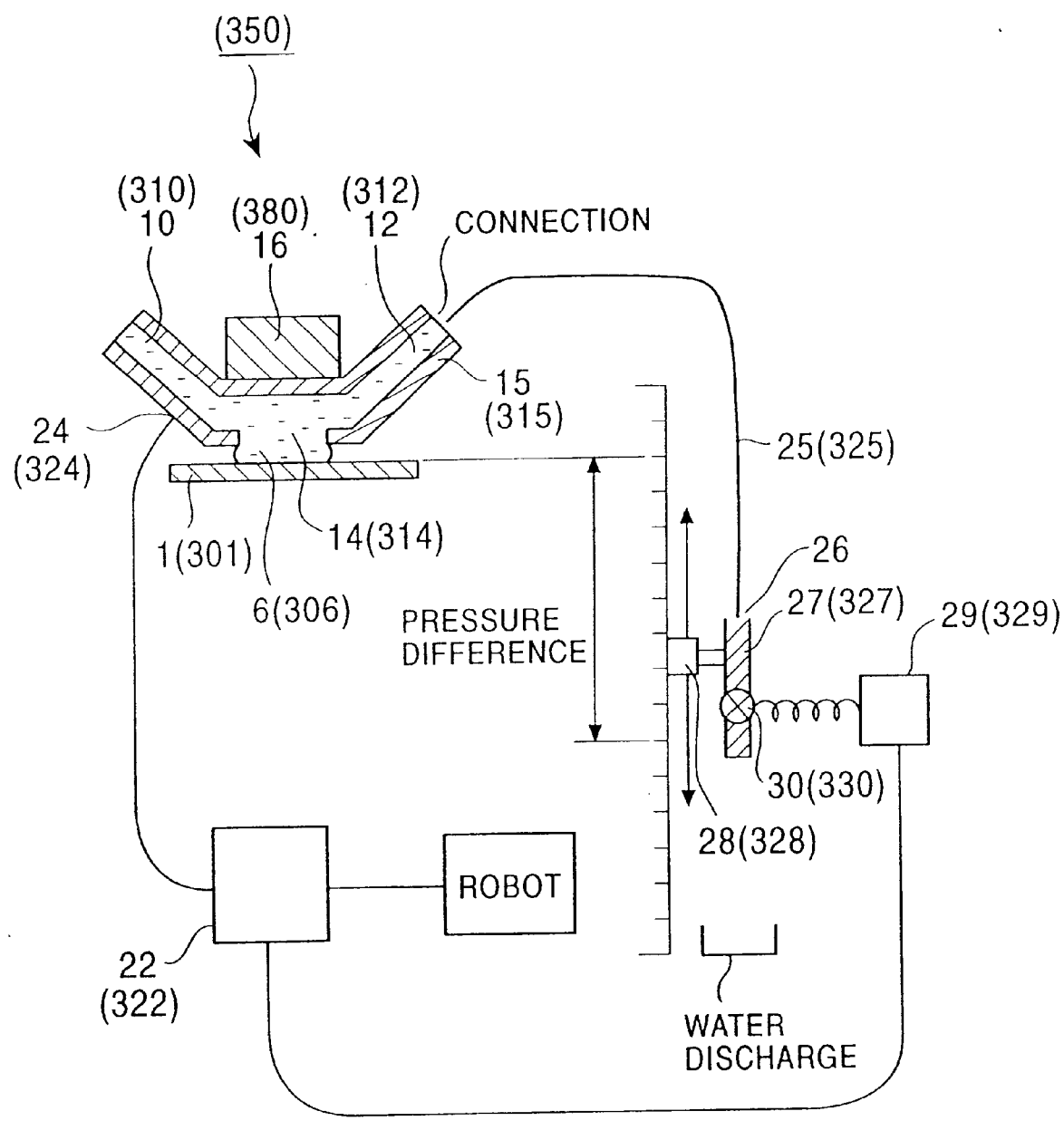
FIG. 3 is a conceptual view of a wet treatment liquid feed nozzle of another embodiment of the invention.

In this embodiment, balance between the pressure of the wet treatment liquid in contact with the object to be wet-treated as shown in FIG. 3 and the atmospheric pressure may be controlled by a simpler system.

The pressure controller 13 on the discharging path 12 side controls the sucking force of the wet treatment liquid at the crossing section 14 caused by the weight of the wet treatment liquid itself based on the syphon principle produced by the difference in height between the opening section 6 and an end of the discharging path 12 (the end open to the open air), to take balance between the pressure of the wet treatment liquid in contact with the open air at the opening section 6 (including the surface tension of the wet treatment liquid and the surface tension of the treated surface of the object to be wet-treated) and the atmospheric pressure.

More specifically, a water discharging unit 27 is connected to the discharging port 15 of the wet treatment liquid feed nozzle 2 via a water discharge piping 25, and the water discharging unit 27 is held by a holder 28. The holder 28 is attached to, for example, a street slidably vertically in the drawing.

A valve 30 is attached to the leading end of the water discharging unit 27. The valve 30 is opened and closed by a valve drive 29.

On the other hand, the embodiment shown in FIG. 3 has a controller 22 which drives a robot and the valve drive 29 on the basis of a signal from the pressure sensor for detecting the pressure of the wet treatment liquid in the introducing path 10. The robot is for moving up and down the holder 28. When the valve is open, the pressure of the wet treatment liquid in contact with the object to be wet-treated can be controlled through vertical displacement of the water discharging unit 27.

Figure 4:
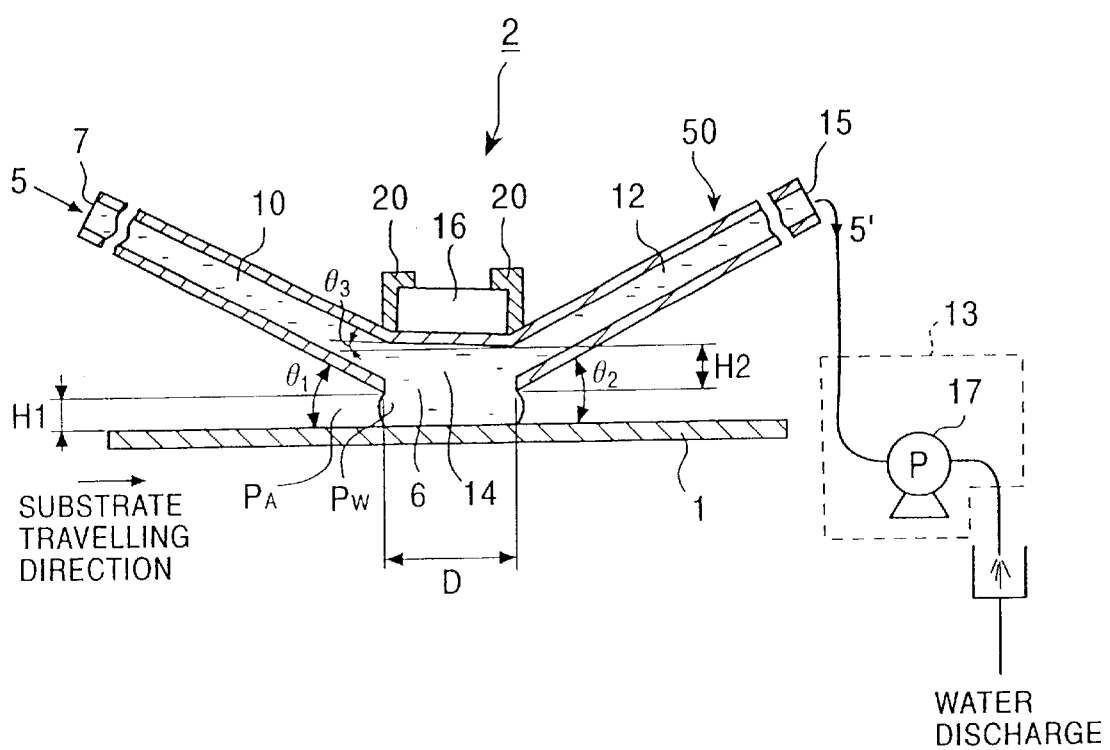
FIG. 4 is a sectional side view of a wet treatment liquid feed nozzle of a further embodiment of the invention.

A second embodiment of the wet treatment liquid feed nozzle of the invention is illustrated in FIG. 4.

In FIG. 4, 2 is a wet treatment liquid feed nozzle. The wet treatment liquid feed nozzle 2 has the following configuration.

The wet treatment liquid feed nozzle 2 comprises an introducing path 10 having an introducing port 7 for introducing a wet treatment liquid 5 at an end thereof, a discharging path 12 having a discharging port 15 for discharging the wet treatment liquid 5' after a wet treatment to outside the wet treatment system and an opening section 6 opening to an object to be wet-treated (substrate) provided at a crossing section 14 formed by causing the introducing path 10 and the discharging path 12 to cross at the other ends thereof, and an ultrasonic element 16 provided opposite to the object to be wet-treated, for imparting an ultrasonic wave during wet treatment of the object to be wet-treated. The wet treatment liquid feed nozzle has also an attachment guide 20 for detachably attaching the ultrasonic element 16 and the ultrasonic element 16 slides vertically in FIG. 4 along an attachment guide 20 to permit attachment and detachment. Further, there is provided, on the discharging path 12 side, a pressure controller 13 so as to ensure flow of the wet treatment liquid having been in contact with the object to be treated after completion of the wet treatment through control of balance between the pressure of the wet treatment liquid in contact with the open air at the opening section 6 (including the surface tension of the set treatment liquid and the surface tension of the treated surface of the object to be treated) and the atmospheric pressure. This pressure controller is the same as the pressure controller described previously.

Figure 5A:
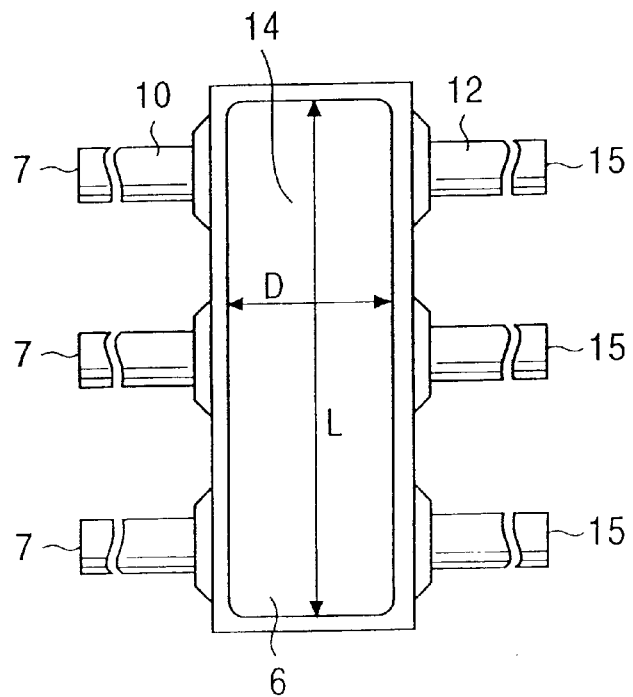
FIG. 5A is a bottom view of the embodiment shown in FIG. 4.
Figure 5B:
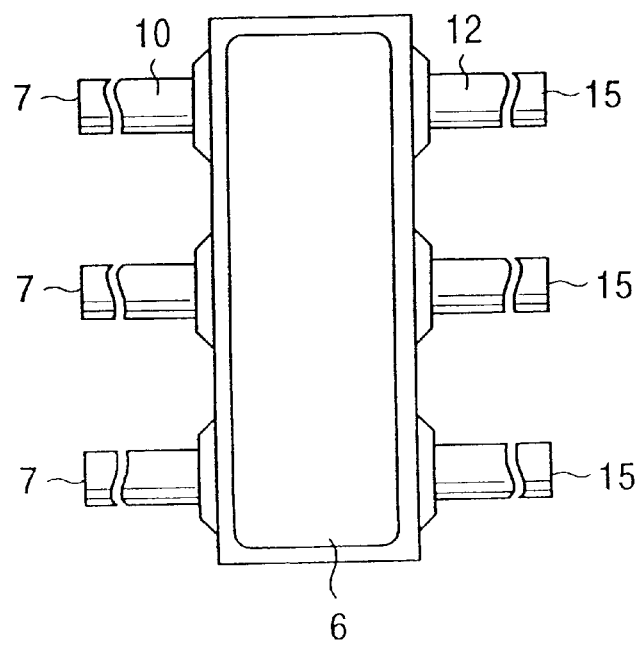

FIG. 5A is a bottom view, and FIG. 5B is a plan view of the wet treatment liquid feed nozzle shown in FIG. 4.

The ultrasonic element 16 provides an output of ultrasonic wave having a frequency of at least 19 KHz. It should preferably be a megasonic ultrasonic element having a frequency within a range of from 0.2 to 5 MHz.

The angle $\theta_3$ between the ultrasonic element 16 and the substrate 1 can be appropriately selected within a range of from 0 to 90°, or preferably, from 2 to 45°.

When a megasonic ultrasonic wave is imparted as described above, there is available a remarkable improving effect of cleanliness.

Figure 6:
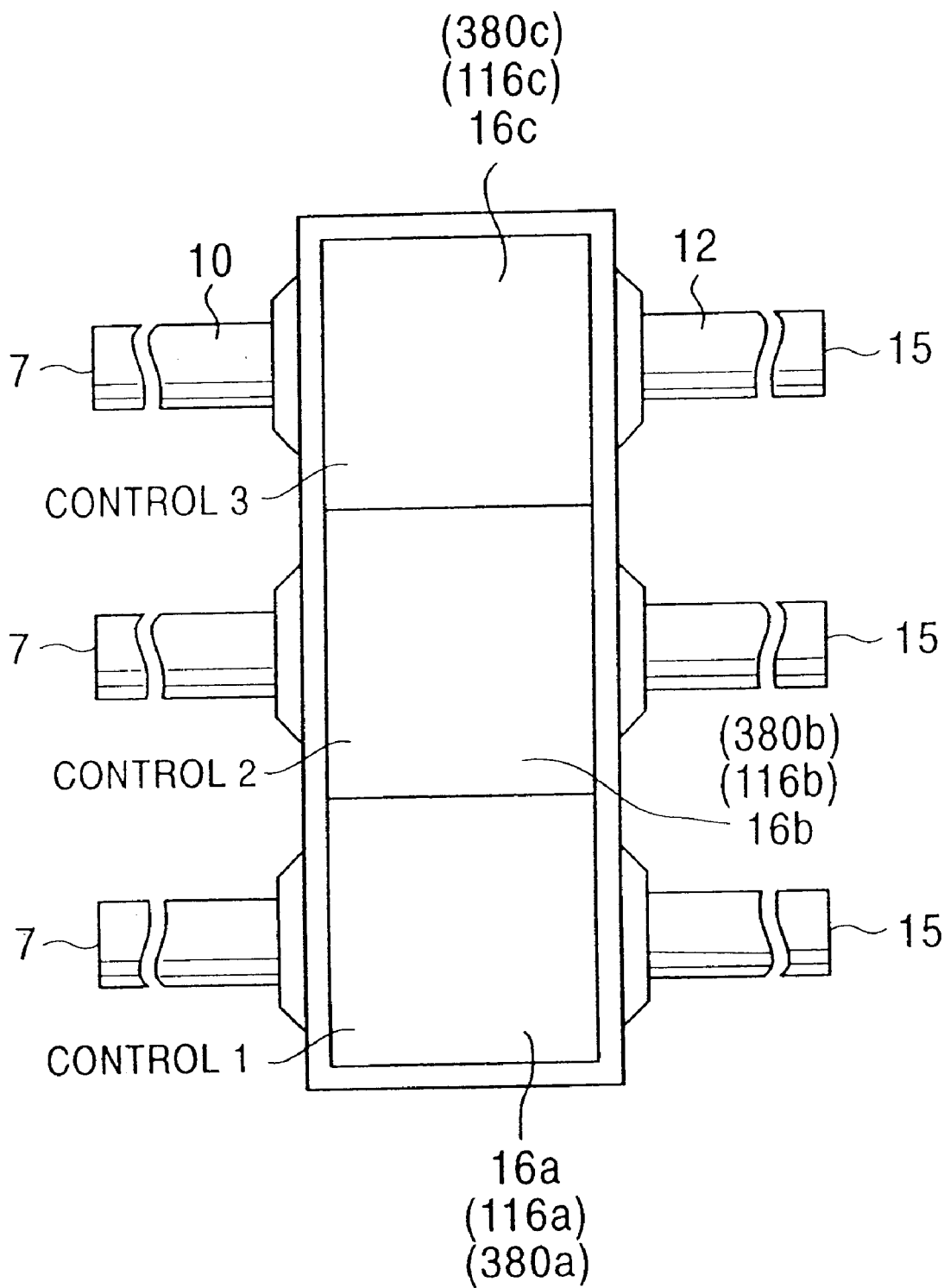
FIG. 6 is a plan view of a wet treatment liquid feed nozzle of a further embodiment of the invention.

FIG. 5 illustrates a case where a single ultrasonic element 16 is provided; and FIG. 6 illustrates a case where a plurality of such elements are provided. In the example shown in FIG. 6, three ultrasonic elements 16a, 16b and 16c in the longitudinal direction (up-down direction in FIG. 6). When a plurality of ultrasonic elements are provided, it is possible to appropriately change the ultrasonic frequency or output, thereby permitting uniform washing.

These elements may be arranged either in the longitudinal direction or in the transverse direction. A plurality of ultrasonic elements may be arranged both in the longitudinal and transverse directions.

Figure 7:
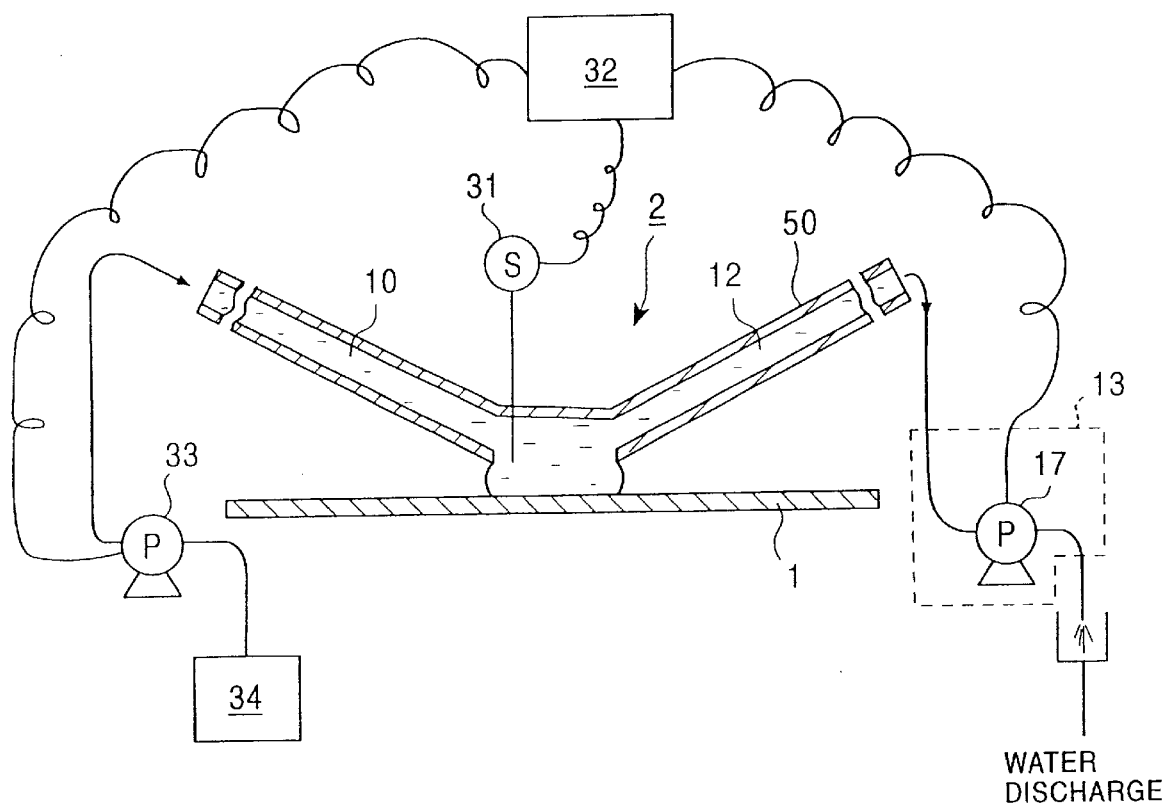
FIG. 7 is a sectional side view of a wet treatment liquid feed nozzle of a further embodiment of the invention.

As shown in FIG. 7, the second embodiment comprises means for controlling the difference between the pressure of the wet treatment liquid and the atmospheric pressure, a reduced-pressure pump (a water discharge pump in this example) 17 provided in the downstream of the discharging path 12, and a feed pump 33 provided in the upstream of the introducing path 10. It may further comprise a pressure sensor 31 for detecting the pressure of the wet treatment liquid in contact with the object to be wet-treated, and a controller 32 for controlling drive of the reduced-pressure pump 17 and the feed pump 33 in accordance with a signal from the pressure sensor 31. Where the embodiment shown in FIG. 1 is applicable when the pressure of the wet treatment liquid is constant on the introducing port 7 side, the present embodiment, in which the pressure of the wet treatment liquid on the introducing side is detected, permits achievement of accurate pressure control, giving an excellent cleanliness.

Figure 8A:
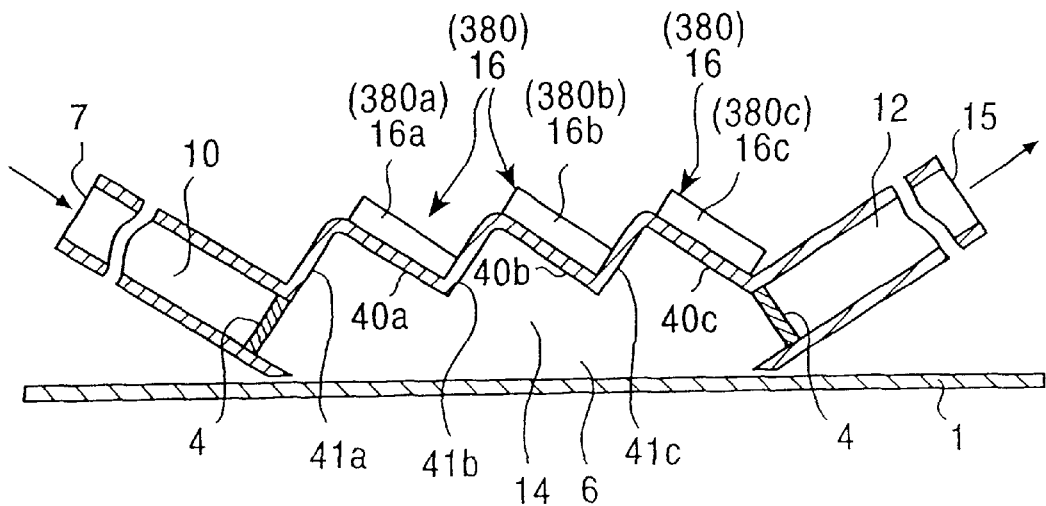
FIG. 8A is a sectional side view.
Figure 8B:
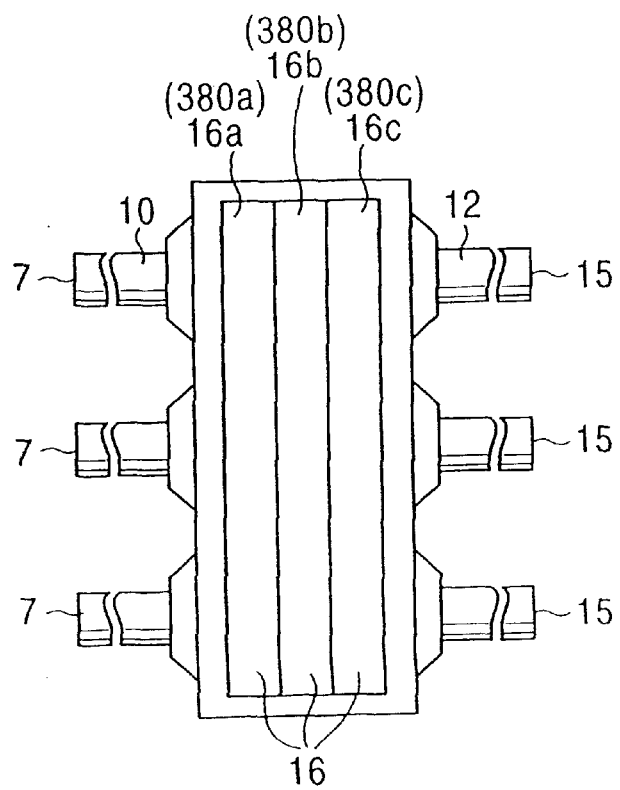
FIG. 8B is a plan view of a further embodiment of the invention.

In a third embodiment of the wet treatment liquid feed nozzle of the invention shown in FIG. 8, the portion of the ceiling opposite to the treated surface of the object to be wet-treated has a plurality of steps 40a, 40b, 40c, 41a, 41b and 41c. In FIG. 8, the ceiling steps 40a, 40b and 40c inclining toward the right down are provided with ultrasonic elements 16a, 16b and 16c, respectively.

Since, in this embodiment, the ultrasonic elements 16a, 16b and 16c are provided on the right-down portions of the ceiling, it is possible to impart an ultrasonic wave so as to be opposite to the wet treatment liquid fed from the introducing path 10 to the crossing section 14. Because the ceiling has a stepped shape, the gaps formed between the ultrasonic element and the object to be wet-treated are substantially uniform, thereby permitting uniform washing.

The elements 16a, 16b and 16c may be composed of ultrasonic elements with different frequencies.

In the embodiment shown in FIG. 8, a rectifying section 4 for achieving a uniform flow of the wet treatment liquid in each of the portions of the introducing path 10 and the discharging path 12 facing the crossing section 14. The rectifying section 4 may be formed with a filter and a slit, for example.

Figure 9A:
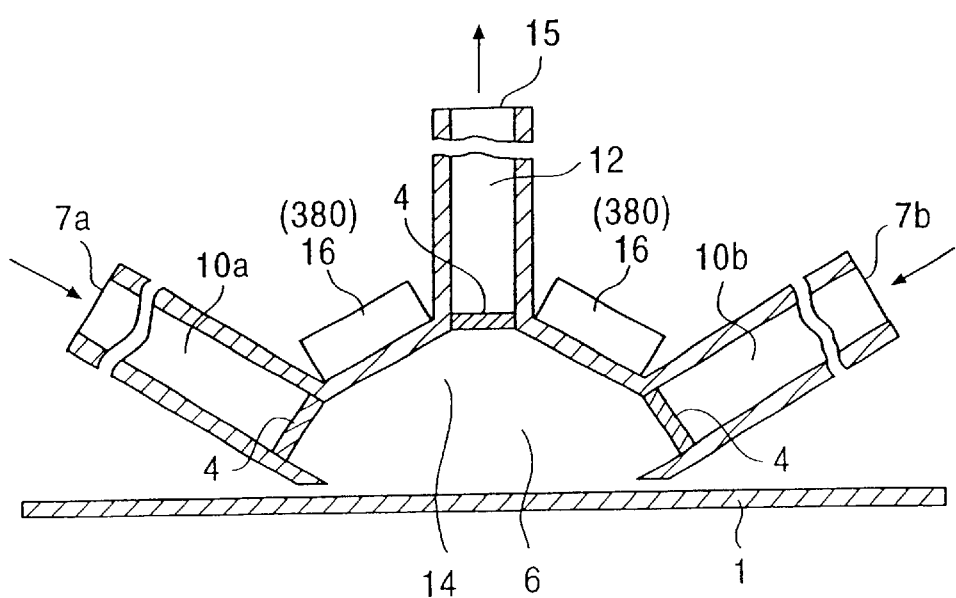
FIG. 9A is a sectional side view.
Figure 9B:
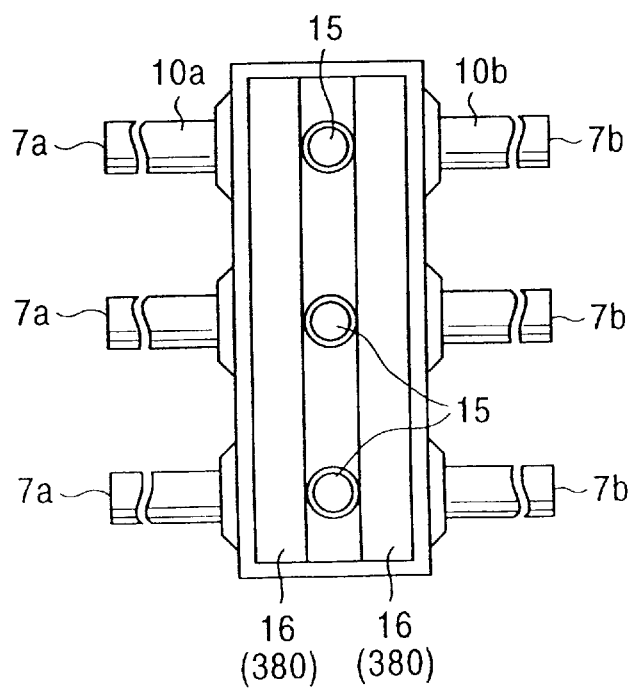
FIG. 9B is a plan view, respectively, of a further embodiment of the invention.

FIG. 9 illustrates a fourth embodiment of the wet treatment liquid feed nozzle of the invention.

In the fourth embodiment, a discharging path 12 is provided vertically to the substrate 1, and introducing paths 10a and 10b are symmetrically arranged with the discharging path 12 in between.

In this embodiment, the wet treatment liquid is fed from the right and left introducing paths 10a and 10b to the opposed substrate 1. This leads to a further smaller leakage of washing liquid, and the washing liquid after washing is more rapidly carried away to the discharging path 12. Ultrasonic wave frequencies may be the same or different for the two ultrasonic elements 16. The two ultrasonic elements may oscillate in pulses alternately at certain time intervals or simultaneously.

Figure 10A:
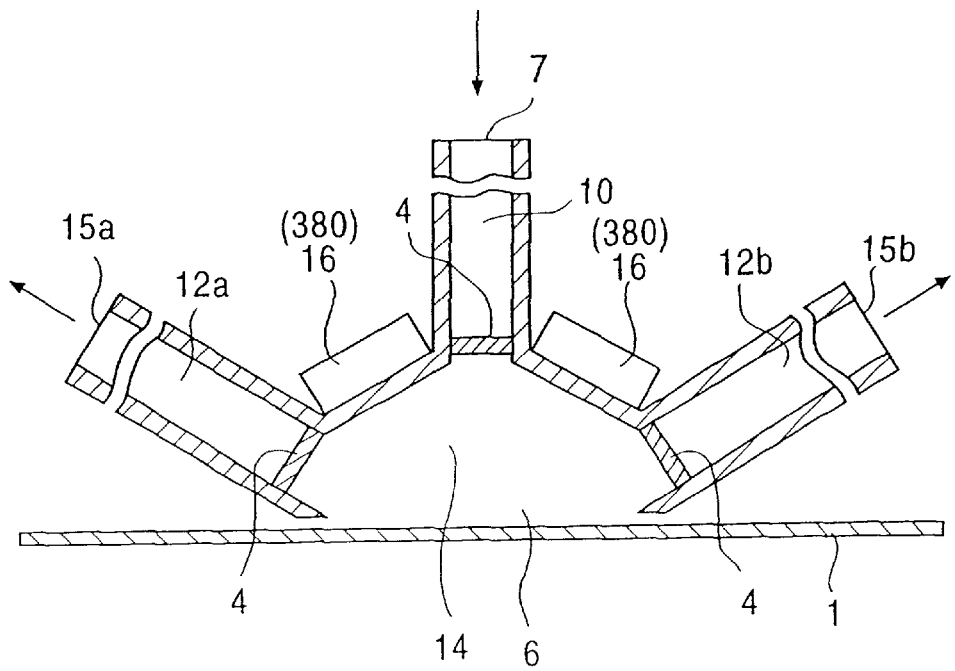
FIG. 10A is a sectional side view.
Figure 10B:
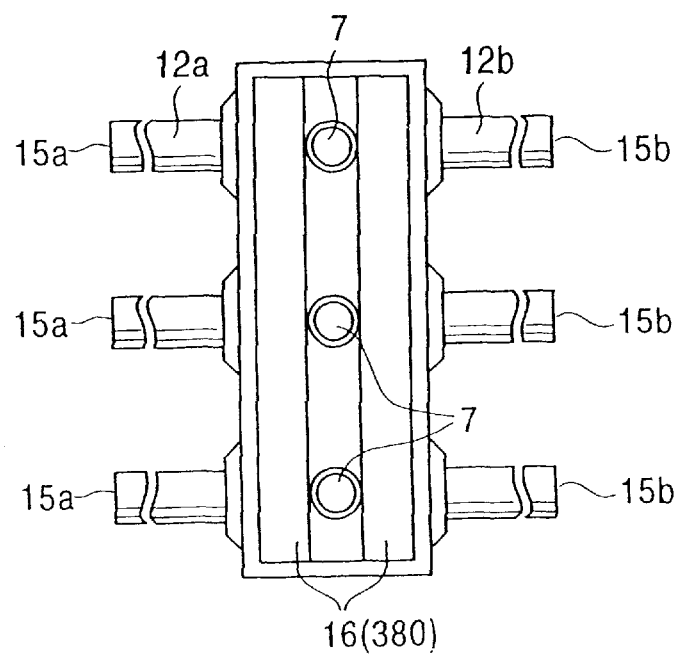
FIG. 10B is a plan view, respectively, of a further embodiment of the invention.

FIG. 10 illustrates a fifth embodiment of the wet treatment liquid feed nozzle of the invention.

In the fifth embodiment, an introducing path 10 is provided vertically to the substrate 1, and discharging paths 12a and 12b are symmetrically arranged with the introducing path 10 in between.

In this wet treatment liquid feed nozzle, both the introducing path and the discharging paths are vertically formed to the substrate.

Now, the first embodiment of the wet treatment apparatus of the invention will be described below.

When a wet treatment apparatus is formed with the use of the wet treatment liquid feed nozzle 2 shown in FIGS. 1 and 2, the opening section 6 of the wet treatment liquid feed nozzle 2 is arranged to face the substrate 1 and it suffices to provide means for causing a relative displacement of the wet treatment liquid feed nozzle 2 and the substrate 1, for example, a roller transfer machine (not shown) for transferring the substrate 1.

There is also provided a wet treatment liquid source and means for feeding the wet treatment liquid from the wet treatment liquid feed nozzle. A heating unit, a temperature adjusting unit and a temperature holding unit should preferably be provided at appropriate positions to cope with the necessity to treat an object to be treated at a temperature within a range of from 70 to 80° C. such as in a resist stripping step.

Figure 11A:
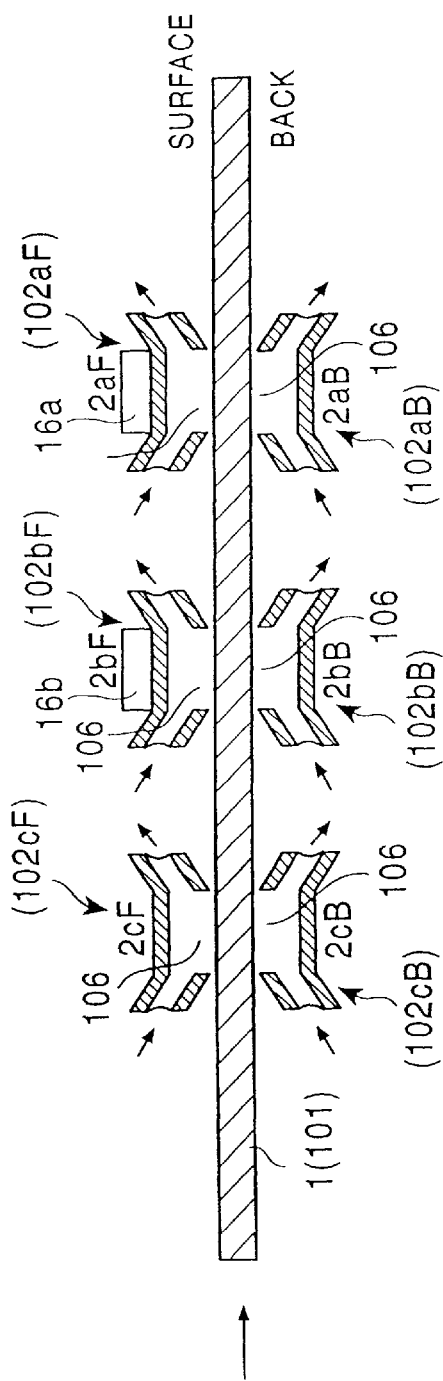
FIG. 11A is a sectional side view.

In FIG. 11, the wet treatment liquid feed nozzles 2aF and 2aB are arranged in pair with the object to be treated held in between to simultaneously carry out a wet treatment of both the surface and the back of the object to be treated.

Three lines including wet treatment liquid feed nozzles (2aF and 2aB) for electrolytic ion water washing (an embodiment of wet treatment), wet treatment liquid feed nozzles (2bF and 2bB) for extra pure water rinsing (wet treatment), and wet treatment liquid feed nozzles (2cF and 2cB) for IPA (isopropyl alcohol) drying, sequentially in the travelling direction of the object to be treated. The pressure controller is not shown in FIG. 11.

Figure 11B:
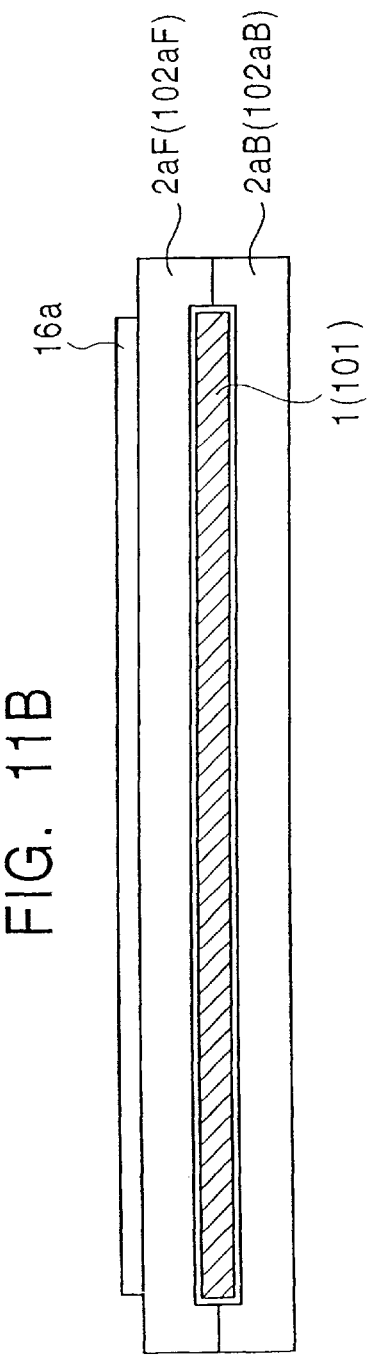
FIG. 11B is a plan view, respectively, of a further embodiment of the invention.

The pair of wet treatment liquid feed nozzles 2aF and 2aB are in contact with each other at the both end thereof to form a tunnel-like space as shown in FIG. 11B, and the object to be wet-treated flows therethrough. Therefore, even when the wet treatment liquid from the side of an end surface (s surface perpendicular to the sheet plane in the drawing) of the object to be wet-treated, the wet treatment liquid thus flowing out can be received by the lower wet treatment liquid feed nozzle 2aB.

Because the washing efficiency is higher on the back (lower surface), the ultrasonic element is provided only on the surface (upper surface). When the same wet treatment liquid is employed, A single pressure controller may conduct pressure control.

Figure 12A:
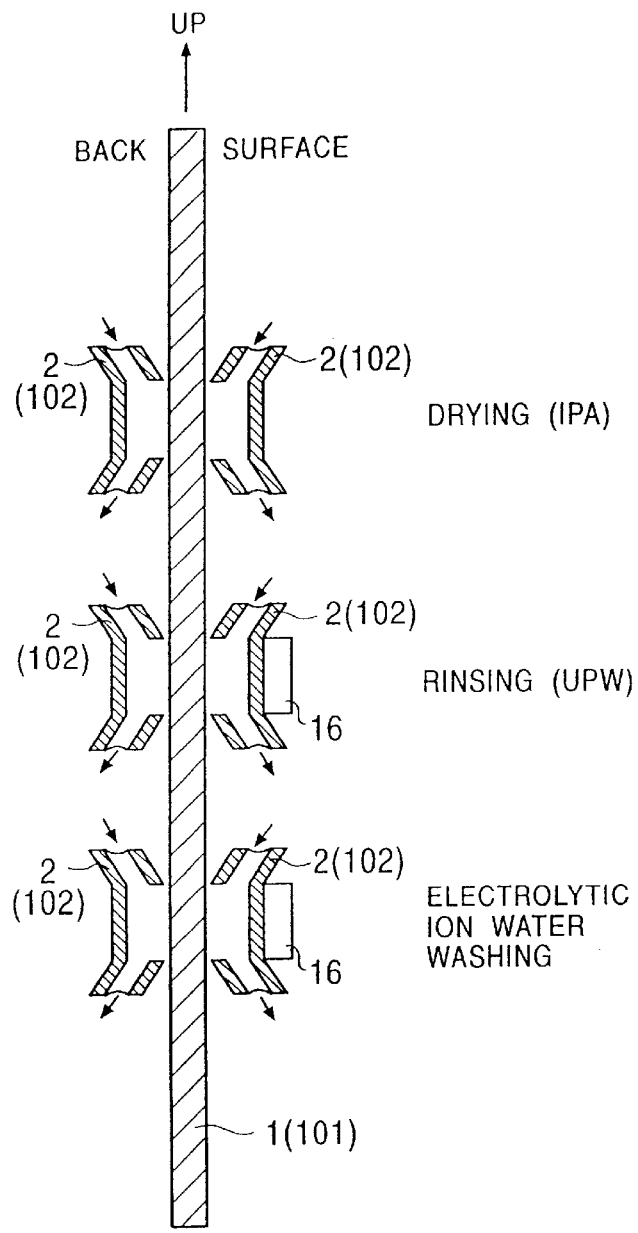
FIG. 12A is a sectional side view and FIG. 12B is a plan view of a wet treatment apparatus of an embodiment of the invention.
Figure 12B:
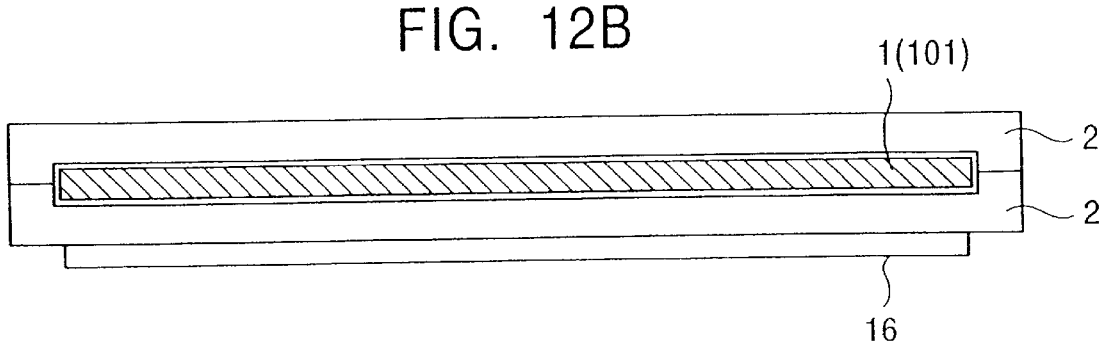

FIG. 12A is a sectional side view, and FIG. 12B is a plan view, of a case where the object to be wet-treated is vertically moved.

Figure 13A:
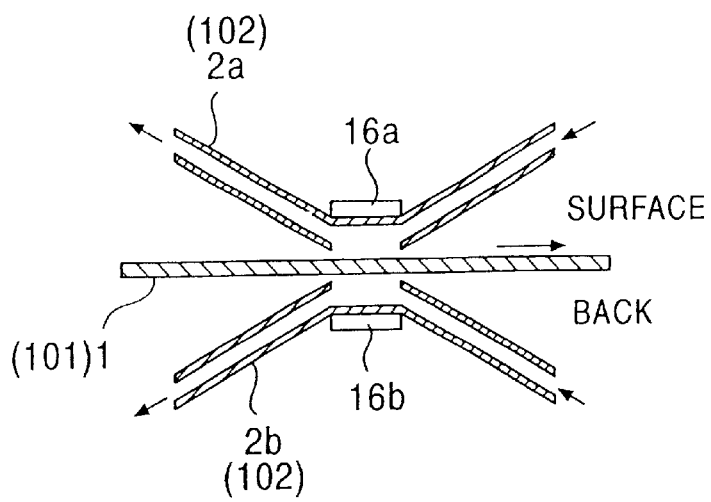
FIGS. 13A, 13B and 13C are sectional plan views illustrating a washing apparatus of an embodiment of the invention.
Figure 13B:
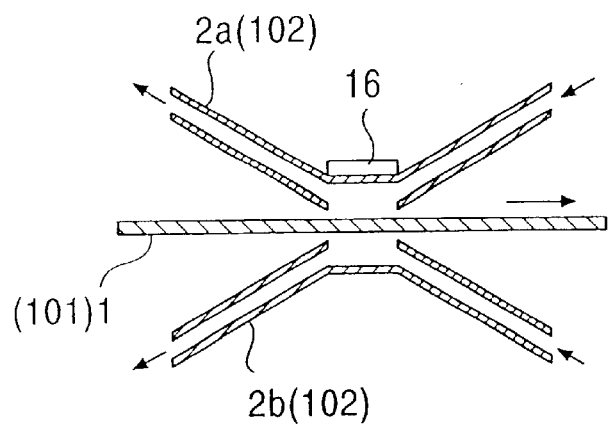
Figure 13C:
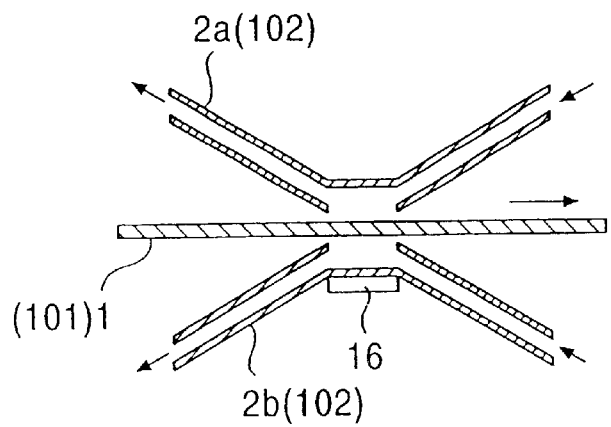

FIG. 13 is a sectional plan view of the washing apparatus as viewed from above. FIGS. 13A, 13B and 13C represent a case where the object to be treated is place upright, and the wet treatment liquid feed nozzle is longitudinally provided at right angles to the travelling direction of the object to be treated 1. The object to be treated 1 is horizontally transferred. In this case, the object to be wet-treated has no up-down relationship and the washing efficiency is the same for the surface as well as for the back. Ultrasonic elements 16 may be provided on the back (FIG. 13C), the surface (FIG. 13B) or the surface and the back (FIG. 13A).

FIG. 14 is a sectional side view of the washing apparatus as viewed from a side. The object to be wet-treated is placed upright and lifted up.

Figure 14A:
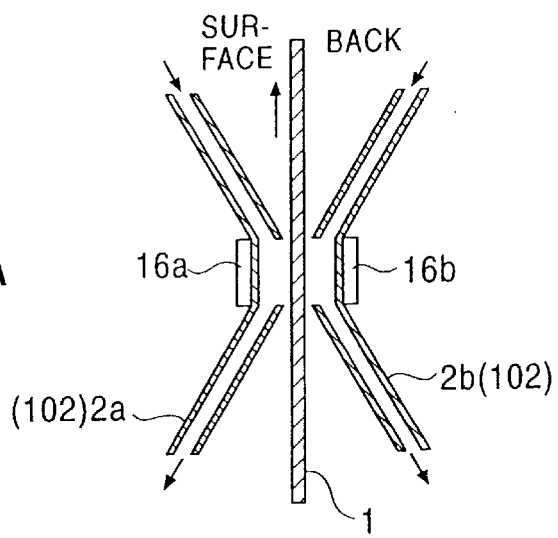
FIGS. 14A, 14B and 14C are sectional side views illustrating the washing apparatus of the embodiment of the invention.
Figure 14B:
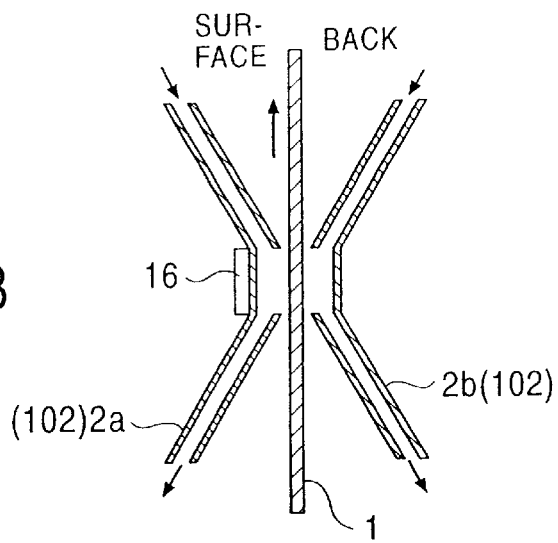
Figure 14C:
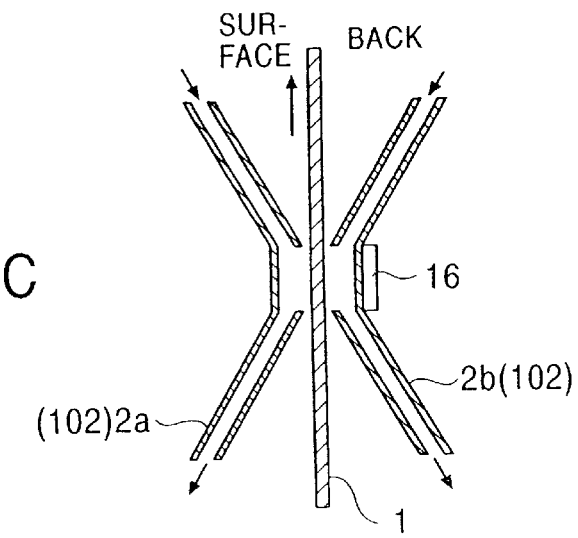

In the case shown in FIG. 14, as in that shown in FIG. 13, the object to be wet-treated has no up-down relationship, and the washing efficiency is the same for the surface as well as for the back. Therefore, the ultrasonic elements 16 may be provided on the back (FIG. 14C), the surface (FIG. 14B), or the surface and the back (FIG. 14A).

Figure 15A:
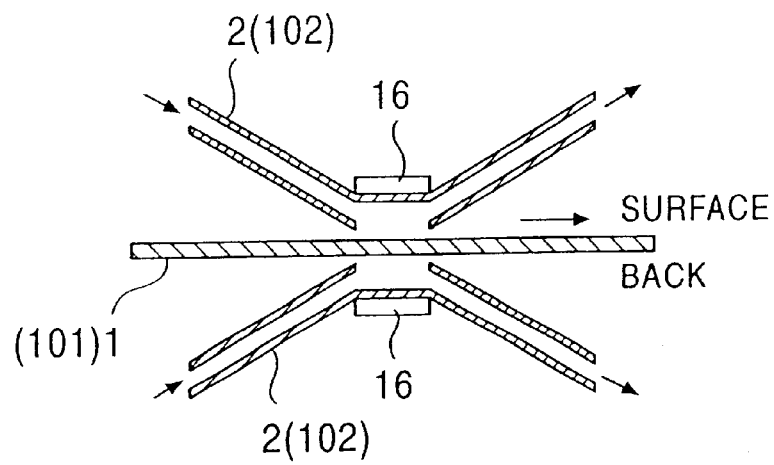
FIGS. 15A, 15B and 15C are sectional side views illustrating a washing apparatus of another embodiment of the invention.
Figure 15B:
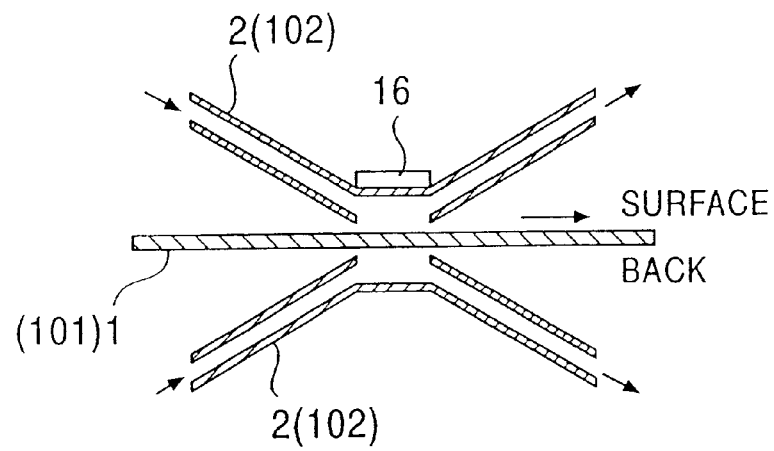
Figure 15C:
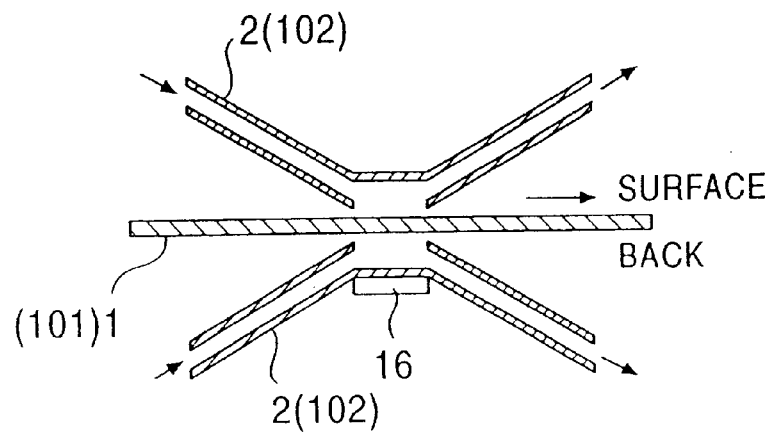

FIG. 15 is a sectional side view of the washing apparatus as viewed from a side, with the back as the lower surface, and the surface as the upper surface. In this case, therefore, the object to be wet-treated 1 is placed horizontally, and transferred in the horizontal direction. Since the washing effect is high on the back an arrangement of the ultrasonic elements 16 shown in FIG. 15B is usually used.

Applicable wet treatment liquid include extra-pure water, electrolytic ion water, ozone water, hydrogen water, and the like for the washing step, and for the other wet treatment steps, and etching solution, a developing solution or stripping liquid is suitably used.

Figure 16:
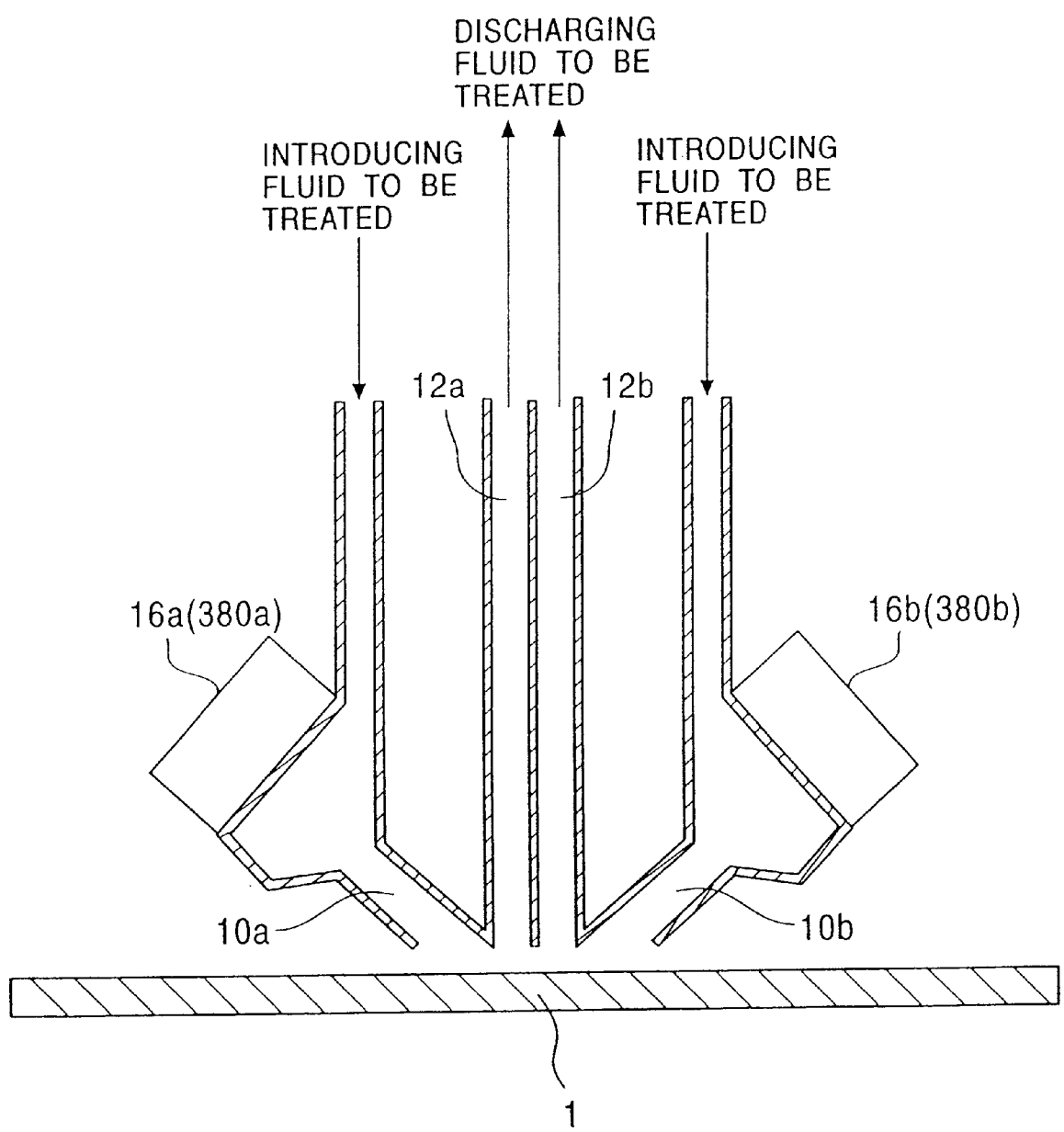
FIG. 16 is a sectional view of a wet treatment apparatus of an embodiment of the invention.

FIG. 16 illustrates a variant of the embodiment shown in FIG. 9 of the wet treatment liquid feed nozzle of the invention.

This variant has the same basic structure as that shown in FIG. 9: discharging paths 12a and 12b are provided, with two opposed introducing paths 10a and 10b in between. A difference is that the distance between the exits of the introducing paths 10a and 10b, on the one hand, and the entries of the discharging paths 12a and 12b is shorter than that shown in FIG. 9. As a result, the wet treatment liquid introduced through the introducing paths 10a and 10b is more efficiently discharged to the discharging paths 12a and 12b.

While a structure in which the discharging paths are arranged between the introducing paths i n FIG. 16, the charging paths may in contrast be arranged between the discharging paths.

Figure 17:
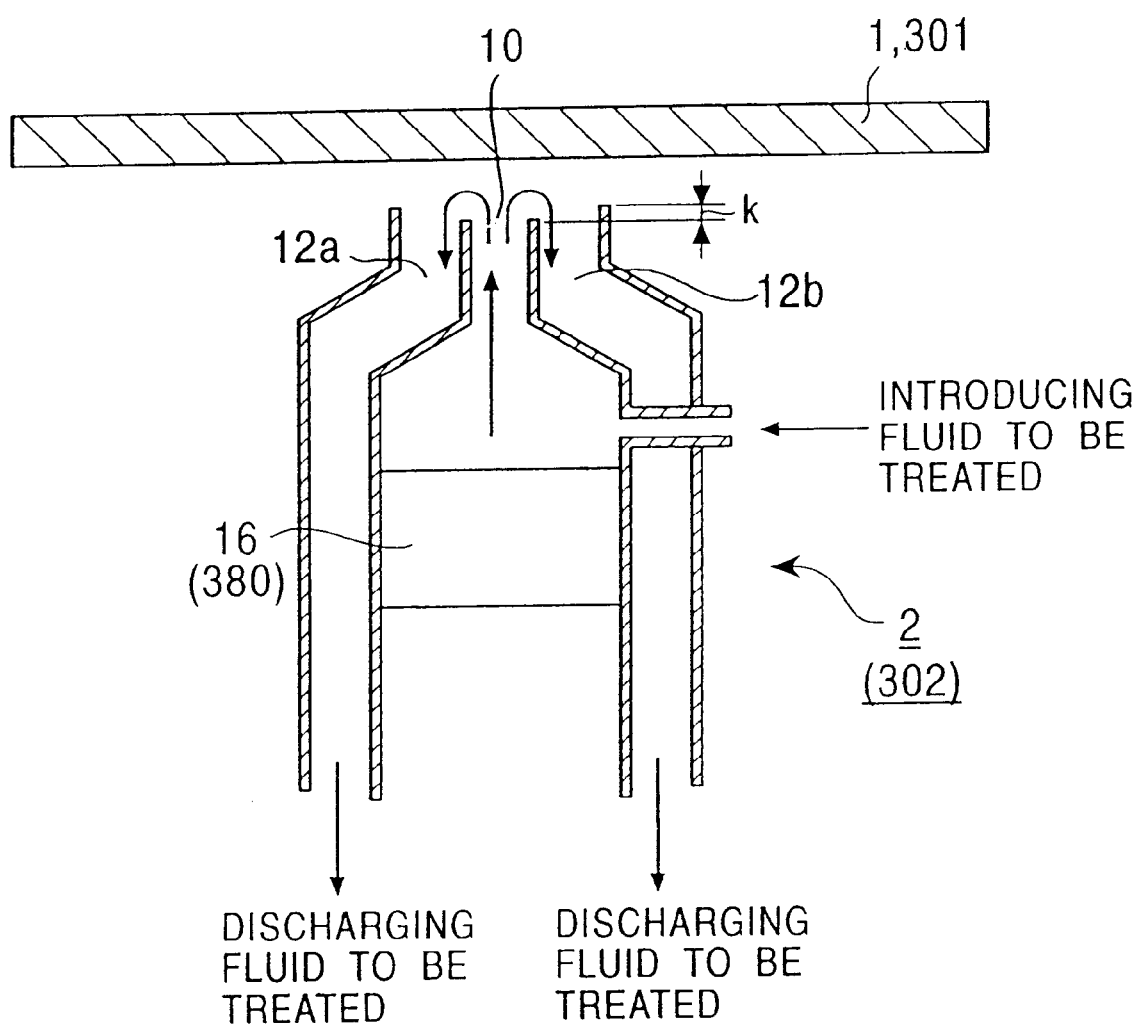
FIG. 17 is a sectional view of a wet treatment apparatus of another embodiment of the invention.

FIG. 17 illustrates a sixth embodiment of the wet treatment liquid feed nozzle of the invention. The reference numeral 16 is an ultrasonic element provided in the introducing path arranged between the discharging paths 12a and 12b so as to impart an ultrasonic wave to the wet treatment liquid.

The wet treatment liquid feed nozzle of this embodiment is suitably applicable to wet treatment of the back of an object to be wet-treated 1 mainly transferred horizontally.

In this embodiment, the introducing path 10 is provided at the center, and discharging paths 12a and 12b are provided on the both sides with the introducing path 10 in between in parallel with the introducing path 10. The exit of the introducing path 10 is slightly lower than the height of the entry of the discharging paths 12a and 12b. The difference k in height should preferably be within a range of from 1 to 2 mm.

The present invention will now be described below in detail by means of examples of substrate washing. It is needless to mention that the invention is not limited to these examples.

EXAMPLE 1

A 500 mm×400 mm rectangular glass substrate was provided.

The substrate surface was stained by immersing the glass substrate into pure water containing $Al_2O_3$ particles. The number of particles on the entire surface of the substrate after staining was measured, giving a result of 41,630 particles. Only particles having a size of at least 0.5 µm were measured.

After the aforesaid staining, washing was carried out by the transverse displacement method as shown in FIG. 11, by the use of the wet treatment liquid feed nozzle shown in FIG. 1. In this example, however, the back of the substrate was not washed.

Conditions for the wet treatment liquid feed nozzle were as follows:
Conditions for wet treatment liquid feed nozzle:
  Nozzle length: 500 mm
  Angle $\theta_1$ of introducing path: 45°
  Angle $\theta_2$ of discharging path: 45°
  Distance from substrate: 1 mm
  Opening section width: 10 mm
  Washing conditions were as follows.
Washing conditions:
  Washing liquid: Electrolytic cathode ion water (pH: 10)
  Washing liquid consumption: 12 L/min
  Ultrasonic frequency: 1 MHz
  Ultrasonic power: 150 W
  Substrate feed speed: 20 mm/sec
(Net washing time=Opening dia/feed speed=(4 mm)/(20 mm/sec)=20 sec
  Number of washing runs: One
After washing, there were observed 150 particles.

Comparative Example 1

A 500 mm×400 mm rectangular glass substrate was prepared as in the Example.

The substrate surface was stained by immersing the glass substrate into pure water containing $Al_2O_3$ particles. The number of particles on the entire surface of the substrate after staining was measured, giving a result of 41,000 particles. Only particles having a size of at least 0.5 µm were measured.

Figure 18A:
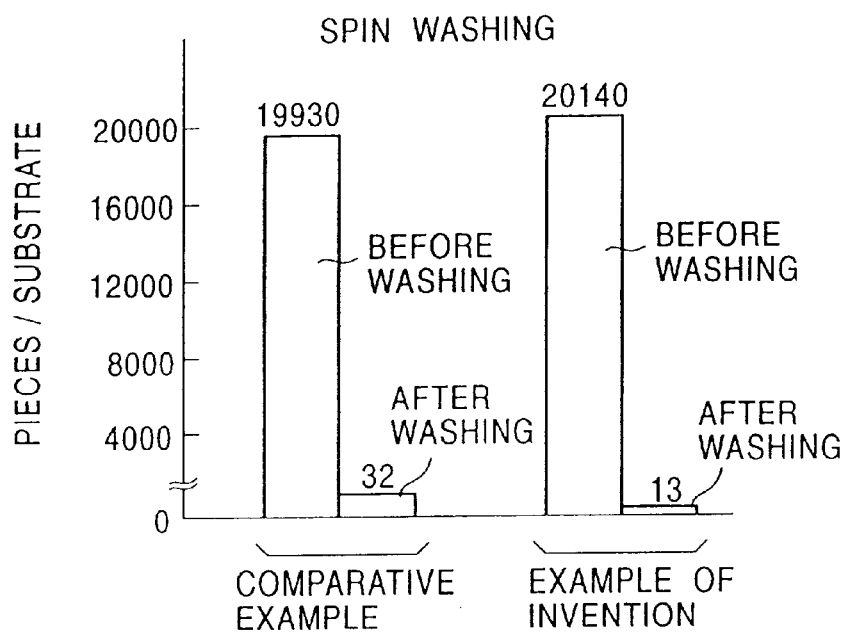
FIG. 18A is a graph illustrating results of an example and a comparative example of rotary washing, and FIG. 18B, of transverse washing.
Figure 18B:
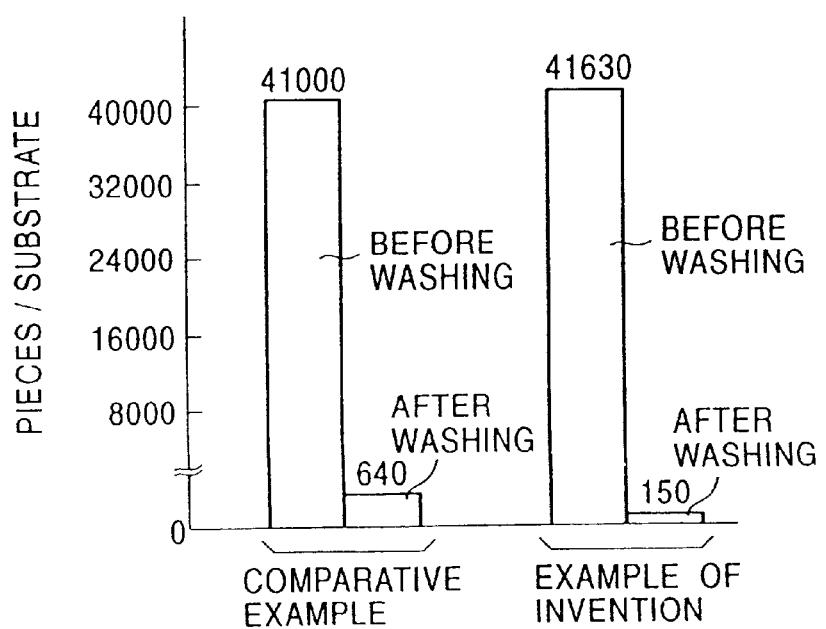
Figure 52A:
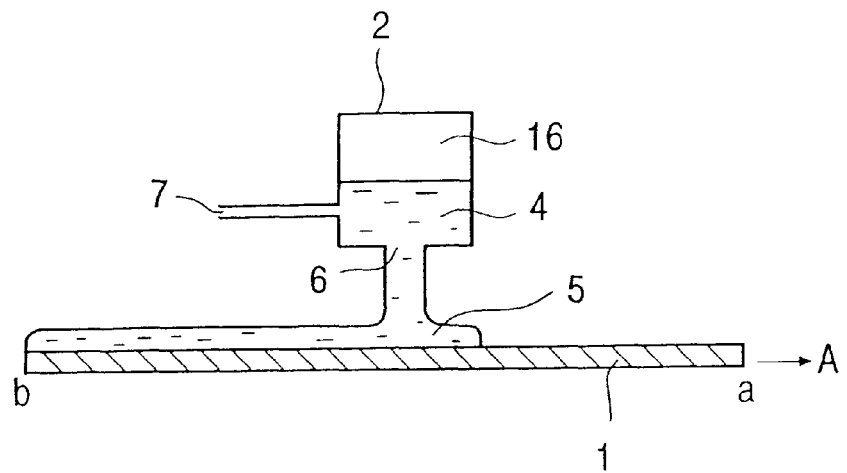
FIG. 52A is a side view and FIG. 52B is a plan view, respectively, of a washing apparatus of a conventional case.

After the aforesaid staining, washing was carried out by the transverse displacement method as shown in FIG. 18b, by the use of the wet treatment liquid feed nozzle shown in FIG. 52A.

Conditions for the wet treatment liquid feed nozzle were as follows:
Conditions for wet treatment liquid feed nozzle:
  Nozzle length: 500 mm
  Opening section width: 2 mm
  Washing conditions were as follows.
Washing conditions:
  Washing liquid: Electrolytic cathode ion water (pH: 10)
  Washing liquid consumption: 25 L/min
  Ultrasonic frequency: 1 MHz
  Ultrasonic power: 900 W
  Washing time: 20 sec
  Number of washing runs: One
After washing, there were observed 640 particles.

The results of the Comparative Example 1 and the Example 1 are shown in FIG. 18B. As is clear from comparison of the both, the Example 1 gave a washing liquid consumption a half that in the Comparative Example 1, and achieved a cleanliness about four times as high as that in the latter. The ultrasonic power was 1/6.

EXAMPLE 2

Spin washing was carried out in this Example.

A six-inch circular glass substrate was provided.

The substrate surface was stained by immersing the glass substrate into pure water containing $Al_2O_3$ particles. The number of particles on the entire surface of the substrate after staining was measured, giving a result of 20,140 particles. Only particles having a size of at least 0.5 µm were measured.

After the aforesaid staining, washing was carried out by the rotating displacement method by the use of the wet treatment liquid feed nozzle shown in FIG. 1.

Conditions for the wet treatment liquid feed nozzle were as follows:
Conditions for wet treatment liquid feed nozzle:
  Nozzle length: 152 mm
  Angle $\theta_1$ of introducing path: 30°
  Angle $\theta_2$ of discharging path: 30°
  Distance between substrate and opening section: 1 mm
  Opening section width: 10 mm
  Washing conditions were as follows.
Washing conditions:
  Washing liquid: Electrolytic ion water
  Washing liquid consumption: 1 L/min
  Ultrasonic frequency: 1 MHz
  Ultrasonic power: 60 W
  Washing time: 10 sec
  Substrate revolutions: 300 rpm
After washing, there were observed 13 particles.

Comparative Example 2

A six-inch circular glass substrate was provided as in the Example 2.

The substrate surface was stained by immersing the glass substrate into pure water containing $Al_2O_3$ particles. The number of particles on the entire surface of the substrate after staining was measured, giving a result of 19,930 particles. Only particles having a size of at least 0.5 µm were measured.

After the aforesaid staining, spin washing was carried out by the use of the wet treatment liquid feed nozzle shown in FIG. 52A.

Conditions for the wet treatment liquid feed nozzle were as follows:
Conditions for wet treatment liquid feed nozzle:
  Nozzle length: 152 mm
  Opening section width: 2 mm
  Washing conditions were as follows.
Washing conditions:
  Washing liquid: Electrolytic cathode ion water
  Washing liquid consumption: 10 L/min
  Ultrasonic frequency: 1 MHz
  Ultrasonic power: 300 W
  Washing time: 10 sec Substrate revolutions: 300 rpm After washing, there were observed 32 particles.

The results of the Comparative Example 2 and the Example 2 are shown in FIG. 18A. As in clear from comparison of the Comparative Example 2 and the Example 2, even in rotating washing, the Example 2 gave a washing liquid consumption of a tenth that in the Comparative Example 2, an ultrasonic power of a fifth, and a cleanliness about three times as high.

In addition to the foregoing examples, an experiment was carried out with various opening section 6 widths D and various gaps H between the substrate and the wet treatment liquid feed nozzle. So far as the relationship of [pressure of wet treatment liquid] Pw≧[atmospheric pressure] Pa was satisfied, a high cleanliness as in the Examples 1 and 2 was achieved with a small consumption of the washing liquid.

Figure 19:
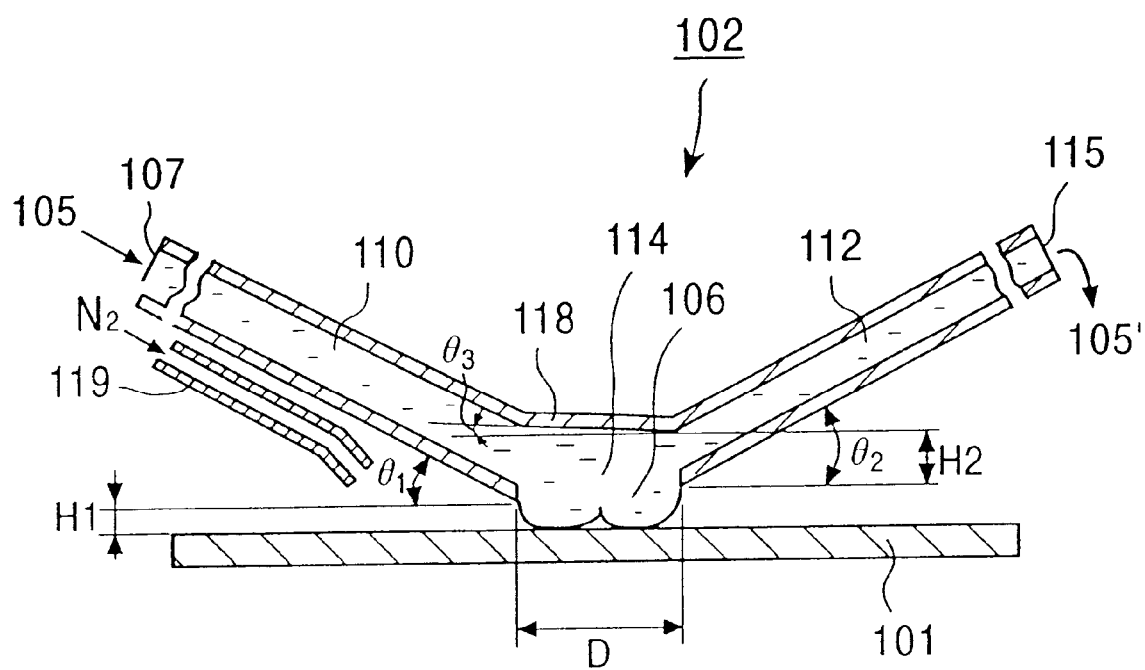
FIG. 19 is a sectional side view of a wet treatment liquid feed nozzle of an embodiment of the invention.

A seventh embodiment of the wet treatment liquid feed nozzle of the invention is illustrated in FIGS. 19 and 20.

Figure 20A:
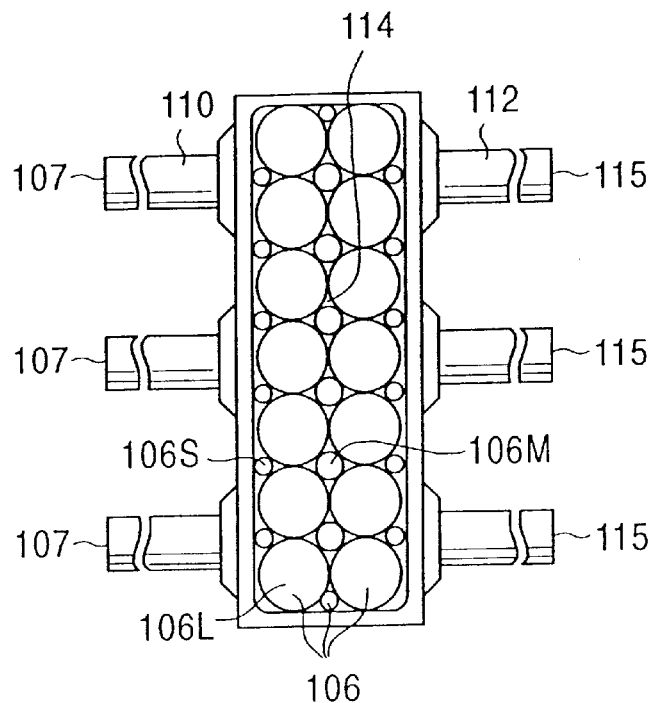
FIG. 20A is a bottom view of the embodiment shown in FIG. 19.
Figure 20B:
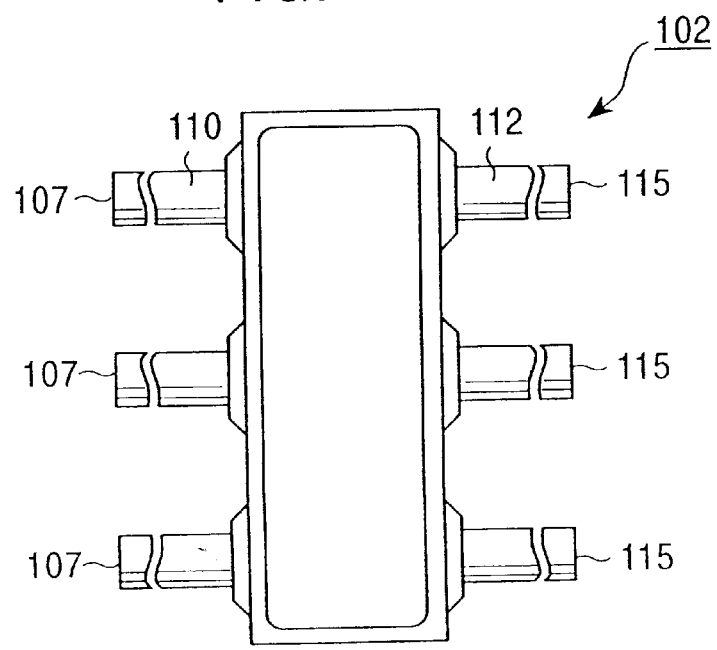
FIG. 20B is a plan view of the embodiment shown in FIG. 19.

FIG. 19 is a sectional side view; FIG. 20A is a bottom view; and FIG. 20B is a plan view.

In FIG. 19, 102 is a wet treatment liquid feed nozzle.

The wet treatment liquid feed nozzle 102 comprises an introducing path 110 having an introducing port 107 for introducing a wet treatment liquid 105 at an end thereof, a discharging path 112 having a discharging port 115 for discharging the wet treatment liquid 105' after a wet treatment to outside the wet treatment system and an opening section 106 opening to an object to be wet-treated (substrate) 101 provided at a crossing section 114 formed by causing the introducing path 110 and the discharging path 112 to cross at the other ends thereof.

The opening section 106 has a mesh shape as shown in FIG. 20A. In the embodiment shown in FIG. 20A, seven large circles 106 L are arranged longitudinally in two rows, and smaller circles 106M and further smaller circles 106S are provided to fill up gaps between large circles, thus achieving the largest possible total opening area.

Because the mesh size is up to a certain level, the wet treatment liquid, coming into contact with the surface of the object to be wet-treated 101, can be prevented from dropping from the opening section under the effect of surface tension even when the wet treatment liquid feed nozzle is separated from the object to be wet-treated 101. As a result, leakage from the crossing section 114 to outside never occurs.

So far as such an effect is available, the shape of mesh is not limited to that shown in FIG. 20A. A shape, a size and a number may appropriately be selected in response to the kind of the wet treatment liquid.

The total opening area should preferable be as large as possible as shown in FIG. 20A because of the possibility to irradiate ultrasonic wave efficiently.

Meshes may be formed by piercing, for example, a metal sheet (such as an SUS316L stainless steel sheet) by punching. Etching technique is also applicable.

In this embodiment, as is clear from FIG. 20, three introducing paths 110 are provided.

Three discharging paths 112 are provided in parallel with the introducing paths 110, respectively. By providing a plurality of introducing paths and discharging paths in the longitudinal direction of the wet treatment liquid feed nozzle 102 (up-down direction in FIG. 20), it is possible to achieve a uniform longitudinal washing efficiency.

The surface of the wet treatment liquid feed nozzle 102 in contact with the liquid should preferably comprises stainless steel having a passive film with an outermost surface consisting of chromium oxide alone for a fluororesin such as PFA or for some particular kinds of wet treatment liquid, stainless steel provided with a mixed film of aluminum oxide and chromium oxide on the surface, or titanium having an electrolytically polished surface for ozone water, with a view to avoiding elution of impurities into the wet treatment liquid. A liquid-contact surface comprising quartz is preferable for any wet treatment liquid except for fluoric acid.

The angle $\theta_1$ between the introducing path 110 and the substrate 101 can appropriately be selected within a range of from 0 to 90°.

On the other hand, the angle $\theta_2$ between the discharging path 112 and the substrate 101 can appropriately be selected within a range of from 0 to 90 °.

The angle $\theta_1$ between the introducing path 110 and the substrate 101 and the angle $\theta_2$ between the discharging path 112 and the substrate 101 is a arbitrarily set considering the contact efficiency of the wet treatment liquid with the substrate, the discharge efficiency of the object to be treated, the shape of the crossing section, and the shape and area of the opening section.

The distance H2 between the portion of the ceiling 118 facing the object to be wet-treated (substrate) forming the crossing section 114, which is the closest to the object to be wet-treated (substrate) 101, on the one hand, and the portion of the opening section 106 the closest to the object to be wet-treated (substrate) 101, on the other hand, should preferably be within a range of from 1 to 50 mm, or more preferably, from 2 to 20 mm. With a distance H2 smaller than 1 mm, the wet treatment liquid becomes difficult to flow, resulting in a lower contact efficiency of the wet treatment liquid with the substrate and a poorer discharge efficiency of the treated object. With a distance H2 of over this range, on the other hand, the wet treatment liquid in a large quantity would be present in the wet treatment liquid feed nozzle 102, resulting in a larger weight of the wet treatment liquid feed nozzle 102, and in troubles in displacement of the wet treatment liquid feed nozzle 102.

The distance H1 (between the object to be wet-treated 101 and the opening section 106) should preferably be within a range of from 0.1 to 5 mm, or more preferably, from 1 to 2 mm.

Because the value of H1 may not always be constant under the effect of vibration of the transfer machine or an uneven surface of the substrate itself, it is desirable to provide a sensor for measuring H1, and further, means for bringing the wet treatment liquid feed nozzle 102 apart from, or closer to, the object to be wet-treated 101 in response to a signal from the sensor. At least two aforesaid length measuring units at the top and the bottom in FIG. 20A with the wet treatment liquid feed nozzle in between. This is to achieve a uniform distance between the object to be wet-treated 101 and the opening section 106 for the entire wet treatment liquid feed nozzle, and to control the flow of the wet treatment liquid without fail. The length measuring accuracy should preferably be under 0.1 mm. This is because the lower limit of the distance between the wet treatment liquid feed nozzle and the object to be wet-treated should preferably be 0.1 mm in view of the current practice of treatment of a large-sized substrate, and this is to certainly control this distance.

In FIG. 19, 119 is a contact preventing gas ejecting section. The contact preventing gas ejecting section is provided at least on any of the sides of the introducing path 10 and the discharging path so as to prevent the opening section 106 from coming into contact with the object to be wet-treated when the object to be wet-treated 101 is lifted up to cope with an imbalance between the pressure of the wet treatment liquid in contact with the open air at the opening section and the atmospheric pressure. Preferable gases applicable in such a use include nitrogen gas and an inert gas, and air free from impurities (particularly organic matters) is also applicable.

Figure 21:
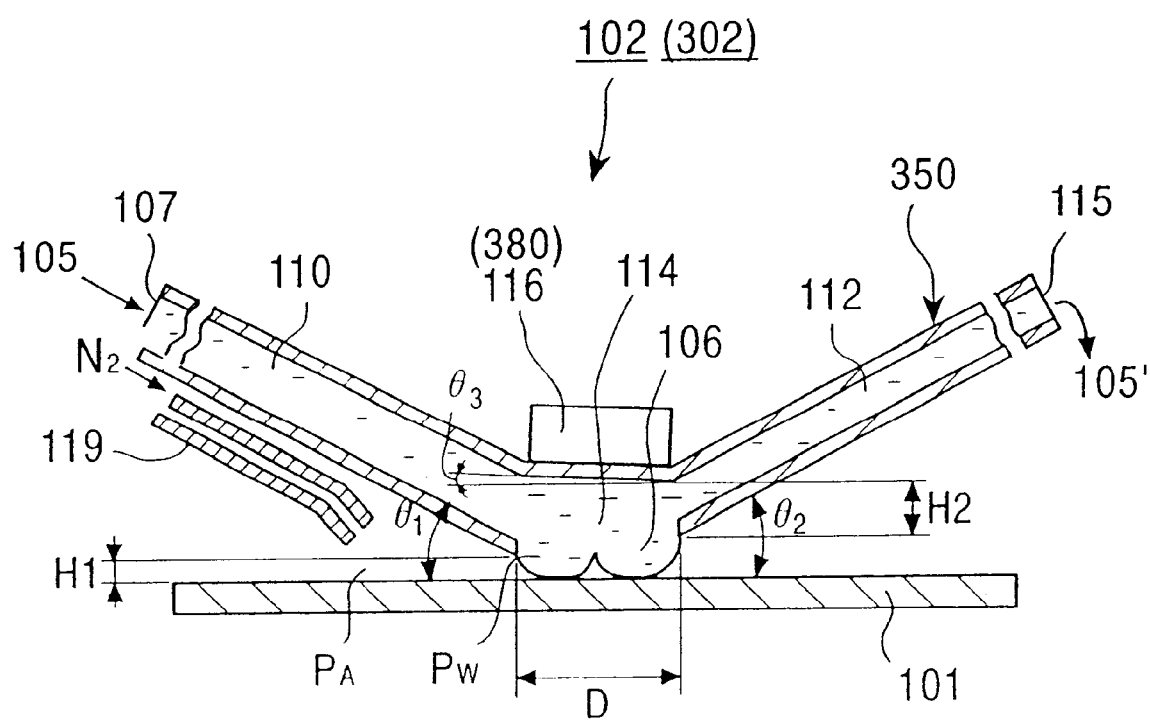
FIG. 21 is a sectional side view of a wet treatment liquid feed nozzle of another embodiment of the invention.

FIG. 21 illustrates an eighth embodiment of the wet treatment liquid feed nozzle of the invention.

In FIG. 21, 102 is a wet treatment liquid feed nozzle. The wet treatment liquid feed nozzle 102 has the following configuration.

The wet treatment liquid feed nozzle 102 comprises an introducing path 110 having an introducing port 107 for introducing a wet treatment liquid 105 at an end thereof, a discharging path 112 having a discharging port 115 for discharging the wet treatment liquid 105 after a wet treatment to outside the set treatment system, a crossing section 114 formed by causing the introducing path 110 and the discharging path 112 to cross at the other ends thereof, and opening section 106 opening to an object to be wet-treated (substrate) at the crossing section 114, and an ultrasonic element 116 provided opposite to the object to be wet-treated so as to impart an ultrasonic wave during wet treatment of the object to be wet-treated.

In this embodiment, a contact preventing $N_2$ nozzle 119 is provided as in the foregoing tenth embodiment. This is not however always necessary.

Figure 22A:
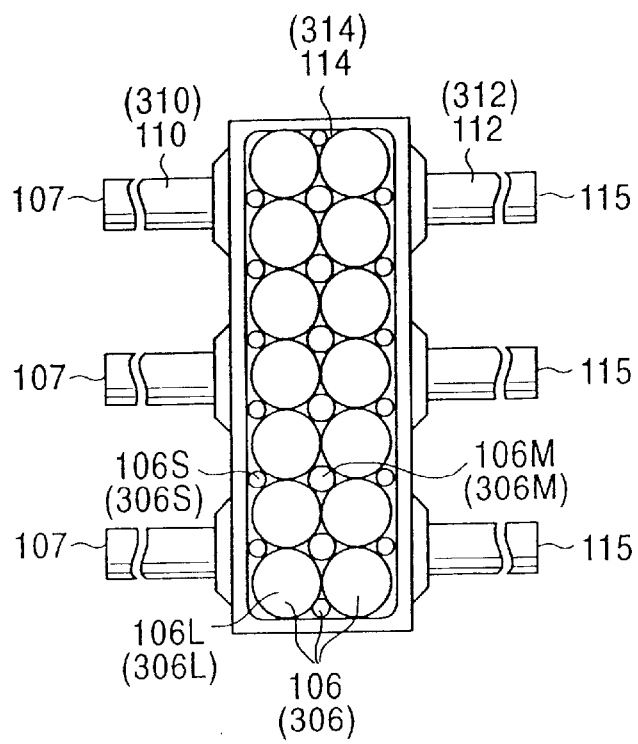
FIG. 22A is a bottom view of the embodiment shown in FIG. 21.
Figure 22B:
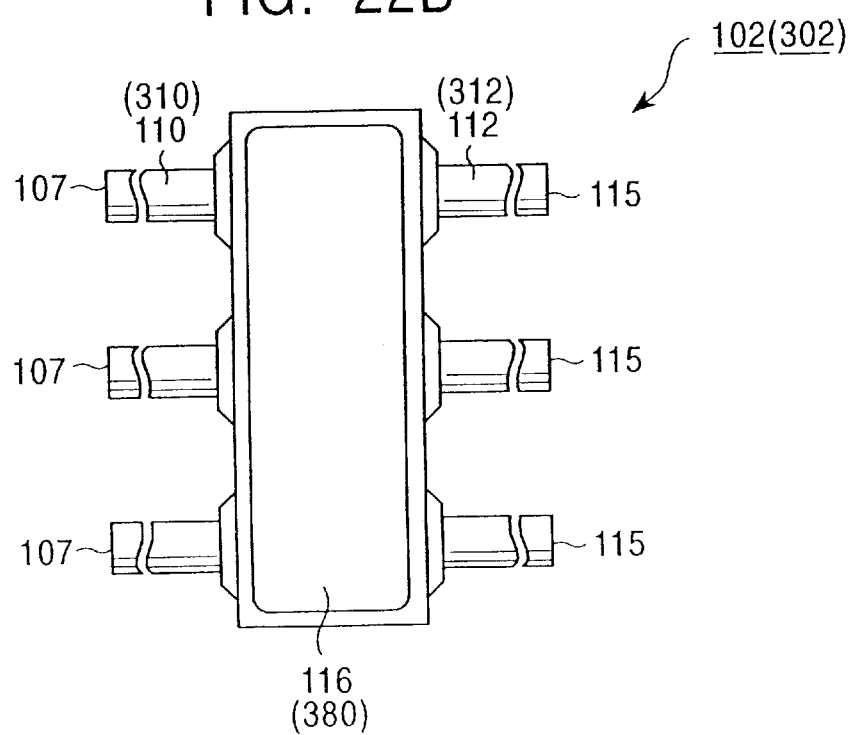
FIG. 22B is a plan view of the embodiment shown in FIG. 21.

FIG. 22B is a plan view, and FIG. 22A is a bottom view, respectively, of the wet treatment liquid feed nozzle shown in FIG. 21.

The ultrasonic element 116 gives an output of an ultrasonic wave having a frequency of at least 19 KHz. It should preferable be a megasonic ultrasonic element of a frequency within a range of from 0.2 to 5 MHz.

The angle $\theta_3$ between the ultrasonic element 116 and the substrate 101 can be appropriately selected within a range of from 0 to 90°, or more preferably, from 2 to 45°.

Imparting such a megasonic ultrasonic wave gives a remarkable improving effect of cleanliness.

The case shown in FIG. 22 has a single ultrasonic element 116. As in FIG. 6, a plurality of ultrasonic elements may be provided. The case shown in FIG. 6 comprises three ultrasonic elements 116a, 116b and 116C in the longitudinal direction (up-down direction in the drawing). Provision of a plurality of ultrasonic elements permits change from time to time of the ultrasonic frequency and output, thus leading to uniform washing.

Apart from the longitudinal direction, a plurality of ultrasonic elements may be arranged in the transverse direction. They may also be arranged both in the longitudinal and transverse directions.

Figure 23A:
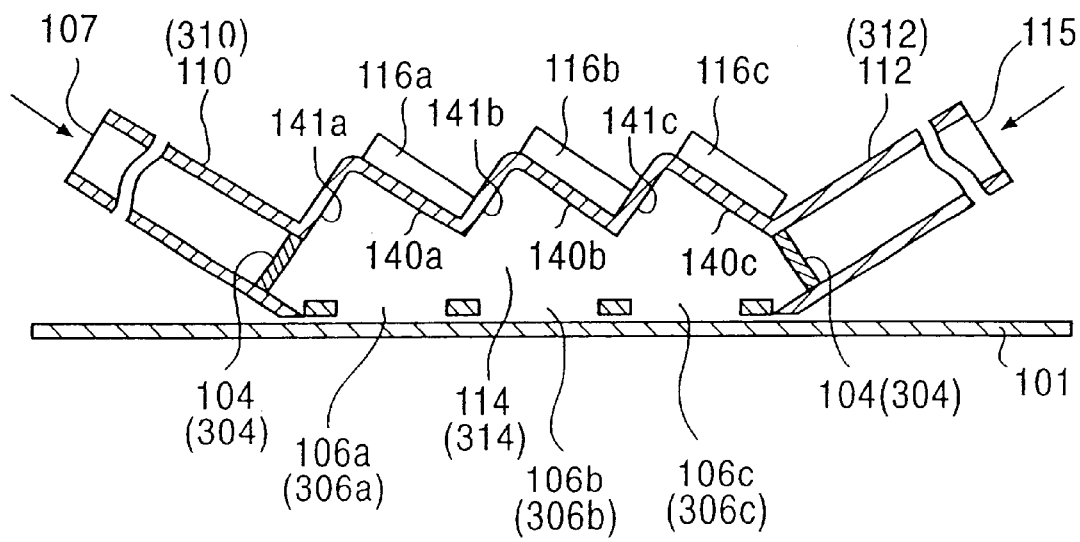
FIG. 23A is a sectional side view and FIG. 23B is a plan view, respectively, of a further embodiment of the invention.
Figure 23B:
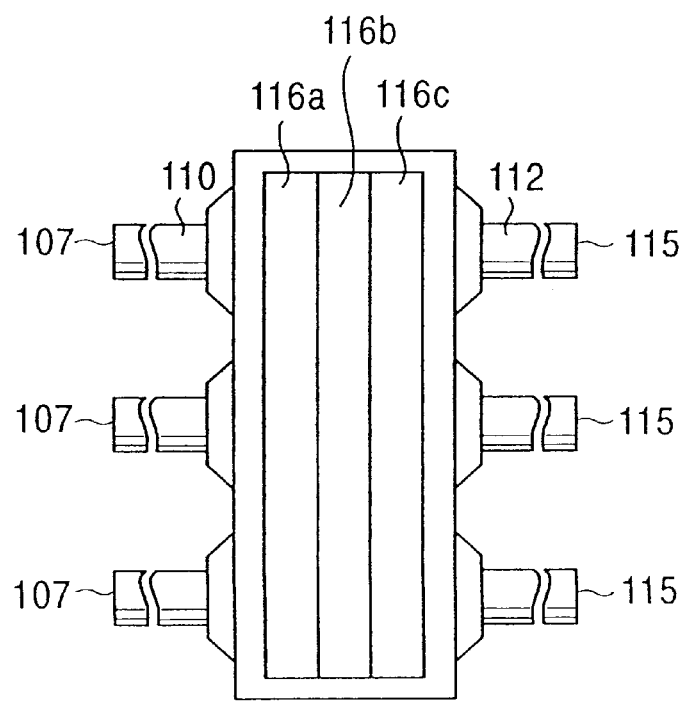

FIG. 23 illustrates a ninth embodiment of the wet treatment liquid feed nozzle of the invention. In this embodiment, a plurality of steps 140a, 140b, 140c, 141a, 141b and 141c are provided on the ceiling opposite to the treated surface of the object to be treated 101. The ultrasonic elements 116a, 116b and 116c are provided on the ceiling steps 140a, 140b, and 140c sequentially from the left top to right bottom in the drawing.

According to this embodiment, it is possible to impart an ultrasonic wave in counter current to the wet treatment liquid fed from the introducing path 110 to the crossing section 114, since the ultrasonic elements 116a, 116b and 116c are provided sequentially from the left top to the right bottom of the ceiling, and the steps of the ceiling give substantially uniform gaps between the ultrasonic elements and the object to be wet-treated, thus permitting uniform washing.

The ultrasonic elements 116a, 116b and 116c may have different frequencies from each other.

In the embodiment shown in FIG. 23, rectifying sections 104 for achieving uniform flows of the wet treatment liquid are provided at portions of the introducing path 110 and the discharging path 112 facing the crossing section 114. The rectifying section may be composed of, for example, a filter or a slit.

The opening sections are of a mesh shape as in the foregoing seventh embodiment, as represented by 106a, 106b and 106c.

Figure 24A:
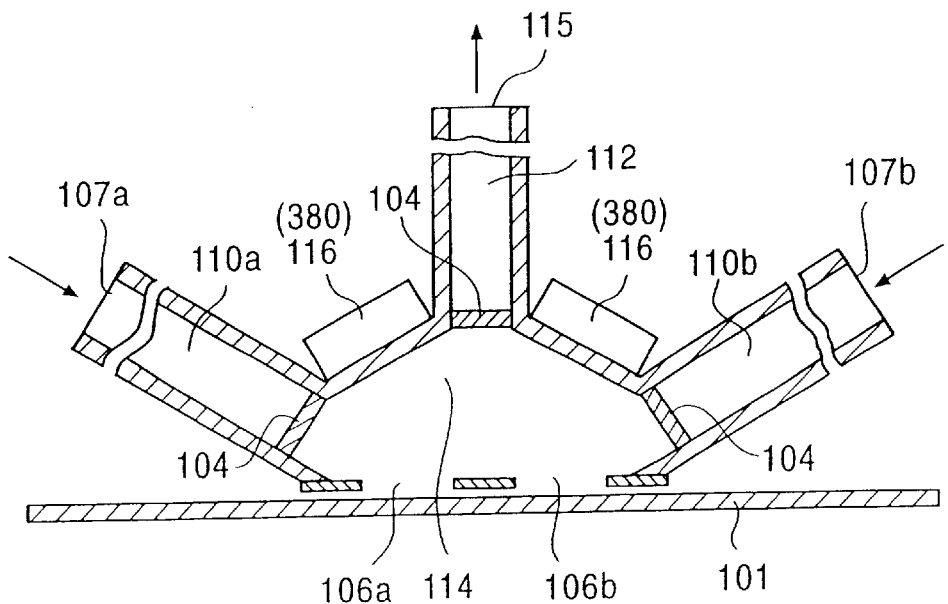
FIG. 24A is a sectional side view and FIG. 24B is a plan view, respectively, of a further embodiment of the invention.
Figure 24B:
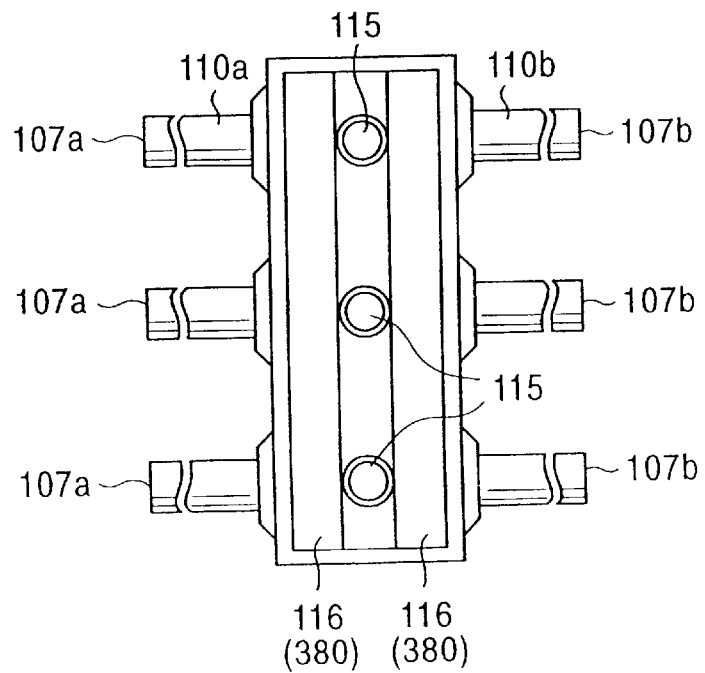

FIG. 24 illustrates a tenth embodiment of the wet treatment liquid feed nozzle of the invention.

In this embodiment, the discharging path 112 is provided at right angles to the substrate 101, and introducing paths 110a and 110b are symmetrically provided with the discharging path 112 in between.

In this embodiment, the wet treatment liquid is fed from the right and left introducing paths 110a and 110b onto the opposite substrate 101. Leakage of the washing liquid is further reduced, and the washing liquid after washing is more rapidly carried away into the discharging path 112. Irradiation frequencies of the two ultrasonic elements 116 may be the same or different. The two ultrasonic elements 116 may be oscillated alternately at certain time intervals or simultaneously.

The opening sections are of a mesh shape as in the foregoing seventh embodiment, as represented by 106a and 106b.

Figure 25A:
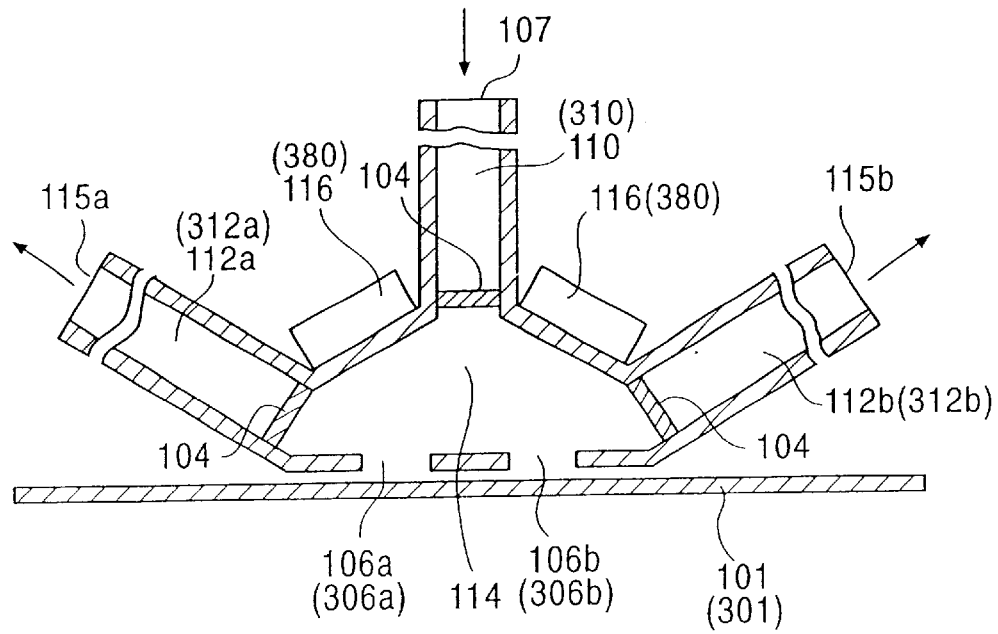
FIG. 25A is a sectional side view and FIG. 25B is a plan view, respectively, of a further embodiment of the invention.
Figure 25B:
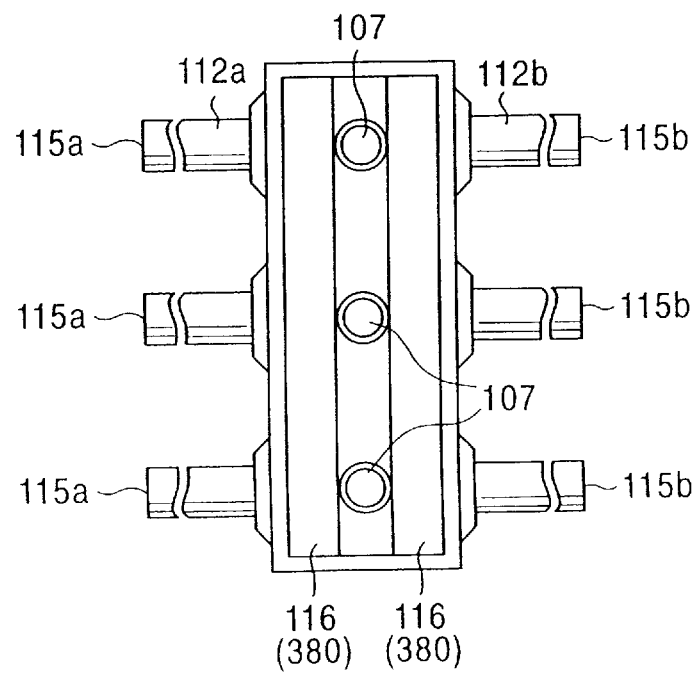

FIG. 25 illustrates an eleventh embodiment of the wet treatment liquid feed nozzle of the invention.

In this embodiment, the introducing path 110 is arranged at right angles to the substrate 101, and the discharging paths 112a and 112b are symmetrically provided with the introducing path 110 in between.

The opening sections are of a mesh shape as in the foregoing seventh embodiment, as represented by 106a and 106b.

Figure 26:
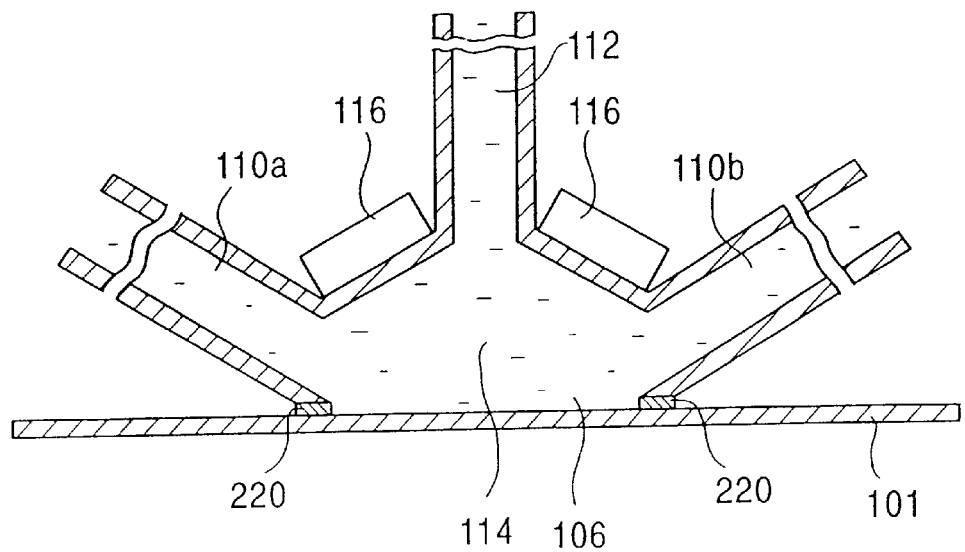
FIG. 26 is a sectional side view of a wet treatment liquid feed nozzle of a further embodiment of the invention.

FIG. 26 illustrates a twelfth embodiment of the wet treatment liquid of the invention.

This embodiment represents a case in which cilia 220 are provided on the peripheral edge of the opening section 106 for preventing leakage of the liquid.

The wet treatment liquid feed nozzle of this embodiment comprises introducing paths 110a and 110b each having an introducing port for introducing a wet treatment liquid at an end thereof, a discharging path 112 having a discharging port for discharging the wet treatment liquid after a wet treatment to outside the set treatment system, a crossing section 114 formed by causing the introducing paths and the discharging path to cross at the other ends thereof, an opening section 106 opening to an object to be wet-treated 101 at the crossing section 114, and cilia 220 provided on the peripheral edge of the opening section 106 in parallel with the normal of the treated surface of the object to be wet-treated 101.

Under the effect of the cilia 220, the wet treatment liquid in contact with the treated surface of the object to be wet-treated 101 is discharged from the discharging path 112 without leaking to outside the system.

The cilia 220 should preferably made of a water-repellent material with a view to further preventing liquid leakage. Preferable materials include Teflon PFA{—($CF_2$—$CF_2$)m—($CF_2$—$CFOR_2$)n—}, PTFE{—($CF_2$—$CF_2$)n—}, and nylon. The diameter of the cilia 220 should preferably be within a range of from 0.01 mm to 0.1 mm. With a diameter of over 0.1 mm, contact with the object to be wet-treated 101 may cause a damage to the object to be wet-treated 101. A diameter of under 0.01 mm results in a lower strength of the material itself. A length and a density of cilia may arbitrarily be selected. The length should preferably be within a range of from 1 to 2 mm.

The cilia 220 are provided on a nozzle having a structure as shown in FIG. 26 in this embodiment. It is however needless to mention that cilia may be provided on any of the basic structures shown in the foregoing seventh to eleventh embodiments.

Figure 27:
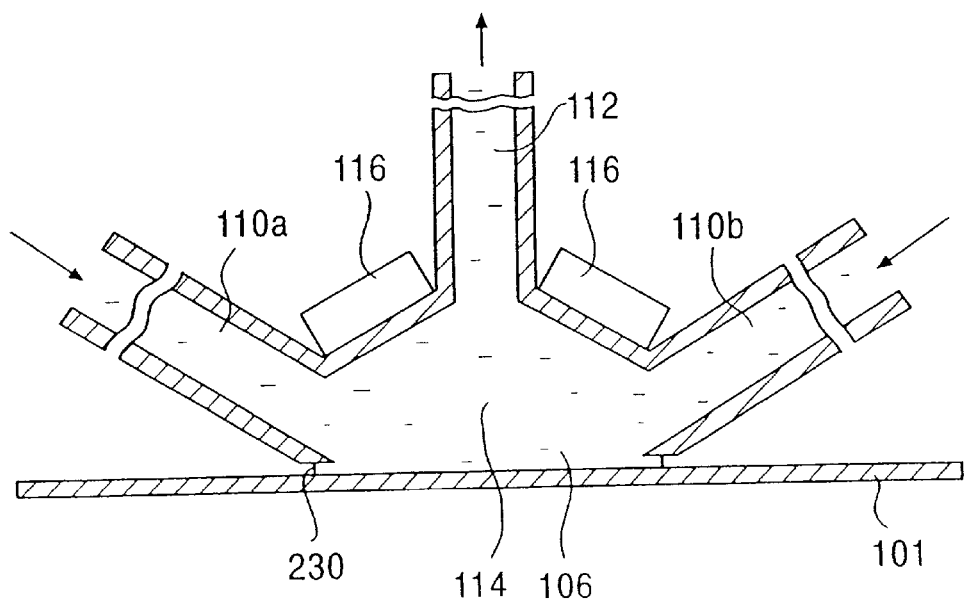
FIG. 27 is a sectional side view of a wet treatment liquid feed nozzle of a further embodiment of the invention.

FIG. 27 illustrates the thirteenth embodiment of the wet treatment liquid feed nozzle of the invention.

In this embodiment, a film 230 is used in place of the cilia presented in the foregoing twelfth embodiment. All the other points are the same as in the twelfth embodiment.

FIG. 28 illustrates a fourteenth embodiment of the wet treatment liquid feed nozzle of the invention.

This embodiment is to prevent entanglement of air by providing an auxiliary path.

The wet treatment liquid feed nozzle of the fourteenth embodiment comprises an introducing path 110 having an introducing port 107 for introducing a wet treatment liquid at an end thereof, discharging paths 112a and 112b having discharging ports 115a and 115b for discharging the wet treatment liquid after a wet treatment to outside the wet treatment system, a crossing section 114 formed by causing the introducing path and the discharging paths to cross at the other ends thereof, an opening section 106 opening to an object to be wet-treated 101 provided at the crossing section 114, and auxiliary paths 240a and 240b communicating with the crossing section 114, provided at least between the discharging paths 115a and 115b the object to be wet-treated 101.

When the balance between the pressure of the wet treatment liquid in contact with the object to be wet-treated 101 and the atmospheric pressure is disturbed by some vase or other, and the open air pressure becomes higher, air flows into the crossing section and entangled into the wet treatment liquid.

Figure 38:
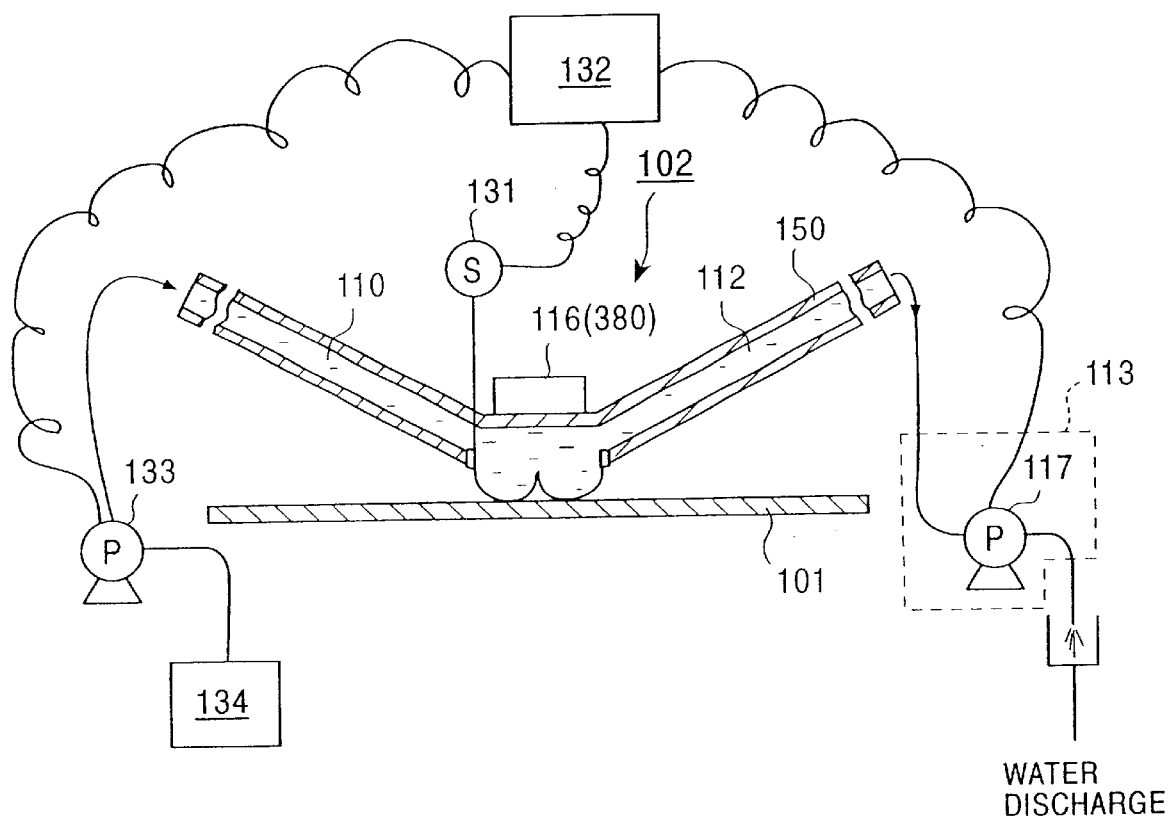
FIG. 38 is a sectional side view of a wet treatment liquid feed nozzle apparatus of another embodiment of the invention.

By providing a sensor 131 as shown in FIG. 38 described later, it is possible to know the status of balance in pressure.

When there is a risk of breakage of pressure balance, the balance in pressure ca be maintained by ejecting the wet treatment liquid into the crossing section.

FIG. 28 shows a case in which the auxiliary paths 240a and 240b are added to the basic configuration comprising the two discharging paths 112a and 112b with the introducing path 110 in between. It is however needless to mention that the auxiliary paths may be added to a basic configuration having a single introducing path and a single discharging path, shown in FIG. 19.

FIG. 29 illustrates a fifteenth embodiment of the wet treatment liquid feed nozzle of the invention.

Figure 29A:
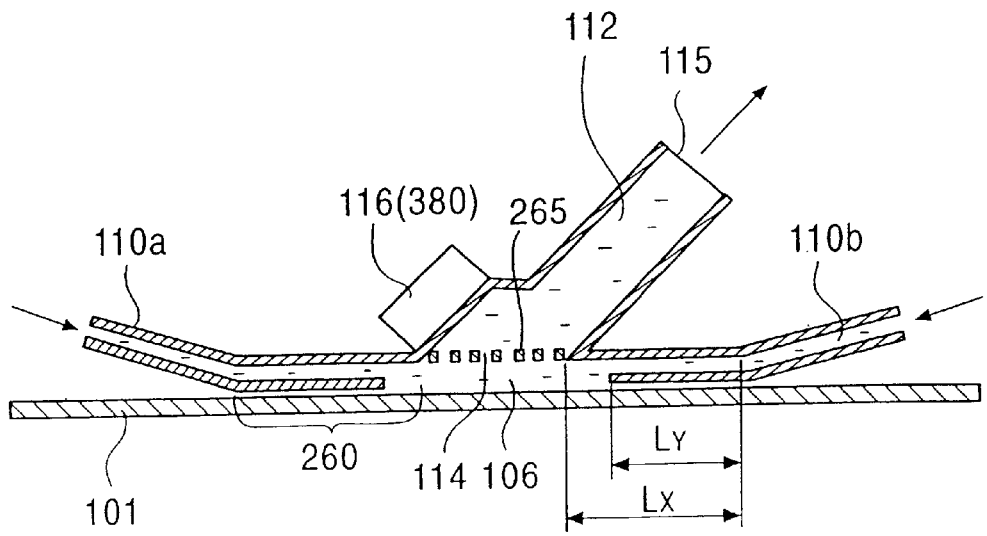
FIG. 29A is a sectional side view and FIG. 29B is a plan view in which the mesh 265 is omitted, respectively, of a further embodiment of the invention.
Figure 29B:
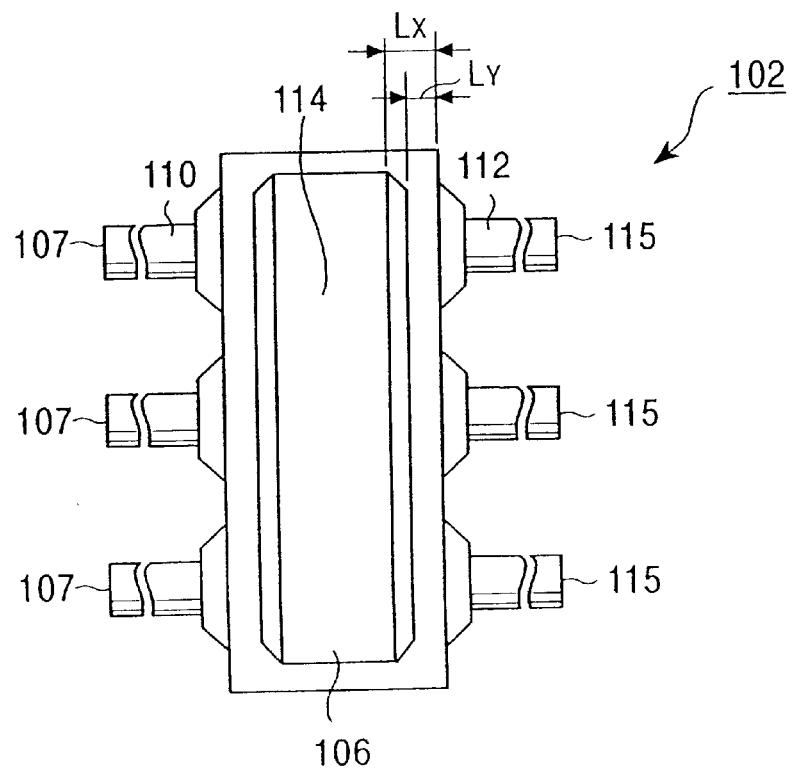

FIG. 29A is sectional side view, and FIG. 29B is a plan view.

The wet treatment liquid feed nozzle of the fifteenth embodiment comprises introducing paths 110a and 110b each having an introducing port for introducing a wet treatment liquid at an end thereof, a discharging path 112 having a discharging port 115aa for discharging the wet treatment liquid after a wet treatment to outside the wet treatment system, a crossing section 114 formed by causing the introducing paths 110a and 110b and the discharging path 112 to cross at the other ends thereof. An opening section 106 opening to an object to be wet-treated provided at the crossing section, and a parallel flow section 260 through which the wet treatment liquid flows in parallel with the treated surface of the object to be wet-treated 101.

When the wet treatment liquid is introduced through the parallel flow section 260, replacement of the wet treatment liquid after treatment and the newly introduced wet treatment liquid is efficiently accomplished, so that the object to be wet-treated can always be wet-treated with fresh wet treatment liquid.

The length Lx the parallel flow section 260 should preferably be within a range of from 1 mm to 10 mm. With a length of under 1 mm, it is difficult to control the flow direction. With a length of over 10 mm, the nozzle becomes excessively larger in size.

The wet treatment liquid flowing through the parallel flow section 260 may come into contact with the object to be wet-treated 101, or may flow without coming into contact with the object to be wet-treated 101.

In the case shown in FIG. 29, the upper length Lx of the parallel flow section 260 is substantially equal to the lower length Ly thereof. When the lengths Ly=Lx for the parallel flow section 260, therefore, the wet treatment liquid does not come into contact with the object to be wet-treated in the parallel flow section, and is introduced into the crossing section 114. In this case, the wet treatment liquid is controlled so as to be in parallel with the object to be wet-treated, enters the crossing section, comes into contact with the object to be wet-treated at the opening section and flows into the discharging path, thereby improving washing efficiency.

On the other hand, Ly=0 in the case shown in FIG. 30 giving a variant of the foregoing fifteenth embodiment. That is, the wet treatment liquid flows through the parallel flow section while being in contact with the object to be wet-treated.

In this variant of the fifteenth embodiment, the mesh is a little deeper than the opening section 106. In other words, a mesh plate 265 having a mesh-shaped opening is provided near the beginning of the discharging path 112. By adopting this configuration, it is possible to avoid exhaustion of the treatment liquid upon closing a valve provided in the discharging path from the proximity to the ultrasonic element 116 even in stoppage of the wet treatment liquid.

The cross-sectional area of the discharging path 112 is larger on the crossing section 114 side, and smaller on the discharge port 115 side. This is for arranging the ultrasonic element 116 at a position where an ultrasonic wave can be efficiently imparted, and for discharging the wet treatment liquid after wet treatment promptly on the discharge port 115 side.

Figure 31A:
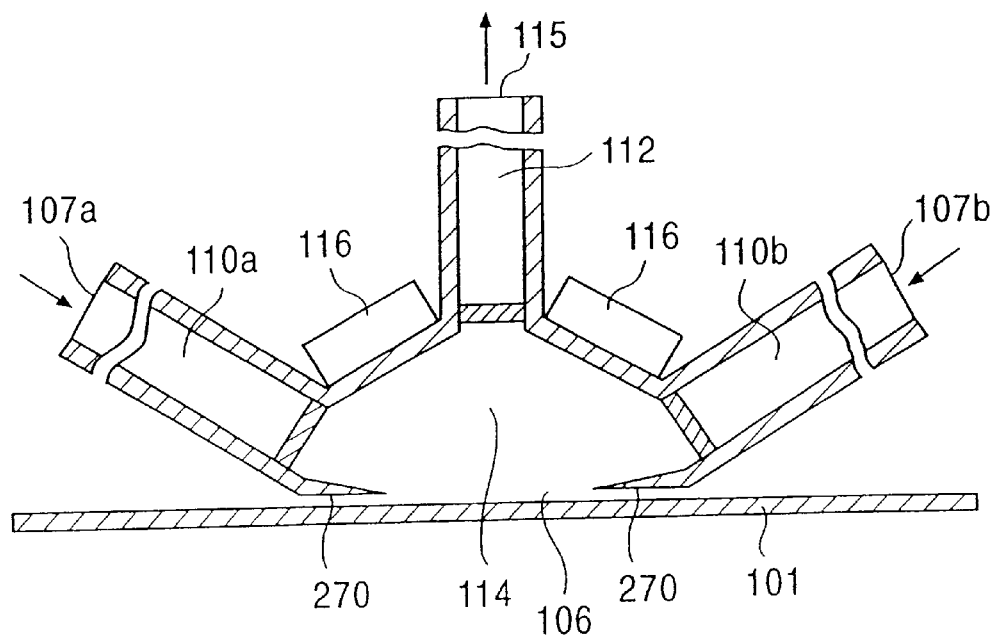
FIG. 31A is a sectional side view and FIG. 31B is a plan view, respectively, of a further embodiment of the invention.
Figure 31B:
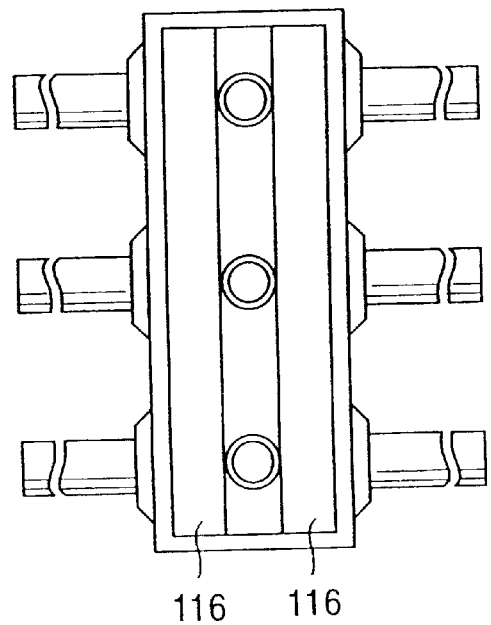

FIG. 31 illustrates a sixteenth embodiment of the wet treatment liquid feed nozzle of the invention.

The wet treatment liquid feed nozzle of the sixteenth embodiment comprises introducing paths 110a and 110b having respective introducing ports 107a and 107b for introducing a wet treatment liquid at ends on one side thereof, a discharging path 112 having a discharging port 115 for discharging the wet treatment liquid after a wet treatment to outside the wet treatment system, a crossing section 114 formed by causing the introducing paths 110a and 110b and the discharging path 112 to cross at the other ends thereof, an opening section 106 opening to an object to be wt-treated 101, and an inner extension 270 provided on the peripheral edge of the opening section 106, from the peripheral edge toward inside, of which the outer surface is in parallel with the treated surface of the object to be wet-treated 101.

When such an inner extension 270 is provided, it is possible to prevent air from the open air side from being entangled into the wet treatment liquid, since the wet treatment liquid in contact with the object to be wet-treated 101 communicates with the open air only through a very small gap between the object to be wet-treated 101 and the inner extension. It is also possible to prevent leakage of the wet treatment liquid to the open air side.

Figure 32:
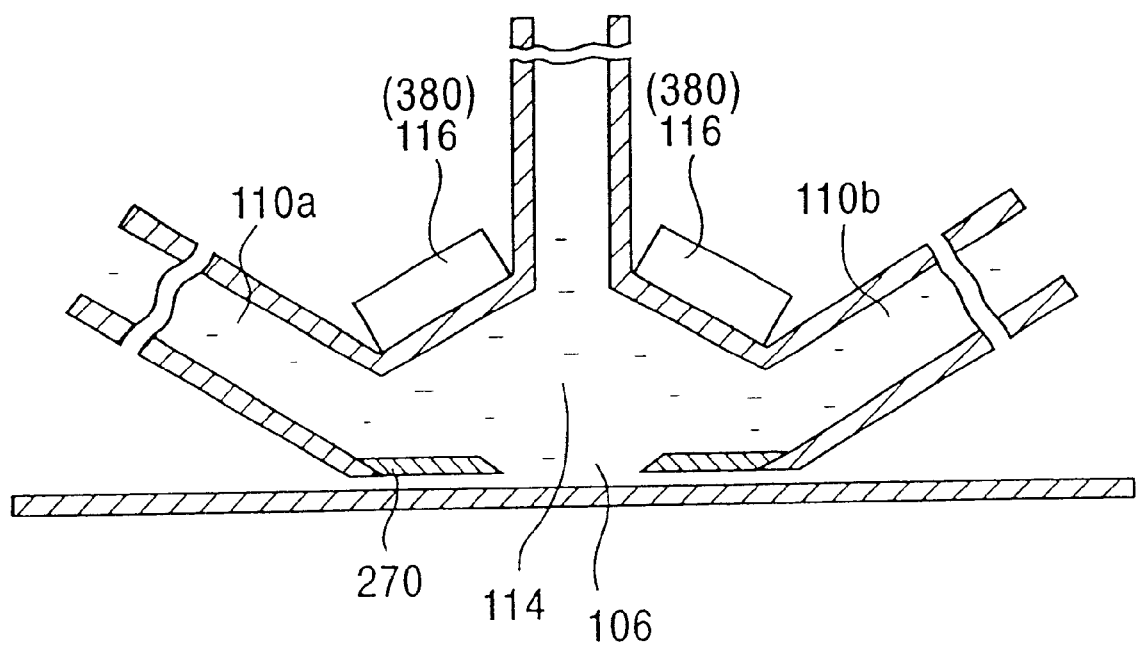
FIG. 32 is a sectional side view of a wet treatment liquid feed nozzle of a further embodiment of the invention.

FIG. 32 illustrates a variant of the aforesaid sixteenth embodiment, in which the inner extension 270 comprises a material different from the material for the introducing paths 110a and 110b. Suitable materials for the introducing path include stainless steel such as SUS316L (particularly, stainless steel having an oxide passive film of chromium oxide alone formed on the surface) and aluminum (aluminum having a fluoride passive film formed on the inner surface). The inner extension should preferably be formed of a water repellent material such as PTFE, PVDF{(CFH—CH2)n—} or PFA.

FIG. 33 illustrates a seventeenth embodiment of the wet treatment liquid feed nozzle of the invention.

The wet treatment liquid feed nozzle of the seventeenth embodiment comprises introducing paths 110a and 110b having respective introducing ports 107a and 107b for introducing a wet treatment liquid at ends on one side thereof, a discharging path 112 having a discharging port 115 for discharging the wet treatment liquid after a wet treatment to outside the wet treatment system, a crossing section 114 formed by causing the introducing paths 110a and 110b and the discharging path 112 to cross at the other ends thereof, an opening section 106 opening to an object to be wet-treated 101 provided at the crossing section 114, and a sealing member 280 provided on the peripheral edge of the opening section 106 for sealing the crossing section 114 from outside while being in contact with a support stand 281 of the object to be wet-treated 101.

An object of this embodiment is to cut off the wet treatment liquid from outside by completely sealing the crossing section 114 with a sealing member 280, thereby discharging the wet treatment liquid after the wet treatment completely into the discharging path 112.

According to this embodiment, the sealing member permits achievement of perfect prevention of liquid leakage.

Figure 33A:
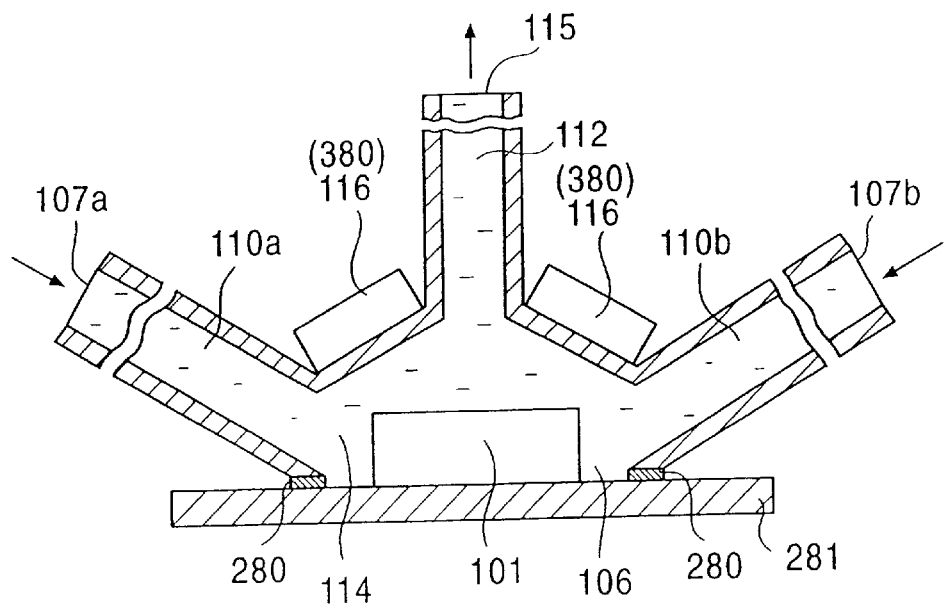
FIG. 33A is an example in which it is brought into contact with a support stand.
Figure 33B:
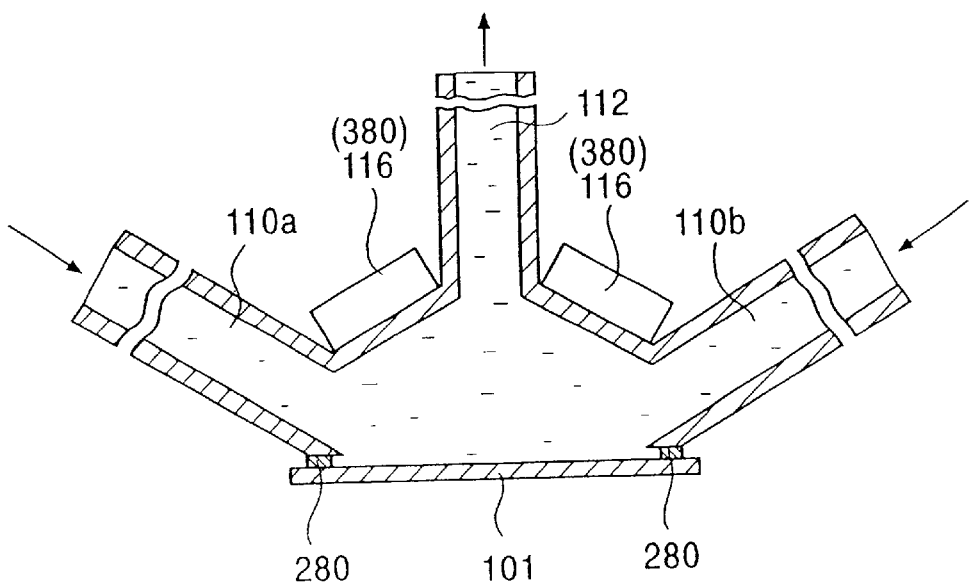
FIG. 33B is an example in which it is brought into contact with an outer edge of the object to be wet-treated.

Or, as shown in FIG. 33B, the sealing member should preferably be in contact with a portion allowing contact such as the outer periphery of the object to be wet-treated 101.

In this embodiment, it is not necessary to arrange the wet treatment liquid feed nozzle movably in parallel with the object to be wet-treated 101, but it suffices to provide the nozzle vertically or diagonally movably relative to the object to be wet-treated 101.

FIG. 34 illustrates an eighteenth embodiment of the wet treatment liquid feed nozzle of the invention.

The wet treatment liquid feed nozzle of the eighteenth embodiment comprises an introducing path 110 having an introducing port 107 for introducing a wet treatment liquid at an end thereof, discharging paths 112a and 112b having respective discharging ports 115a and 115b for discharging the wet treatment liquid after a wet treatment to outside the wet treatment system, a crossing section 114 formed by causing the introducing path 110 and the discharging paths 112a and 112b to cross at the other end thereof, a opening section 106 opening to an object to be wet-treated 101 at the crossing section 114, and an auxiliary introducing path 290 communicating with the discharging path 115b. In FIG. 34, 270 is an inner extension provided on the peripheral edge of the opening section 106, from the peripheral edge toward inside, of which the outer surface is in parallel with the treated surface of the object to be wet-treated 101.

The wet treatment liquid is constantly fed from the introducing path 110 to the crossing section 114. However, the crossing section 114 may sometimes become empty at the trailing or beading end of the object to be wet-treated. A problem is that, upon introduction of the wet treatment liquid from the introducing path 110 when the next object to be wet-treated arrives, and upon filling the entire crossing section with the treatment liquid, the discharging path side contains air, and the treatment liquid cannot be discharged by the use of a water discharge pump. Therefore, by feeding the wet treatment liquid from the auxiliary introducing path 290, it is possible to fill the discharging path 112 as well with the wet treatment liquid, thereby ensuring a state permitting smooth flow of the treatment liquid. A reduced-pressure pump can eliminate the problem without the necessity of an auxiliary introducing path 290.

In this embodiment, a shutter 295 is provided for opening and closing the opening section 106. When treatment of an object to be wet-treated has been completed and the process is in standby for the treatment of the next object to be wet-treated, continuing feeding the wet treatment liquid with a valve $V_2$ kept open would lead to exhaustion of the wet treatment liquid. When introduction of the wet treatment liquid is discontinued by closing the valve $V_2$ air enters the entire wet treatment liquid feed nozzle including the crossing section 114, and at the start of the next run of wet treatment, the wet treatment liquid entrapping the air would be fed to the object to be wet-treated.

Air is prevented from entering the wet treatment liquid by filling the entire wet treatment liquid feed nozzle including the crossing section 114 with the wet treatment liquid by closing the shutter 295, and closing valves $V_1$, $V_2$ and $V_3$ in this state. When using the wet treatment liquid feed nozzle for the next run, it suffices to open the shutter 295, with the valves $V_1$, $V_2$ and $V_3$ opened, to feed the wet treatment liquid to the object to be wet-treated.

Figure 35:
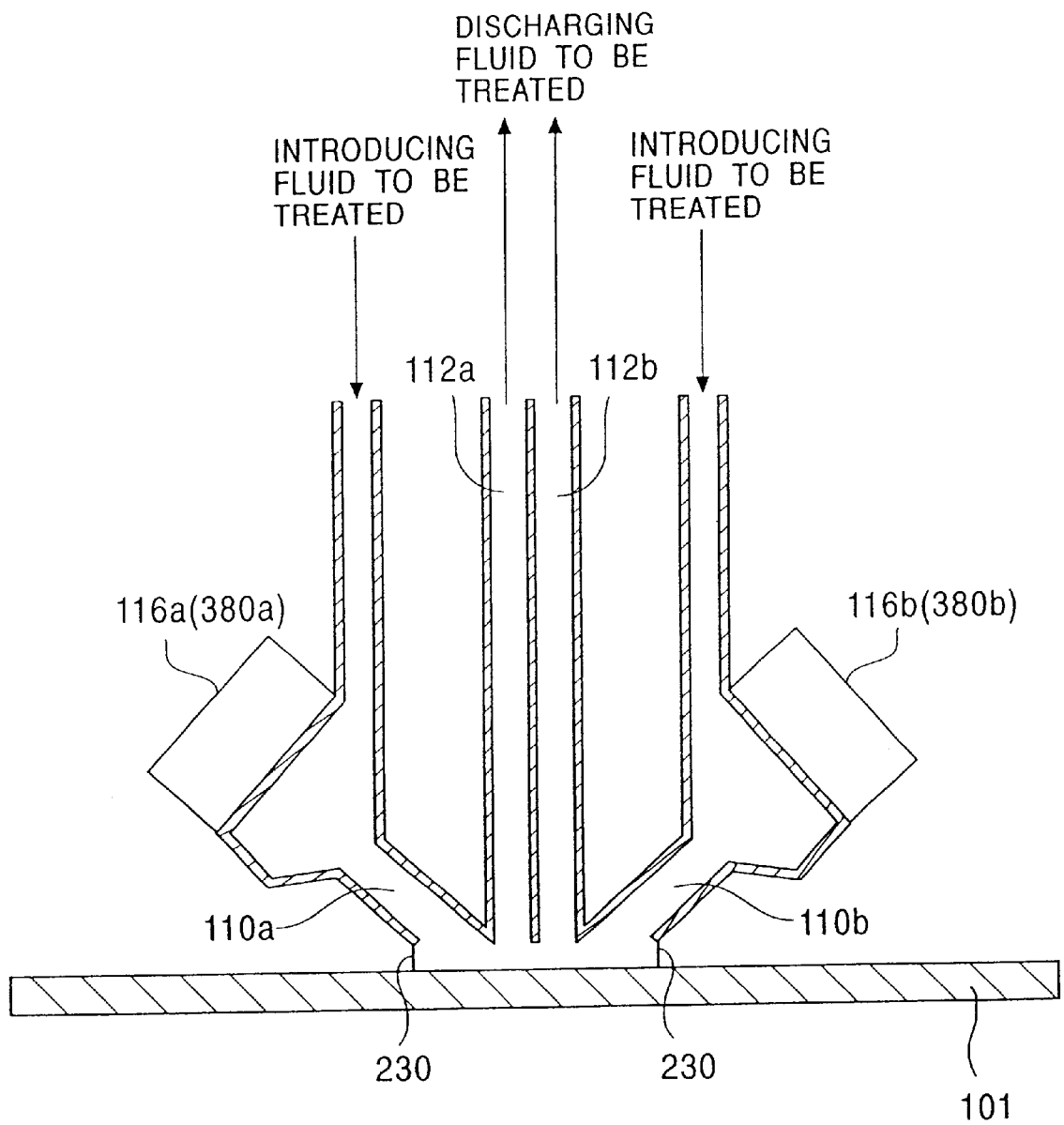
FIG. 35 is a sectional view of a wet treatment liquid feed nozzle of an embodiment of the invention.

FIG. 35 illustrates a variant of the foregoing sixteenth embodiment.

This variant of embodiment has the same basic structure as that shown in FIG. 24: discharging paths 112a and 112b are provided with two opposed introducing paths 110a and 110b in between. The only difference of this case lies in that the distance between the exits of the introducing paths 110a and 110b, on the one hand, and the entries of the discharging paths 112a and 112b is shorter than that shown in FIG. 24. The wet treatment liquid introduced from the introducing paths 110a and 110b is discharged more efficiently into the discharging paths 112a and 112b.

While the discharging paths are arranged with the introducing paths in between in FIG. 35, the introducing paths may be arranged with the discharging paths in between.

In this variant of embodiment, liquid leakage is prevented by providing a film 230.

FIG. 36 illustrates a nineteenth embodiment of the wet treatment liquid feed nozzle of the invention.

In this embodiment, the crossing section is divided by partitions 350a and 350b into three compartments 114a, 114b and 114c.

By dividing the crossing section into a plurality of compartments, and further providing introducing paths 110a, 110b and 110c and discharging paths 112a, 112b and 112c for the compartments 114a, 114b and 114c, respectively, and providing a valve (not shown), it is possible to feed the wet treatment liquid only to limited portions requiring the wet treatment, thereby further reducing the consumption of the wet treatment liquid.

Independent ultrasonic elements 116a, 116b and 116c may be provided in the compartments, respectively, and by appropriately selecting a frequency and a power for each compartment, it is possible to carry out a treatment suitable for each surface portion of the object to be wet-treated.

Figure 37:
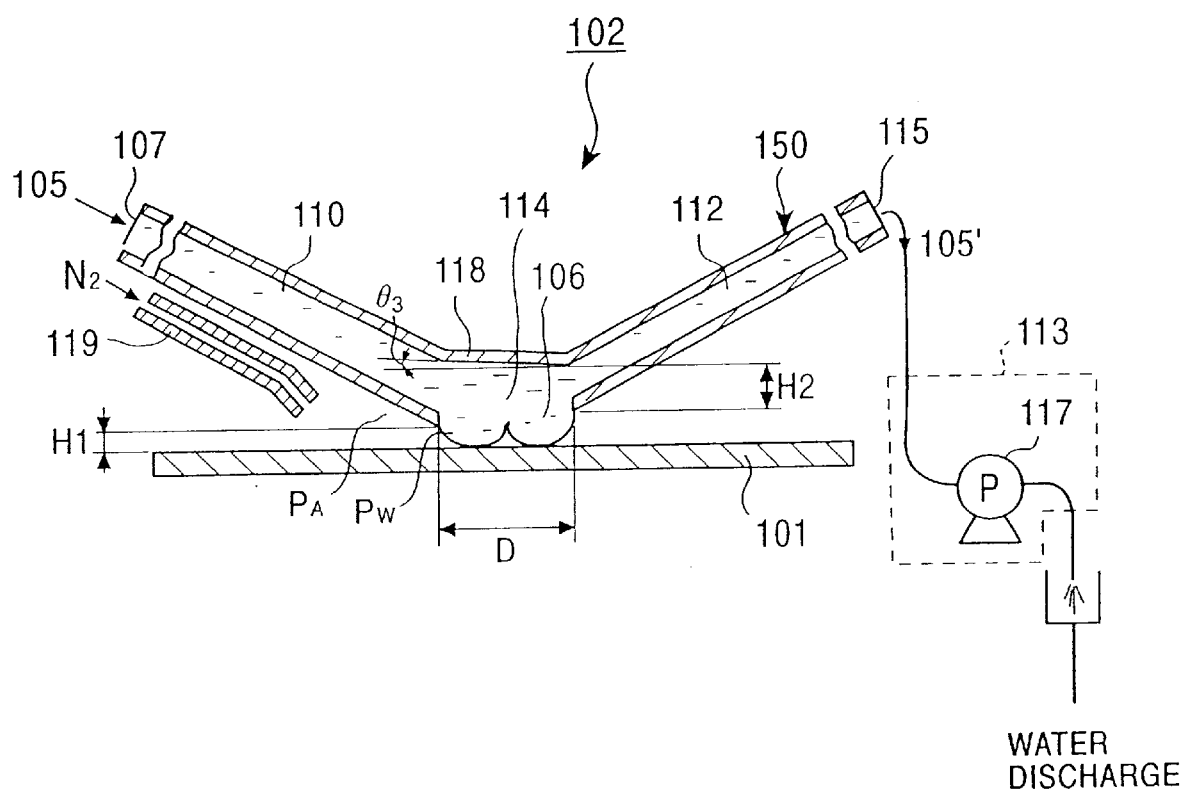
FIG. 37 is a sectional side view of a wet treatment liquid feed nozzle apparatus of a further embodiment of the invention.

FIG. 37 illustrates first embodiment of the wet treatment liquid feed nozzle apparatus of the invention.

The wet treatment liquid feed nozzle apparatus of this embodiment comprises the wet treatment liquid feed nozzle of the invention provided with a pressure controller 113.

The pressure controller 113 is provided at least on the discharging path 112 side so as to take balance between the pressure of the wet treatment liquid in contact with to open air at the opening section 106 (including the surface tension of the wet treatment liquid and the surface tension of the treated surface of the object to be wet-treated)and the atmospheric pressure so that the wet treatment liquid in contact with the object to be wet-treated 101 after a wet treatment flows into the discharging path 112.

In this embodiment, the pressure controller 113 comprises a reduced-pressure pump provided on the discharging port 115 side. More specifically, by controlling the sucking pressure of the reduced-pressure pump, the pressure controller 113 controls the pressure of the wet treatment liquid, and hence the difference between the atmospheric pressure and the pressure of the wet treatment liquid in contact with the object to be wet-treated 101. It is desirable to carry out control, taking account of the flow rate of-the introduced wet treatment liquid and the flow rate of the discharged wet treatment liquid which have an effect on the pressure of the wet treatment liquid. More particularly, it suffices to experimentally determine these values in advance by the use of an actual wet treatment liquid feed nozzle and an actual wet treatment liquid.

That is, a reduced-pressure pump is used for the pressure controller 113 on the discharging path 112 side. Balance is taken between the pressure of the wet treatment liquid in contact with the open air at the opening section 106 (including the surface tension of the wet treatment liquid and the surface tension of the treated surface of the object to be wet-treated) and the atmospheric pressure, by controlling the force of the crossing section 114 sucking the wet treatment liquid by means of the reduced-pressure pump. In other words, by assuming Pw≈Pa to represent the relationship between the pressure Pw of the wet treatment liquid in contact with the open air at the opening section 106 (including the surface tension of the wet treatment liquid and the surface tension of the treated surface of the object to be wet-treated) and the atmospheric pressure Pa, it is fed to the substrate 101 via the opening section 106, and the wet treatment liquid in contact with the substrate 101 almost never leaks to outside the wet treatment liquid feed nozzle, and is discharged into the discharging path 112.

It is desirable to select a shape of the ceiling of the crossing section 114, a shape of the boundary between the introducing path 110 and the crossing section 114 and a shape of the boundary between the crossing section 114 and the discharging path 112 such that a Coanda effect is available to facilitate taking balance of pressure.

By adopting the configuration as described above, it is possible to remove the wet treatment liquid 105 fed from the wet treatment liquid feed nozzle to the object to be wet-treated (substrate) 101, without coming into contact with portions other than the potion to which the wet treatment liquid has been fed (opening section 106), from the object to be set-treated (substrate) 101.

FIG. 38 illustrates a second embodiment of the wet treatment liquid feed nozzle apparatus of the invention.

In this embodiment, means for controlling the difference between the pressure of the wet treatment liquid and the atmospheric pressure comprises a reduced-pressure pump (water discharge pump in this embodiment) 117 provided in the downstream of the discharging path 112, a feed pump 133 provided in the upstream of the introducing path 110, a pressure sensor 131 for detecting the pressure of the wet treatment liquid in contact with the object to be wet-treated 101, and a controller 132 for controlling driving of the reduced-pressure pump 117 and the feed pump 133 by a signal from the pressure sensor 131.

While the embodiment shown in FIG. 37 is effective when the pressure of the wet treatment liquid on the introducing port 107 side is constant, in this embodiment, a more accurate pressure control is achieved and an excellent cleanliness is available because the pressure of the wet treatment liquid is detected on the introducing side as well.

Now, another embodiment of the wet treatment apparatus of the invention will be described.

When composing a wet treatment apparatus by the use of the wet treatment liquid feed nozzle 102 shown in FIGS. 19 and 20, the opening section 106 of the wet treatment liquid feed nozzle 102 is directed toward the substrate 101 as shown in FIG. 11, and means for relatively moving the wet treatment liquid feed nozzle 102 and the substrate 101, such as a roller conveyor-(not shown) of the substrate 101 should preferably be provided.

The apparatus has a wet treatment liquid source and means for feeding the wet treatment liquid from the wet treatment liquid source to the introducing port of the wet treatment liquid feed nozzle. For cases requiring treatment of the object to be wet-treated at a temperature of 70 to 80° C. such as in a stripping process of resist, it is desirable to provide a heating unit, a temperature adjusting unit and a temperature holding unit at appropriate positions.

In FIG. 11, wet treatment liquid feed nozzles 102aF and 102aB make a pair with the object to be wet-treated 101 in between to simultaneously wet-treat the surface and the back of the object to be wet-treated.

In addition, three rows comprising wet treatment liquid feed nozzles (102aF and 102aB) for electrolytic ion washing (and embodiment of wet treatment), wet treatment liquid feed nozzles (102bF and 102bB) for extra-pure water rinsing (wet treatment), and, for example, wet treatment liquid feed nozzles (102cF and 102cB) for IPA (isopropyl alcohol) drying are arranged sequentially in the travelling direction of the object to be wet-treated 101. Illustration of the opening section, details of the surrounding portions thereof and the pressure controller are omitted here.

The both ends of the pair of wet treatment liquid feed nozzles 102aF and 102aB are brought into contact with each other to form a tunnel-shaped space, through which the object to be wet-treated 101 travels. Even when the wet treatment liquid flows from the end face side (a plane perpendicular to the sheet in the drawing) of the object to be wet-treated 101, therefore, the flowing wet treatment liquid can be received in the lower wet treatment liquid feed nozzle 102aB.

Because the washing efficiency is high on the back (lower surface), ultrasonic elements (16a and 16b) are provided only on the surface (upper surface). When a single kind of wet treatment liquid is used for all cases, pressure control may be conducted with a single pressure controller.

FIG. 12 illustrates an embodiment in which the object to be wet-treated is move up and down: FIG. 12A is a sectional side view, and FIG. 12B is a plan view.

FIGS. 13A, 13B and 13C are sectional view as viewed from above, in which the object to be wet-treated 101 is place upright. The wed treatment liquid feed nozzle 102 is arranged in the longitudinal direction at right angles to the travelling direction of the object to be wet-treated 101 in the longitudinal direction of the wet treatment liquid feed nozzle 102, and the object to be wet-treated 101 is horizontally transferred. In this case the object to be wet-treated has no up-down relationship. Since the washing efficiency is the same for both the surface and the back, the ultrasonic element 16 may be provided on the back (FIG. 13C), on the surface (FIG. 13B), or on the back and the surface (FIG. 13A).

FIG. 14 is sectional side view, in which the object to be wet-treated is place upright, and vertically transferred upward.

As in the case shown in FIG. 13, in the embodiment shown in FIG. 14, the object to be wet-treated has no up-down relationship and the washing efficiency is the same for both the surface and the back. The ultrasonic element 16 may therefore be provided on the back (FIG. 14C), on the surface (FIG. 14B) or on the back and the surface (FIG. 14A).

FIG. 15 is a sectional side view as viewed from a side: the back is the lower surface and the surface is the upper surface. FIG. 15 represents a case where the object to be wet-treated 101 is horizontally placed and transferred in the horizontal direction. As to the ultrasonic element 16, FIG. 15B is generally employed since washing of the back can be accomplished at a high washing efficiency.

For the washing step, the wet treatment liquid may be extra-pure water, electrolytic ion water, ozone water, hydrogen water or other washing liquid, and for the other wet treatment steps, an etching solution, a developing solution or a stripping liquid is suitably applicable.

EXAMPLE 3

A 500 mm×400 mm rectangular glass substrate was provided.

The substrate surface was stained b immersing the glass substrate into pure water containing $Al_2O_3$ particles. The number of particles on the entire surface of the substrate after staining was measured, giving a result of 41,500 particles. Only particles having a size of at least 0.5 µm were measured.

After the aforesaid staining, washing was carried out by the transverse displacement method as shown in FIG. 11, by the use of the wet treatment liquid feed nozzle shown in FIG. 19, 20A and 20B. In this example, the back of the substrate was not washed.

Conditions for the wet treatment liquid feed nozzle were as follows:
Conditions for wet treatment liquid feed nozzle:
  Nozzle length: 500 mm
  Angle $\theta_1$ of introducing path: 45°
  Angle $\theta_2$ of discharging path: 45°
  Distance from substrate: 1 mm
  Opening section: Diameter 106L in FIG. 20A: 8 mm
    Diameter 106M in FIG. 20A: 4 mm
    Diameter 106S in FIG. 20A: 2 mm
  Washing conditions were as follows:
Washing conditions:
  Washing liquid: Electrolytic cathode ion water (pH: 10)
  Washing liquid consumption: 2.5 L/min
  Ultrasonic frequency: 1 MHz
  Ultrasonic power: 150 W
  Substrate feed speed: 20 mm/sec Net washing Time=Opening dia/feed speed=(4 mm)/(20 mm/sec)=20 sec
  Number of washing runs: One
  After washing, there were observed 156 particles.

Comparative Example 3

A 500 mm×400 mm rectangular glass substrate was prepared as in the Example 3.

The substrate surface was stained by immersing the glass substrate into pure water containing $Al_2O_3$ particles. The number of particles on the entire surface of the substrate after staining was measured, giving a result of 41,000 particles. Only particles having a size of at least 0.5 µm were measured.

Figure 52B:
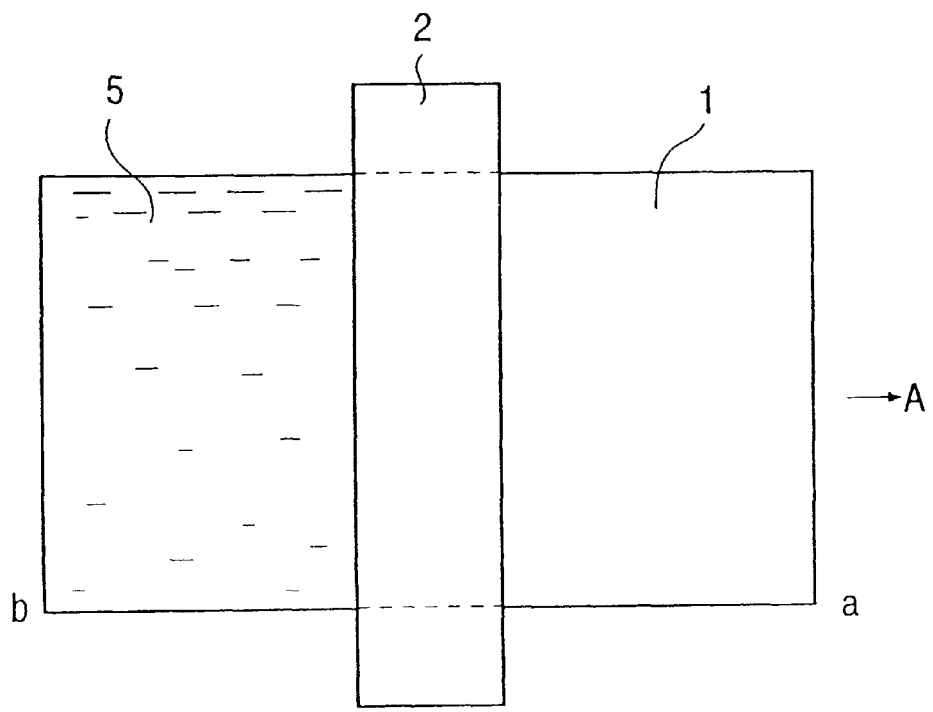
Figure 53:
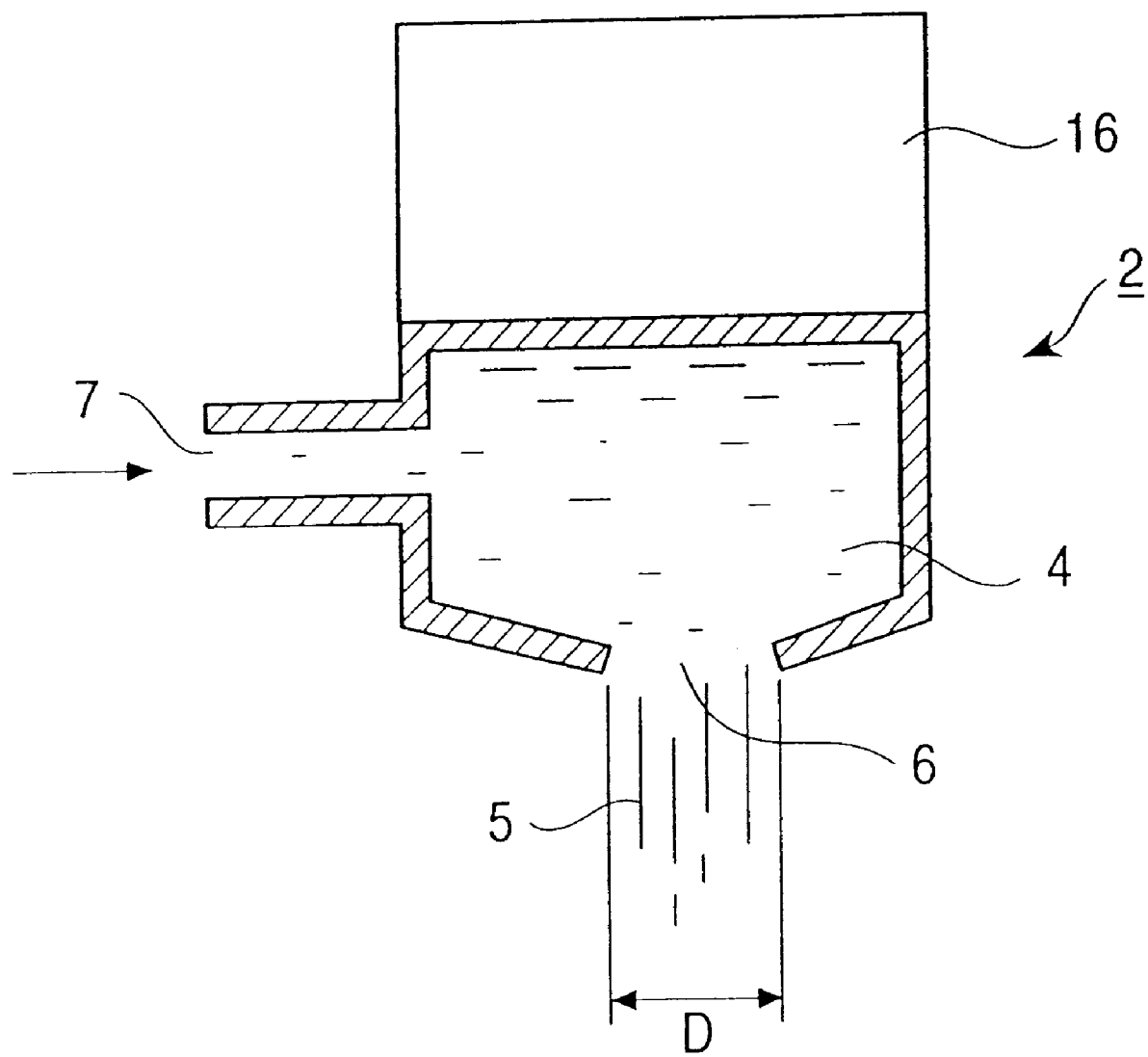
FIG. 53 is an enlarged view of a wet treatment liquid feed nozzle shown in FIG. 52.

After the aforesaid staining, washing was carried out by the transverse displacement method as shown in FIG. 52B, by the use of the wet treatment liquid feed nozzle shown in FIG. 52A.

Conditions for the wet treatment liquid feed nozzle were as follows:
Conditions for wet treatment liquid feed nozzle:
  Nozzle length: 500 mm
  Opening section width: 2 mm
  Washing conditions were as follows:
Washing conditions:
  Washing liquid: Electrolytic cathode ion water (pH: 10)
  Washing liquid consumption: 25 L/min
  Ultrasonic frequency: 1 MHz
  Ultrasonic power: 900 W
  Washing time: 20 sec
  Number of washing runs: One
  After washing, there were observed 640 particles.

Figure 39A:
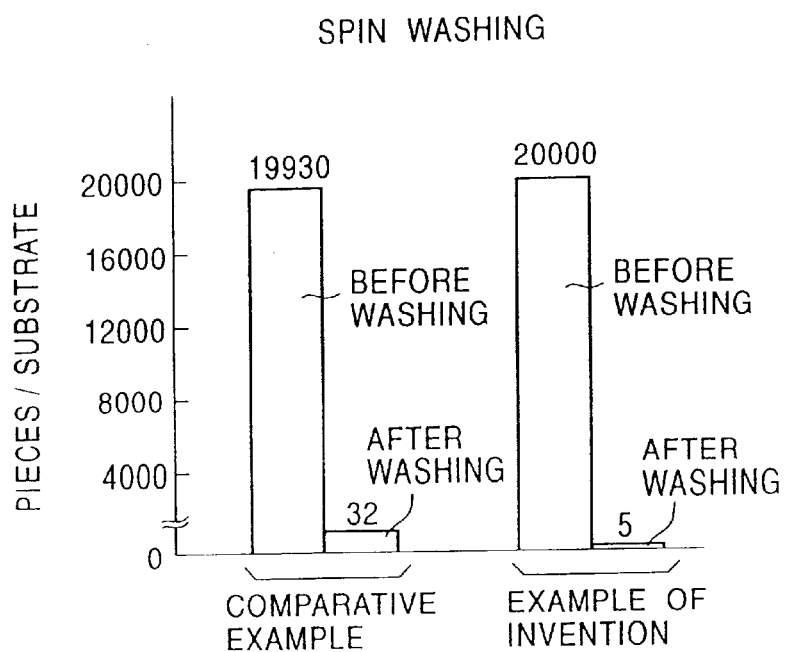
FIG. 39A is a graph illustrating results of an example of rotary washing, and FIG. 39B, of transfer washing.
Figure 39B:
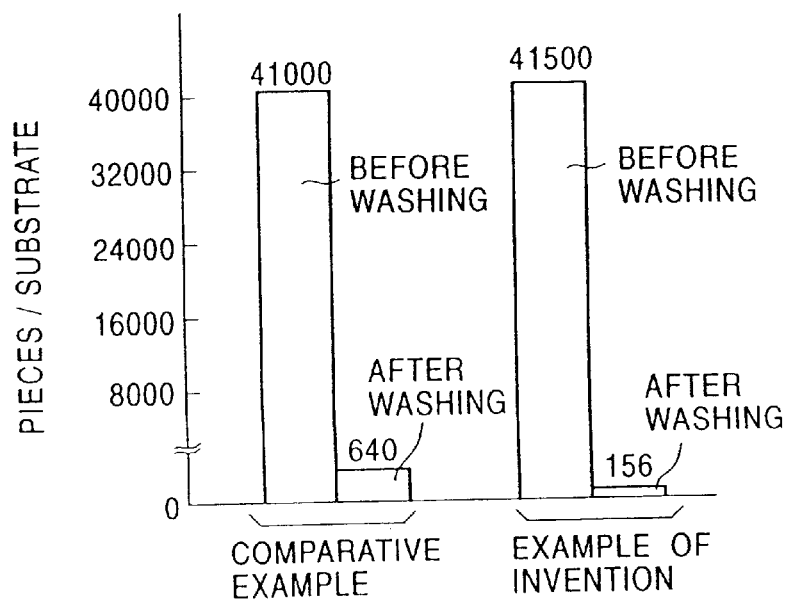

The results of the Comparative Example 3 and Example 3 are shown in FIG. 39B. As in clear from comparison of the both, the Example 3 gave a washing liquid consumption of a tenth that in the conventional art, and achieved a cleanliness about four times as high. The ultrasonic power was 1/6.

EXAMPLE 4

Spin washing was carried out in this Example.

A six-inch circular glass substrate was provided.

The substrate surface was stained by immersing the glass substrate into pure water containing $Al_2O_3$ particles. The number of particles on the entire surface of the substrate after staining was measured, giving a result of 20,000 particles. Only particles having a size of at least 0.5 µm were measured.

After the aforesaid staining, washing was carried out by the rotating displacement method by the use of the wet treatment liquid feed nozzle shown in FIG. 19.

Conditions for the wet treatment liquid feed nozzle were as follows:
Conditions for wet treatment liquid feed nozzle:
  Nozzle length: 152 mm
  Angle $\theta_1$ of introducing path: 30°
  Angle $\theta_2$ of discharging path: 30°
  Distance between substrate and opening section: 1 mm
  Opening section width: 20 mm
  Diameter 106L in FIG. 20A: 8 mm
  Diameter 106M in FIG. 20A: 4 mm
  Diameter 106S in FIG. 20A: 2 mm Washing conditions were as follows:
Washing conditions:
 Washing liquid: Electrolytic ion water
 Washing liquid consumption: 1 L/min
 Ultrasonic frequency: 1 MHz
 Ultrasonic power: 60 W
 Washing time: 10 sec
 Revolutions: 300 rpm
 After washing, there were observed five particles.

Comparative Example 4

A six-inch circular glass substrate was provided as in the Example 4.

The substrate surface was stained by immersing the glass substrate into pure water containing $Al_2O_3$ particles. The number of particles on the entire surface of the substrate after staining was measured, giving a result of 19,930 particles. Only particles having a size of at least 0.5 µm were measured.

After the aforesaid staining, spin washing was carried out by the use of the wet treatment liquid feed nozzle shown in FIG. 52A.

Conditions for the wet treatment liquid feed nozzle were as follows:
Conditions for wet treatment liquid feed nozzle:
 Nozzle length: 152 mm
 Opening section: 2 mm
 Washing conditions were as follows:
Washing conditions:
 Washing liquid: Electrolytic cathode ion water
 Washing liquid consumption: 10 L/min
 Ultrasonic frequency: 1 MHz
 Ultrasonic power: 300 W
 Washing time: 10 sec
 Revolutions: 300 rpm
 After washing, there were observed 32 particles.

The results of the Comparative Example 4 and the Example 4 are shown in FIG. 39A. As in clear comparison of the Comparative Example 4 and the Example 4, even in rotating washing, the Example 4 gave a washing liquid consumption of a tenth that in the conventional art, an ultrasonic power of a fifth, and a cleanliness about six times as high.

Figure 40:
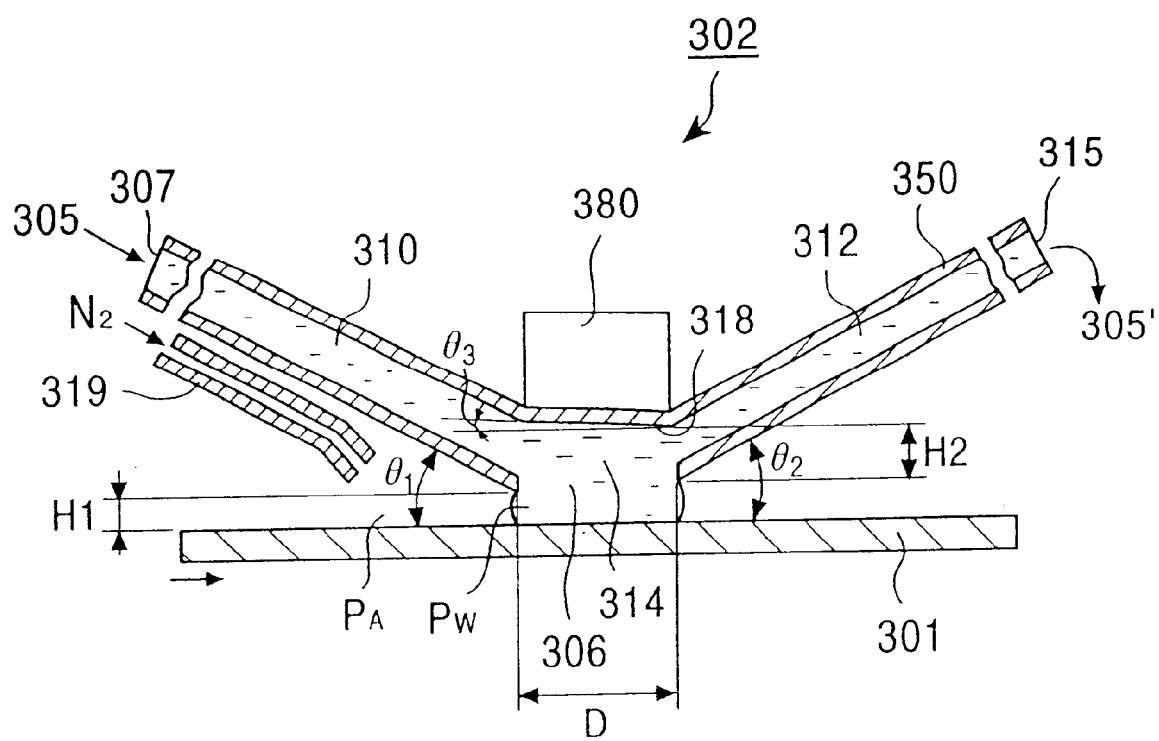
FIG. 40 is a sectional side view of a fluid treatment apparatus of an embodiment of the invention.

Now, a first embodiment of the fluid treatment apparatus of the invention is illustrated in FIGS. 40 and 41.

Figure 41A:
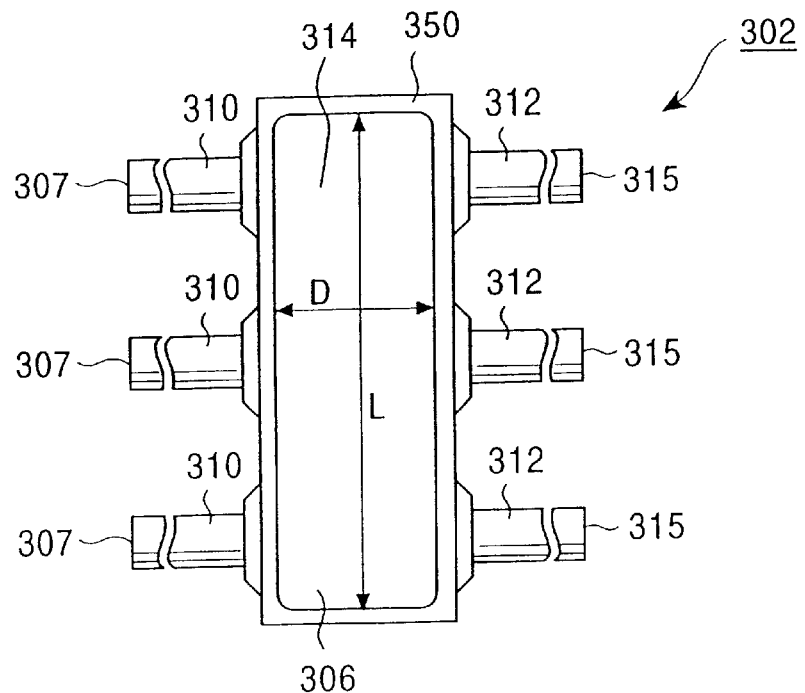
FIG. 41A is a bottom view of the embodiment shown in FIG. 40.
Figure 41B:
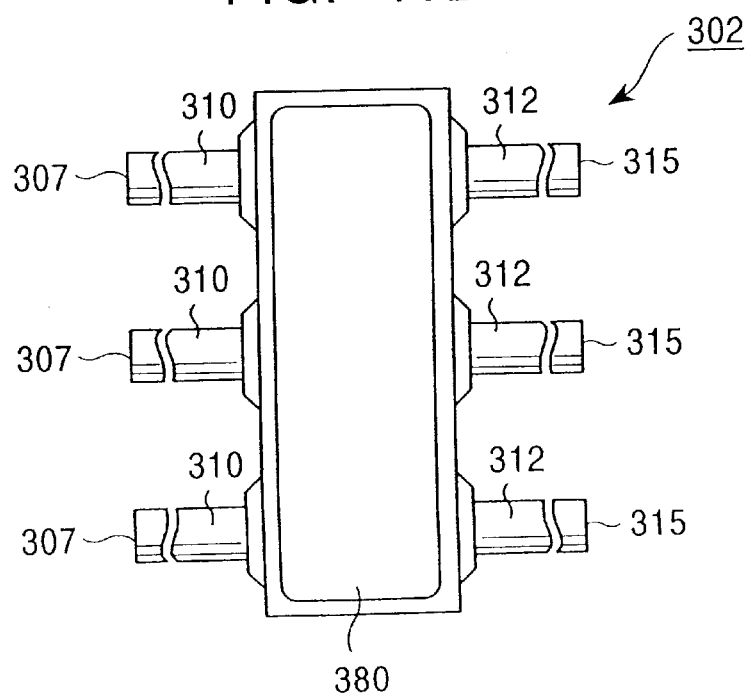
FIG. 41B is a plan view of the embodiment shown in FIG. 40.

FIG. 40 is a sectional side view of the fluid treatment apparatus. FIG. 41(A) is a bottom view, and FIG. 41B is a plan view.

In FIG. 40, 302 is the fluid treatment apparatus. The fluid treatment apparatus 302 comprises a fluid feed nozzle body 350 and light irradiating means 380.

The nozzle body 350 has a fluid treatment path 314 which brings a treatment fluid from an opening 306 into contact with an object to be treated 301 and then brings the treatment fluid back to the opening 306, an introducing path 310 which introduces the treatment fluid into the fluid treatment path 314, and a discharging path 312 which discharges the treatment fluid brought from the fluid treatment path 314 back to the opening 306.

Outside the nozzle body 350, there is provided light irradiating means 380 for irradiating a light onto the object to be treated.

The used treatment fluid 305' fed from the fluid treatment apparatus 302 to the object to be treated (substrate) 301 is removed from the object to be treated (substrate) 301 without coming into contact with portions other than the portion (opening 306) to which the treatment fluid has been fed. It is therefore possible to irradiate the light onto the treatment fluid free from impurities, thus improving the irradiation efficiency.

The shape of the ceiling 318 near the opening of the nozzle body 350 should preferably be a shape giving a Coanda effect which enables to easily take balance in pressure and permits easy removal of bubbles having entered into, or produced in, the fluid treatment path 314.

As is known from FIG. 41, three parallel introducing paths 310 a re provided in this embodiment.

Three parallel discharging paths 312 are provided, respectively, to correspond to the three introducing paths 310. It is thus possible to achieve a uniform washing efficiency in the longitudinal direction by providing a plurality of introducing and discharging paths in the longitudinal direction (up-down direction In FIG. 41) of the fluid treatment apparatus 302.

The nozzle body 350 is made of a material permitting light transmission.

The angle $\theta_1$ between the introducing path 310 and the substrate 301 can be appropriately selected within a range of from 0 to 90°.

The angle $\theta_2$ between the discharging path 312 and the substrate 301 can be appropriately selected within a range of from 0 to 90°.

The angle $\theta_1$ between the introducing path 310 and the substrate 301 and the angle $\theta_2$ between the discharging path 312 and the substrate 301 are arbitrarily set in view of the contact efficiency of the treatment fluid with the substrate, the discharge efficiency of the treated object, the shape of the fluid treating path, the shape of the opening, and the area thereof.

The distance H2 between the portion of the ceiling the closest to the object to be treated (substrate) 301, facing the object to be treated (substrate), forming the fluid treating path 314, on the one hand, and the portion of the opening 306 the closest to the object to be treated (substrate), on the other hand, should preferably be within a range of from 1 to 50 mm, or more preferably, from 2 to 20 mm. A distance H2 of under 1 mm makes it difficult for the treatment fluid to flow, leading to a lower contact efficiency of the treatment liquid with the substrate and a lower discharge efficiency of the treated object. A distance H2 of over this range results, on the other hand, in the presence of much treatment fluid in the fluid treatment apparatus 302, leading to a larger weight of the fluid treatment apparatus 302, and troubles occur in displacement of the fluid treatment apparatus 302.

H1 (distance between the object to be treated 301 and the opening) should preferably be within a range of from 0.1 to 5 mm, or more preferably, from 1 to 2 mm.

The value of H1 may sometimes vary because of vibration of the transfer machine or an uneven surface of the substrate. It is therefore desirable to provide a sensor for measuring H1 and means for separating or bringing closer the fluid treatment apparatus 302 from or to the object to be treated in response to a signal from the sensor. At least two such length measuring units should preferably be provided at two positions with the nozzle body 350 in between in FIG. 41A. This is with a view to ensuring accurate control of the flow of the treatment fluid while keeping a constant distance between the object to be treated 301 and the opening 306 for the entire fluid treatment apparatus. The length measuring accuracy should preferably be smaller than 0.1 mm. Because the lower limit of the distance between the fluid treatment apparatus and the object to be treated should preferably be 0.1 mm, and this distance should accurately be controlled.

In FIG. 40, 319 is a contact preventing gas ejecting section. The contact preventing gas ejecting section is provided at least in any of the introducing path 310 and the discharging path so that the opening section 306 does not come into contact with the object to be treated 301 upon lifting up the object to be treated 301, because of unbalance between the pressure Pw of the treatment fluid in contact with the open air at the opening 306 and the atmospheric pressure PA. The gas used for this purpose should preferably be nitrogen gas or an inert gas, or may be air free from impurities (particularly water).

Figure 42:
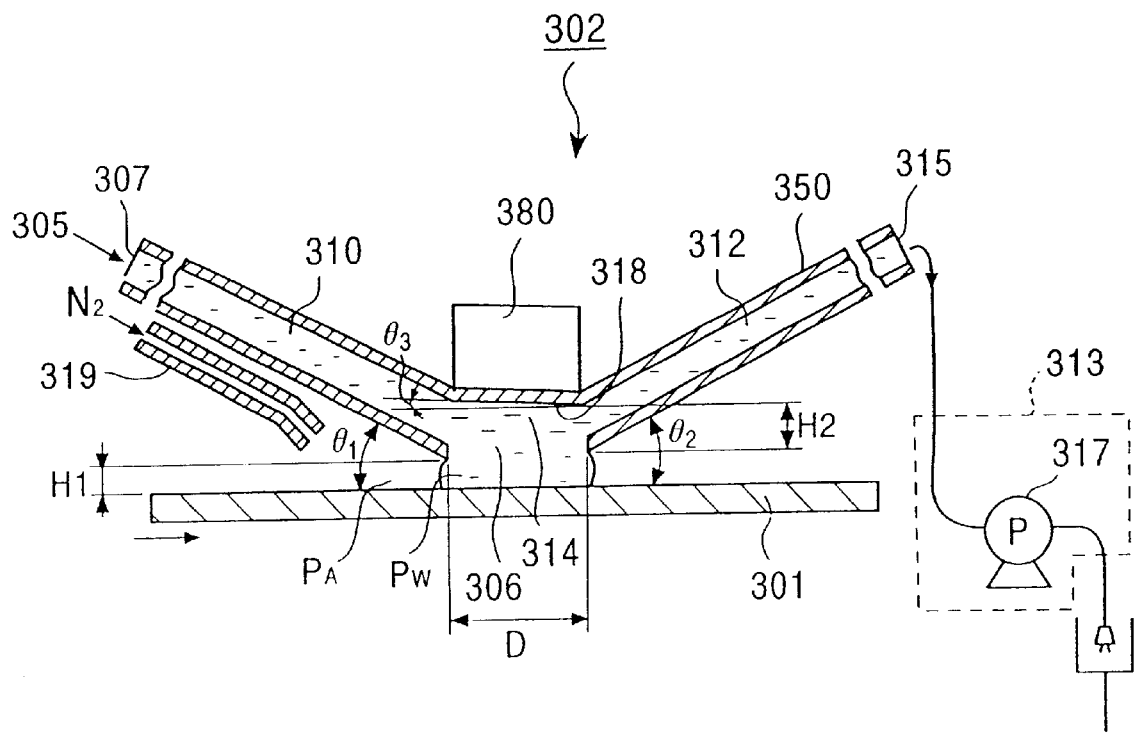
FIG. 42 is a conceptual view of a fluid treatment apparatus of another embodiment of the invention.

A second embodiment of the fluid treatment apparatus of the invention is illustrated in FIG. 42.

In FIG. 42, 302 is the fluid treatment apparatus. The fluid treatment apparatus 302 comprises a nozzle body 350 having light irradiating means 380 and a pressure controlling means 313.

The nozzle body 350 has a fluid treating path 314 which, after bringing the treatment fluid from the opening 306 into contact with the object to be treated 301, brings the treatment fluid back to the opening 306, an introducing path 310 for introducing the treatment fluid to the fluid treating path 314, a discharging path 312 for discharging the treatment fluid brought back to the opening 306 from the fluid treating path 314, and light irradiating means 380 for irradiating a light onto the treatment fluid.

In this embodiment the pressure control means 313 is provided on the discharging path 312 side so as to take balance between the pressure of the treatment fluid in contact with the open air at opening 306 (including the surface tension of the treatment fluid and the surface tension of the treated surface of the object to be treated) and the atmospheric pressure to ensure flow of the treatment fluid having been in contact with the object to be treated 301 into the discharging path 312 after the fluid treatment.

In this embodiment, the pressure control means 313 comprises a reduced-pressure pump 317 provided on the discharging port 315 side. That is, the pressure of the treatment fluid, and hence, the pressure difference between the atmospheric pressure and the pressure of the treatment fluid in contact with the object to be treated 301, by controlling the sucking pressure of the reduced-pressure pump 317.

More specifically, by the use of the reduced-pressure pump 317 in the pressure control means 313 on the discharging path 312 side, the force of the fluid treating path 314 to suck the treatment fluid is controlled by the reduced-pressure pump 317, thereby taking balance between the pressure of the treatment fluid in contact with the open air at the opening 306 (including the surface tension of the treatment fluid and the surface tension of the treated surface of the object to be treated) and the atmospheric pressure. That is, by assuming that the relationship between the pressure Pw of the treatment fluid in contact with the open air at the opening 306 (including the surface tension of the treatment fluid and the surface tension of the treated surface of the object to be treated) and the atmospheric pressure Pa is Pw≈Pa the treatment fluid fed to the substrate 301 via the opening 306 and in contact with the substrate 301 is discharged into the discharging path 312 without lacking to outside the fluid treatment apparatus 302.

In this embodiment also, the ceiling of the fluid treating path 314 should preferably have a shape producing Coanda effect, which makes it easier to take balance in pressure, and permits easy removal of bubbles entering the fluid treating path 314 or produced bubbles.

The other points are the same as in the foregoing first embodiment.

Now, a third embodiment of the fluid treatment apparatus of the invention will be described below with reference to FIG. 3.

This embodiment permits control, with a simpler system, the balance between the pressure of the treatment fluid in contact with the object to be treated 301 and the atmospheric pressure by the use of light irradiating means 380. This is effective particularly in the case where the treatment fluid is a liquid.

The pressure control means on the discharging path 312 side controls the balance between the pressure of the treatment fluid in contract with the open air at the opening 306 (including t he surface tension of the treatment fluid and the surface tension of the treated surface of the object to be treated) and the atmospheric pressure by controlling, by means of the difference in height, the force of the fluid treating path 314 to suck the treatment fluid brought about by the weight of the treatment fluid itself based on the syphon principle produced by the difference in height between the opening 306 and the discharging path 312 end (end open to the open air).

More specifically, a water discharging unit 327 is connected to the discharging port 315 of the nozzle body 350 via a water discharge piping 325, and the water discharging unit 327 is held by a holder 328. The holder 328 is attached to, for example a strut slidably vertically in the drawing.

A valve 330 is attached to the leading end of the water discharging unit 327. The valve 330 is opened and closed by a valve drive 329.

On the other hand, this embodiment has a controller 322 which drives a robot and the valve drive 329 on the basis of a signal from the pressure sensor 324 for detecting the pressure of the treatment fluid in the introducing path 310. The robot is for moving up and down the holder 328. When the valve 330 is open, the pressure of the treatment fluid in contact with the object to be treated can be controlled through vertical displacement of the water discharging unit 327.

Figure 43:
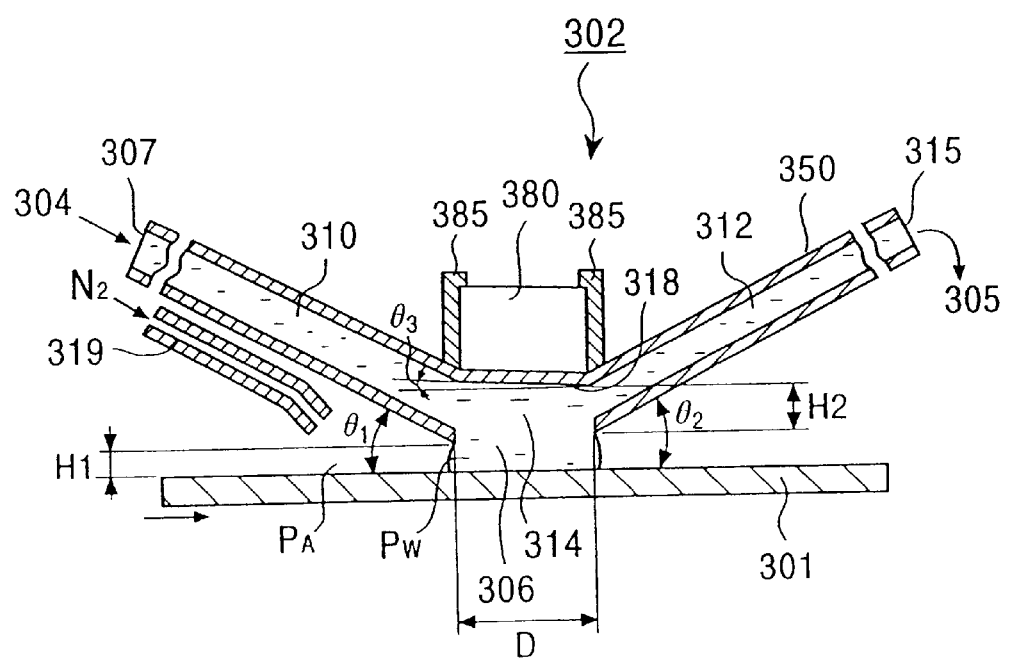
FIG. 43 is a sectional side view of a fluid treatment apparatus of a further embodiment of the invention.

A fourth embodiment of the fluid treatment apparatus of the invention is illustrated in FIG. 43. The same components in FIG. 43 as those in FIG. 40 are assigned the same reference numerals, and description thereof is omitted here.

More particularly, the fluid treatment apparatus is provided with a nozzle body 350, light irradiating means 380 and a attachment guide 385 for detachably attaching the light irradiating means 380.

The light irradiating means 380 can be attached or detached by causing the same along the attachment guide 385 vertically in the drawing.

When carrying out chemicals washing after detaching the light irradiating means 380, for example, an ultrasonic element 316 can be attached to the same position by detaching the light irradiating means.

When attaching the ultrasonic element 316, it should preferably be an ultrasonic element giving an output of an ultrasonic wave of a frequency of at least 19 kHz, or more preferably, a megasonic ultrasonic element of a frequency within a range of from 0.2 to 5 MHz.

The angle $\theta_3$ between the ultrasonic element 316 and the substrate 301 can be appropriately selected within a range of from 0 to 90°, or preferably, from 2 to 45°.

Use of a megasonic ultrasonic element gives a remarkable improving effect of cleanliness.

FIG. 43 illustrates a case where single light irradiating means 380 or a single ultrasonic element 316 is provided.

Figure 44:
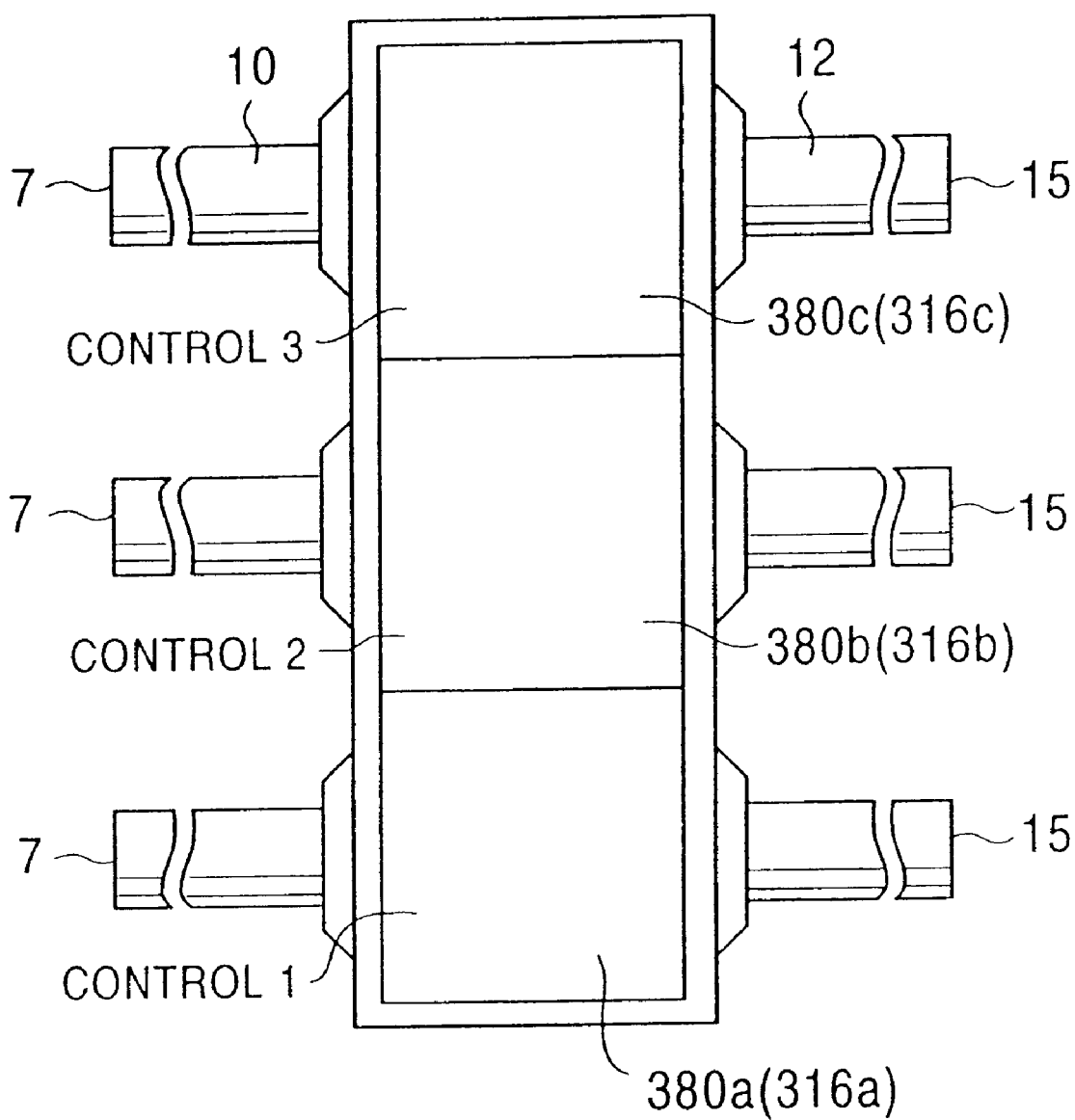
FIG. 44 is a plan view of a fluid treatment apparatus of a further embodiment of the invention.

FIG. 44 shows a case where a plurality of light irradiating means 380 or ultrasonic elements 316 are provided. In the example shown in FIG. 44, three light irradiating means 380a, 380b and 380c are arranged longitudinally (in the up-down direction in FIG. 44). Provision of a plurality of light irradiating means as described above permits uniform washing because the light wavelength or the output can appropriately be changed. Similarly, three ultrasonic elements 316a, 316b and 316c may also be arranged longitudinally.

A plurality of light irradiating means 380 or ultrasonic elements may be arranged either longitudinally or in the transverse direction. They may also be arranged both in the longitudinal direction and in the transverse direction.

Single light irradiating means 380 and a plurality of ultrasonic elements 316 may be mixed and may be simultaneously attached.

Figure 45:
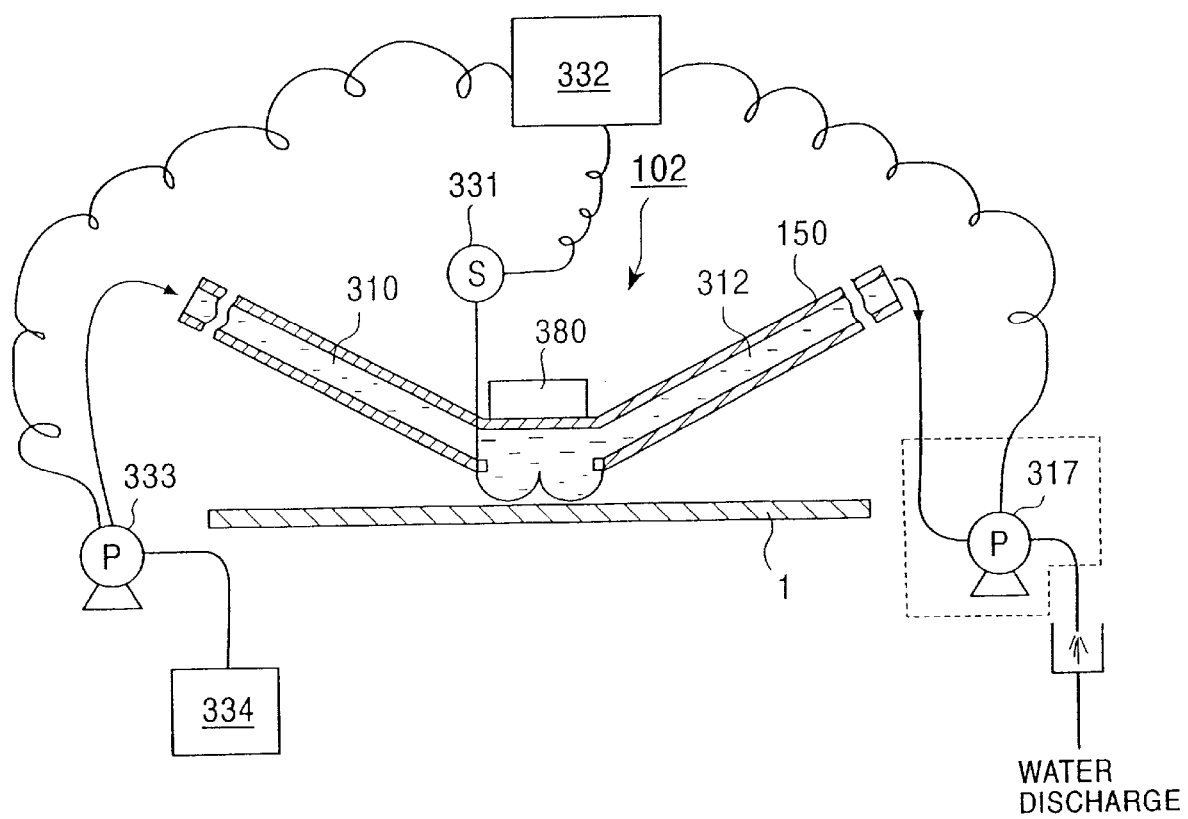
FIG. 45 is a sectional side view of a washing treatment apparatus of a further embodiment of the invention.

Now, a fifth embodiment of the fluid treatment apparatus of the invention will be described below with reference to FIG. 45. The fifth embodiment has the same configuration as in the foregoing case shown in FIG. 38, and by using light irradiating means 380 in place of the ultrasonic element 316, there are simultaneously available the advantage presented in the twenty-fifth embodiment in addition to the advantage brought about by light irradiation.

In this embodiment, means for controlling the difference between the pressure of the treatment fluid and the atmospheric pressure comprises a reduced-pressure pump (a water discharge pump in this example) 317 provided in the downstream of the discharging path 312, and a feed pump 333 provided in the upstream of the introducing path 310. It may further comprise a pressure sensor 331 for detecting the pressure of the treatment fluid in contact with the object to be treated 1, and a controller 332 for controlling drive of the reduced-pressure pump 317 and the feed pump 317 in accordance with a signal from the pressure sensor 331.

While the embodiment shown in FIG. 42 is effective when the pressure of the treatment fluid is constant on the introducing port 307 side, the present embodiment, in which the pressure of the treatment fluid on the introducing side is detected, permits achievement of accurate pressure control, giving an excellent cleanliness.

Now, a sixth embodiment of the fluid treatment apparatus of the invention will be described below with reference to FIG. 8. The sixth embodiment has the same configuration as in the foregoing case shown in FIG. 8. Advantages of light irradiation are available by using light irradiating means 380a, 380b and 380c in place of the ultrasonic elements 16a, 16b and 16c. In FIG. 8 the light irradiating means 380a, 380b and 380c are provided on the stepped ceiling portions 40a, 40b and 40c, respectively, including toward the right down, facing the treated surface of the object to be treated 301.

Since, in this embodiment, light irradiating means 380a, 380b and 380c are provided on the right down portions of the ceiling in the same apparatus, the gaps from the object to be treated are substantially uniform, thereby permitting uniform irradiation.

The light irradiating means 380a, 380b and 380c may be composed of light different in output and wavelength.

It suffices to provide at least one light irradiating means, together with ultrasonic elements.

Now, a seventh embodiment of the fluid treatment apparatus of the invention will be described below with reference to FIG. 9. This embodiment has the same configuration as the foregoing embodiment shown in FIG. 9 except that light irradiating means 380 is employed in place of the ultrasonic element 16.

In the fluid treatment apparatus of this embodiment, the output and the wavelength of the light irradiated from the two light irradiating means 380 may be the same or different. The two light irradiating means may irradiate the light either in pulsation alternately at certain time intervals or simultaneously.

An eighth embodiment of the fluid treatment apparatus of the invention will be described below with reference to FIG. 10. This embodiment has the same configuration as in the embodiment shown in FIG. 10 except that light irradiating means 380 is used in place of the ultrasonic element 16.

A ninth embodiment of the fluid treatment apparatus of the invention will be described below with reference to FIG. 16. This embodiment has the same configuration as in the embodiment shown in FIG. 16 except that light irradiating means 380a and 380b are used in place of the ultrasonic elements 16a and 16b.

A tenth embodiment will be described with reference to FIG. 17. The tenth embodiment has the same configuration as that of the foregoing embodiment shown in FIG. 17, except that light irradiating means 380 is used in place of the ultrasonic element 3.

Another embodiment of the invention will be described with reference to FIGS. 21 and 22. This embodiment has the same configuration as that of the foregoing embodiment shown in FIGS. 21 and 22, except that light irradiating means 380 is employed in place of the ultrasonic element 116. The present embodiment is suitably applicable when he treatment fluid is a liquid.

An eleventh embodiment of the fluid treatment apparatus of the invention will be described with reference to FIG. 24. The eleventh embodiment has the same configuration as that of the foregoing embodiment shown in FIG. 24, except that light irradiating means 380 is used in place of the ultrasonic element 116.

The output and the wavelength of irradiation from the two light irradiating means may be the same or different. The two irradiating means may be operated for irradiation in pulsation alternately at certain time intervals or simultaneously.

A twelfth embodiment of the fluid treatment apparatus of the invention will be described with reference to FIG. 25. The twelfth embodiment has the same configuration as that of the foregoing embodiment shown in FIG. 25, except that light irradiating means is used in place of the ultrasonic element 116.

The output and the wavelength of irradiation from the two light irradiating means may be the same or different. The two irradiating means may be operated for irradiation in pulsation alternately at certain time intervals or simultaneously.

Figure 28A:
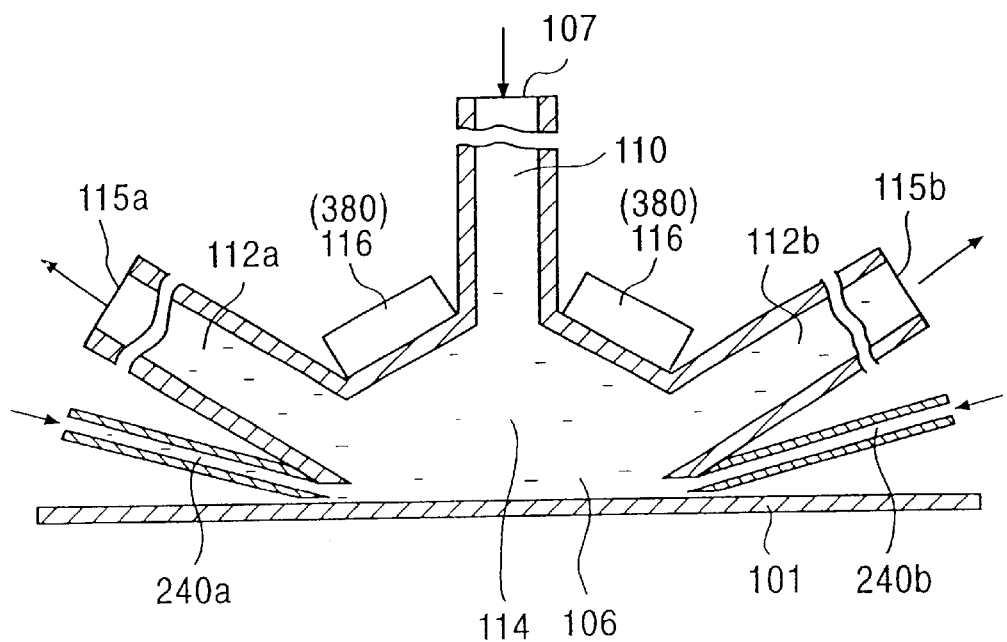
FIG. 28A is a sectional side view and FIG. 28B is a plan view, respectively, of a further embodiment of the invention.
Figure 28B:
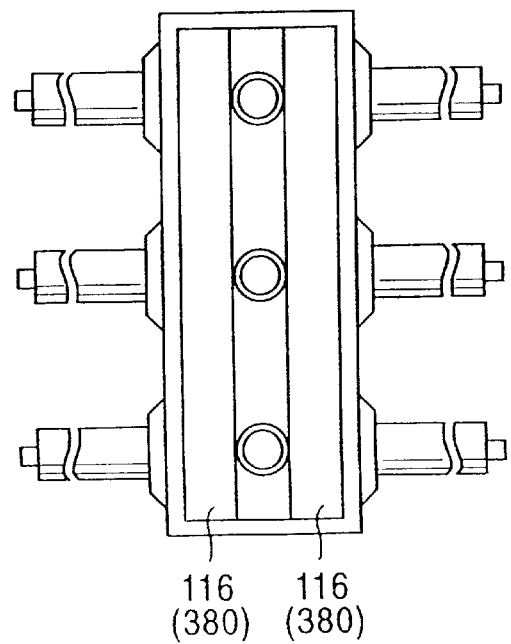

A thirteenth embodiment of the fluid treatment apparatus of the invention will be described with reference to FIG. 28. The thirteenth embodiment has the same configuration as that of the foregoing embodiment shown in FIGS. 28A and 28B, except that light irradiating means 380 is employed in place of the ultrasonic element 116, and entanglement of the air is prevented by providing an auxiliary path.

A fourteenth embodiment of the fluid treatment apparatus of the invention will be described with reference to FIGS. 29A and 29B. The fourteenth embodiment has the same configuration as that of the foregoing embodiment shown in FIGS. 29A and 29B, except that light irradiating means 380 is employed in place of the ultrasonic element 116.

Figure 30A:
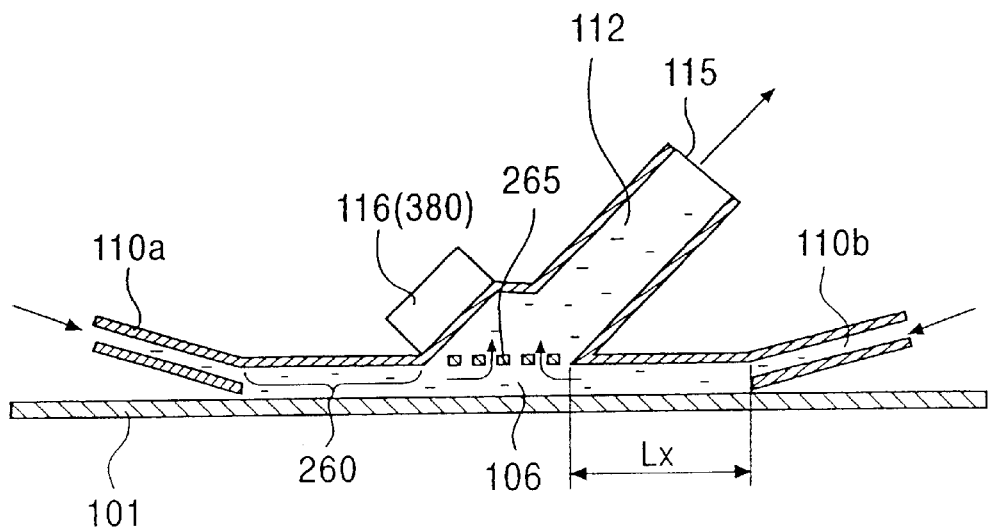
FIG. 30A is a sectional side view and FIG. 30B is a plan view in which the mesh 265 is omitted, respectively, of a further embodiment of the invention.
Figure 30B:
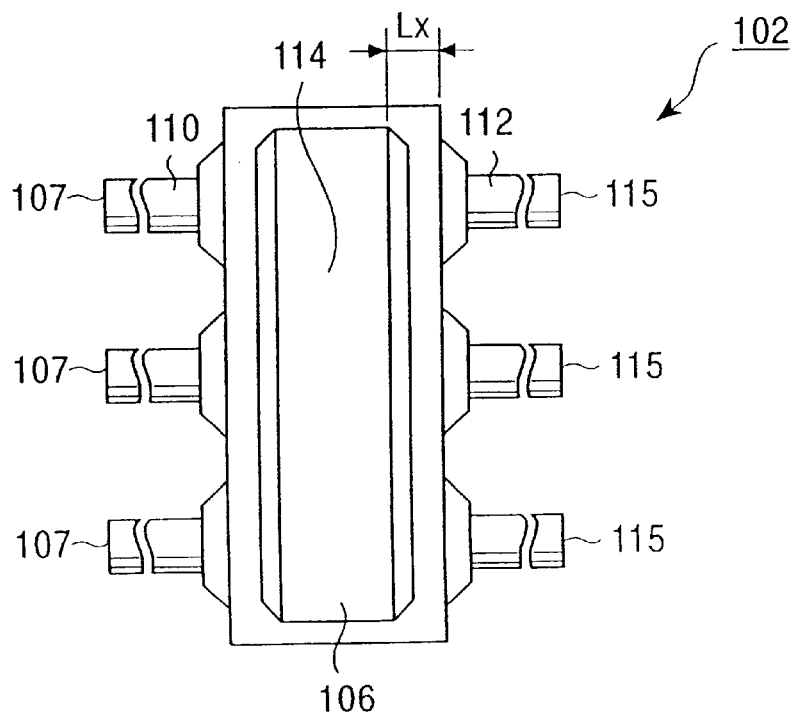

A fifteenth embodiment of the fluid treatment apparatus of the invention will be described with reference to FIGS. 30A and 30B. The fifteenth embodiment has the same configuration as that of the foregoing embodiment shown in FIGS. 30A and 30B, except that light irradiating means 380 is used in place of the ultrasonic element 116. In the present embodiment, there stands a relationship Ly=0 as shown in the embodiment of FIG. 14, i.e., the treatment fluid flows in contact with the object to be treated in the parallel flow section.

A sixteenth embodiment of the fluid treatment apparatus of the invention will be described with reference to FIG. 32. The sixteenth embodiment has the same configuration as that of the foregoing embodiment shown in FIG. 32, except that light irradiating means 380 is used in place of the ultrasonic element 116, and an inner extension 270 is made of a material different from that for introducing sections 110a and 110b.

A seventeenth embodiment of the fluid treatment apparatus of the invention will be described with reference to FIG. 33A. The seventeenth embodiment has the same configuration as that of the foregoing embodiment shown in FIG. 33A, except that light irradiating means 380 is used in place of the ultrasonic element 116.

As in the variation shown in FIG. 33B, portions which may be brought into contact with the other components on the outer periphery of the object to be treated 1 (for example, the portion on which no semiconductor device is formed) should preferably be brought into contact with a sealing member 280 of the fluid treatment apparatus. In FIG. 33B, the reference numeral 380 represents light irradiating means.

Figure 34A:
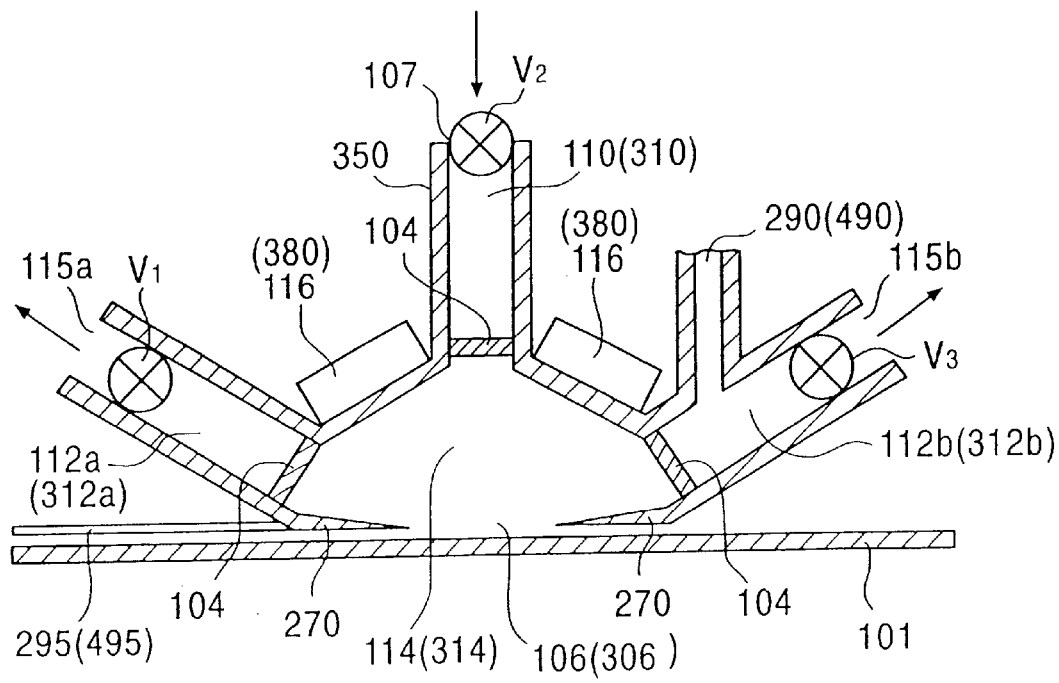
FIG. 34A is a sectional side view and FIG. 34B is a plan view, respectively, of a further embodiment of the invention.
Figure 34B:
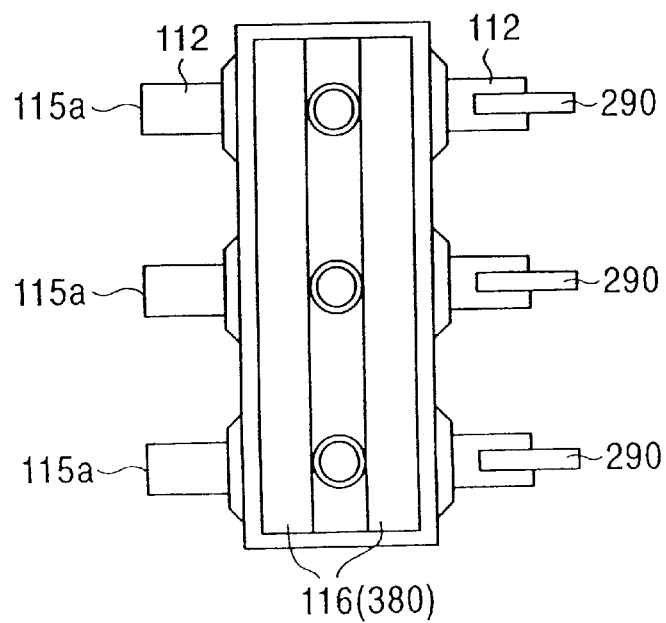

An eighteenth embodiment of the fluid treatment apparatus of the invention will be described with reference to FIGS. 34A and 34B. The eighteenth embodiment has the same configuration as that of the foregoing embodiment shown in FIGS. 34A and 34B, except that light irradiating means 380 is employed in place of the ultrasonic element 116.

An nineteenth embodiment of the fluid treatment apparatus of the invention will be described with reference to FIG. 35. The nineteenth embodiment has the same configuration as that of the foregoing embodiment shown in FIG. 35, except that light irradiating means 380a and 380b are used in place of the ultrasonic elements 116a and 116b.

The present embodiment is quite similar to the twenty-second embodiment, except that light irradiating means 380 is used in place of the ultrasonic elements 116a and 116b.

Figure 36A:
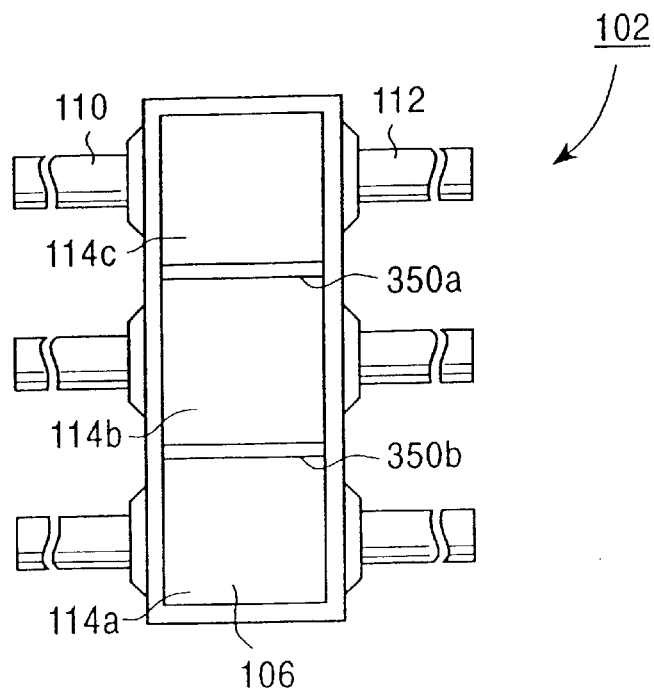
FIG. 36A is a bottom view of a wet treatment liquid feed nozzle of a further embodiment of the invention as viewed from below.
Figure 36B:
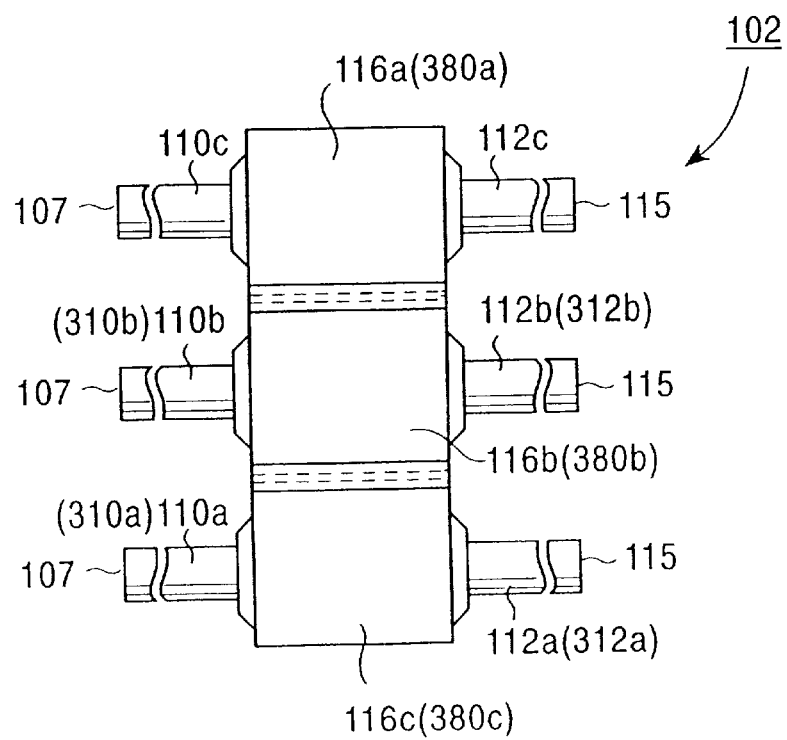
FIG. 36B is a plan view of the same as viewed from above.

An twentieth embodiment of the fluid treatment apparatus of the invention will be described with reference to FIGS. 36A and 36B. The twentieth embodiment has the same configuration as that of the foregoing embodiment shown in FIGS. 36A and 36B, except that light irradiating means 380a, 380b and 380c are employed in place of the ultrasonic elements 116a, 116b and 116c.

Figure 46:
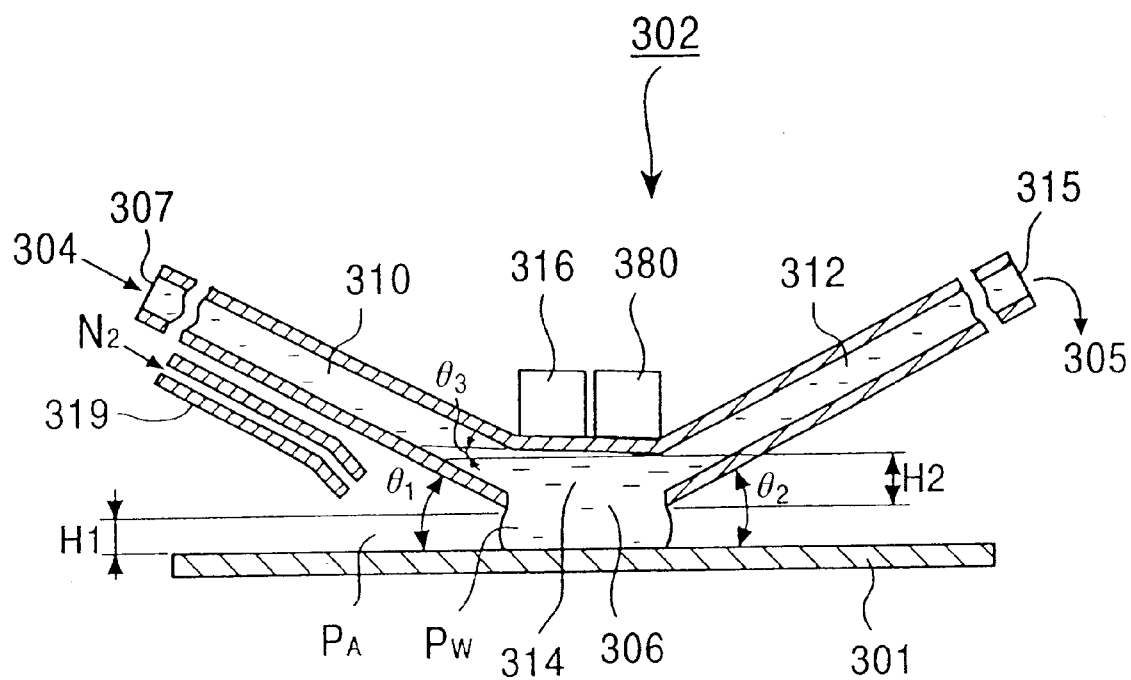
FIG. 46 is a sectional side view of a further embodiment of the invention.

FIG. 46 illustrates the twentieth embodiment of the fluid treatment apparatus of the invention.

In FIG. 46,

Reference numeral 301 is an object to be treated;
Reference numeral 302 is a fluid treatment apparatus;
Reference numeral 304 is a treatment fluid before use;
Reference numeral 305 is a treatment fluid after use;
Reference numeral 306 is an opening;
Reference numeral 307 is an introducing port;
Reference numeral 310 is an introducing path;
Reference numeral 312 is a discharging path;
Reference numeral 314 is a fluid treatment path;
Reference numeral 315 is a discharging port;
Reference numeral 319 is a contact preventing gas ejecting section;
Reference numeral 316 is an ultrasonic element;
Reference numeral 380 is light irradiating means;
Reference numeral H1 is a distance between the opening and the treated surface of the object to be treated;
Reference numeral H2 is a distance between the ceiling of the fluid treatment section and the opening;
Reference numeral $\theta_1$ is an angle between the introducing path and the treated surface;
Reference numeral $\theta_2$ is an angle between the discharging path and the treated surface;
Reference numeral $\theta_3$ is an angle between the ceiling of the fluid treatment section and the treated surface;
Reference numeral PA is the atmospheric pressure; and
Reference numeral Pw is the pressure of the treatment fluid.

This is an embodiment in which light irradiating means 380 and an ultrasonic element 316 are simultaneously provided. In the case shown in FIG. 46, the light irradiating means 380 and the ultrasonic element 316 are provided adjacent to each other. However, when simultaneously providing the light irradiating means 380 and the ultrasonic element 316, the arrangement id not limited to that shown in FIG. 46, but as shown in FIG. 9A the light irradiating means 380 may be provided on one side and the ultrasonic element 16 may be provided on the other side, with the discharging path 12 in between.

In FIG. 46, one of the two light irradiating means 380 presented in the foregoing twelfth, thirteenth, sixteenth, seventeenth, eighteenth and nineteenth embodiments of the fluid treatment apparatus of the invention may be replaced by an ultrasonic element.

It is needless to mention that any other arrangement may be adopted.

When generating a chemically active species by irradiating a light to a fluid, for example, the light may fail to reach a large depth (the position of the object to be treated 301 is the deepest in the cases shown in FIG. 46). As a result, the concentration distribution of the active species may sometimes be the densest near the light irradiating means 380 and the thinnest on the surface of the object to be treated 301 where it is desired to achieve the densest concentration.

Although the cause is not necessarily clear, the present invention found that imparting an ultrasonic wave together with irradiation of the light made it available the densest concentration near the surface of the object to be treated.

It is therefore possible to increase the concentration of the active species on the surface of the object to be treated by providing the light irradiating means 380 and the ultrasonic element 316, and simultaneously operating the both.

Figure 47:
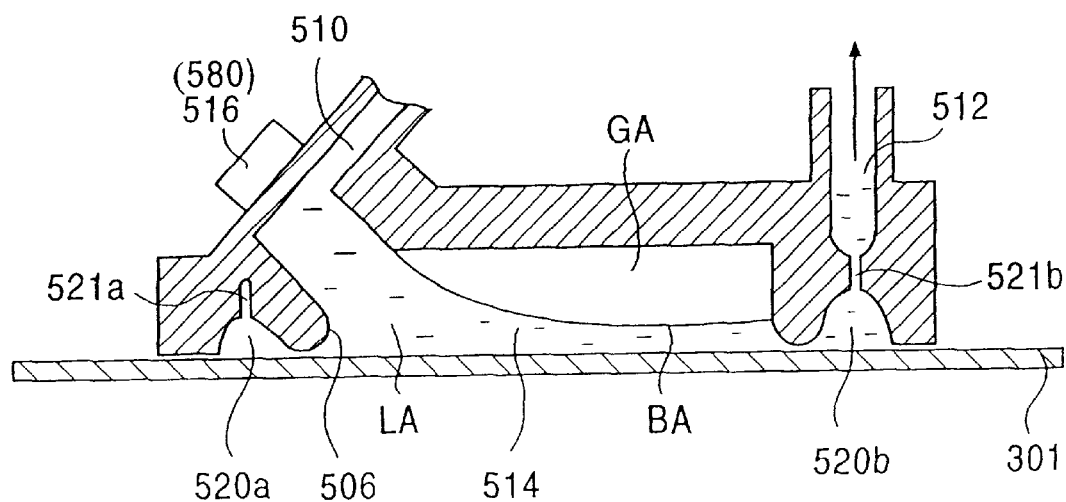
FIG. 47 is a sectional view illustrating a further embodiment of the fluid treatment apparatus.

FIG. 47 illustrates a twenty-first embodiment of the fluid treatment apparatus of the invention.

The apparatus of this embodiment comprises a fluid treating path which, after bringing the treatment fluid from the opening 506 into contact with the object to be treated 301, brings the treatment fluid back to the opening 506, an introducing path 510 for introducing the treatment fluid into the fluid treating path, a discharging path 512 for discharging the treatment fluid brought from the fluid treating path 514 back to the opening 506, and liquid sumps 520a and 520b provided around the opening 506. The fluid treating path comprises a gas area GA, a liquid area LA, and a gas-liquid interface BA.

The liquid sumps are continuously formed around the opening 506, so that the liquid sump 520a and the liquid sump 520b in FIG. 47 communicate with each other.

In this embodiment, the discharging path 512 is provided above the liquid sump 520b. The treatment fluid after treatment is therefore discharged only through the liquid sumps.

In this embodiment, the discharging path 512 communicates with the liquid sump 520b through a fine groove 521b. The treatment fluid after treatment collected in the liquid sumps sucked into the discharging path through the fine groove under the effect of capillary action without dropping and discharged.

Figure 48:
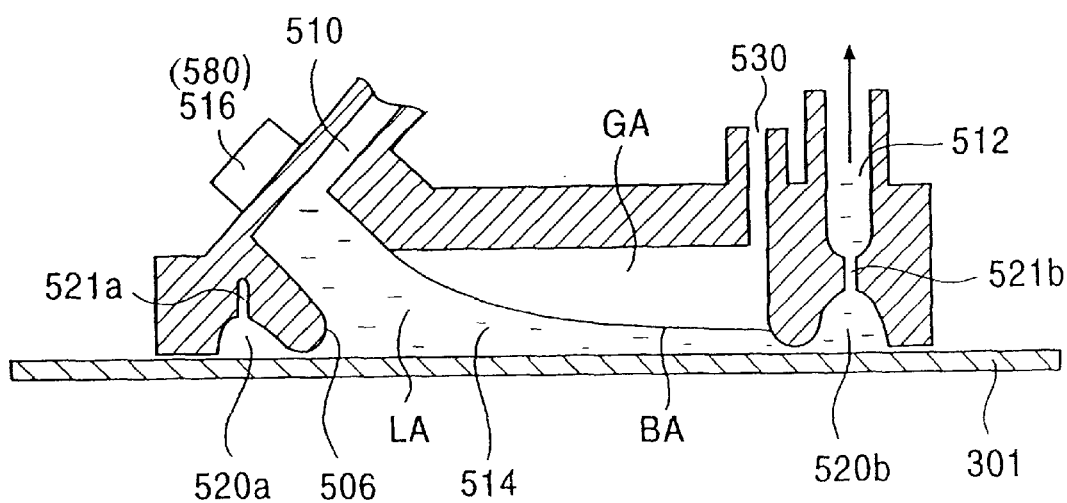
FIG. 48 is a sectional view illustrating a further embodiment of the fluid treatment apparatus.

A twenty-second embodiment of the fluid treatment apparatus of the invention is illustrated in FIG. 48.

The fluid treatment apparatus of this embodiment comprises a fluid treating path 514 which, after bringing the treatment fluid from the opening 506 into contact with the object to be treated 301, brings the treatment fluid back to the opening 506, and introducing path 510 for introducing the treatment fluid into the fluid treating path 514, a discharging path 512 for discharging the treatment fluid brought from the fluid treating path 514 back to the opening 506, a pressure adjusting port 530 for adjusting the position of the gas-liquid interface communicating with the fluid treating path 514, and liquid sumps 520a and 520b provided around the opening 506. The fluid treating path 514 and the discharging path 512 communicate with each other through the liquid sump 520b.

A treatment liquid serving as the treatment fluid is introduced from the introducing path 510 into the fluid treating path 514 and is brought into contact with the object to be treated 301. By applying an appropriate pressure at the pressure adjusting port, when a gas is present in the treatment fluid, the gas is directed toward the pressure adjusting port and leaves the treatment liquid, thus forming a gas area GA and a liquid area LA in the fluid treating path 514. BA is a gas-liquid interface. The gas from the gas area GA is totally or partially discharged through the pressure adjusting port 530 to outside.

In this embodiment, on the other hand, the treatment liquid is collected in the liquid sumps 520a and 520b. The fluid treating path 514 and the discharging path 512 do not communicate directly with each other, but communicate with each other through the liquid sump 520b and a fine groove 521b. The treatment liquid is therefore collected in the liquid sump 520b, sucked up through the fine groove 521b under the effect of capillary action, and discharged from the discharging path 512.

In this embodiment, an ultrasonic element 516 is provided for the purpose of imparting an ultrasonic wave to the treatment liquid. When an ultrasonic wave or a light is applied to the treatment liquid by means of the ultrasonic element 516, and when the treatment liquid is a washing solution, for example, there is available a remarkable improvement of washing effect. Light irradiating means 580 may be provided at the same position in place of the ultrasonic element 516.

Since the fluid treating path 514 does not communicate directly with the fluid discharging path 512 in this embodiment, the space in the fluid treating path 514 has a close tightness, thus facilitating pressure control in the fluid treating path 514.

Figure 49:
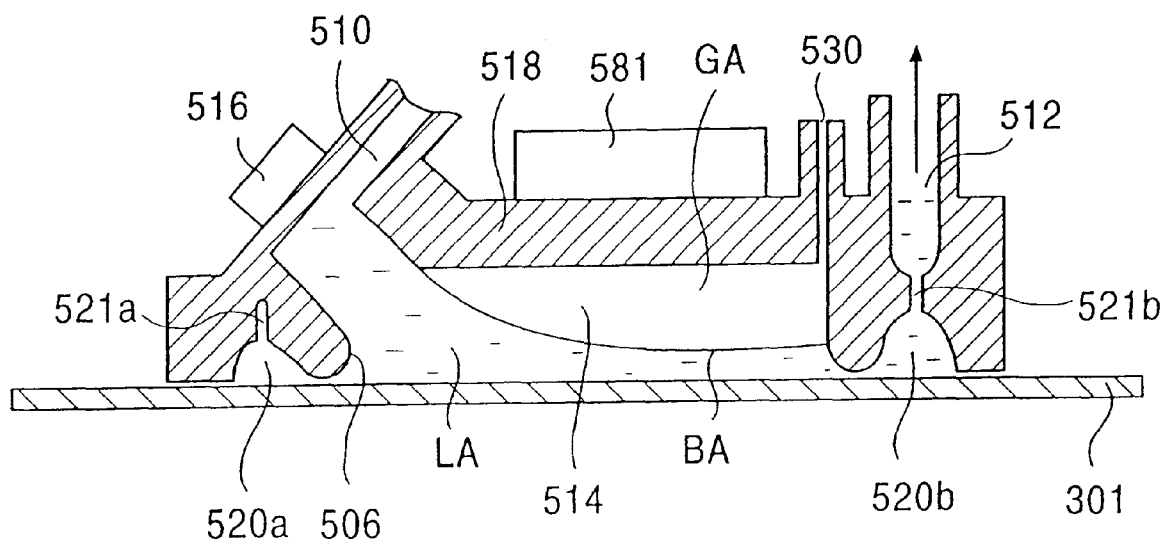
FIG. 49 is a sectional view illustrating a further embodiment of the fluid treatment apparatus.

FIG. 49 illustrates a twenty-third embodiment of the fluid treatment apparatus of the invention.

This embodiment comprises the embodiment shown in FIG. 48 further provided with light irradiating means 581 arranged on the surface of the ceiling 518 of the fluid treatment apparatus main body between the introducing path 510 and the pressure adjusting port 530.

As described as to the foregoing embodiments, it is possible to conduct sterilization and the like by irradiating a light of an appropriate wavelength to the treatment fluid by the use of the light irradiating means 581. In the present embodiment, the light may be irradiated for the purpose of decomposing the gas in the gas area GA.

The other points are the same as those in the embodiment described with reference to FIG. 48.

Now, embodiments of the washing system will be described.

A washing system is illustrated in FIG. 50.

The washing system of this embodiment is the same as that of the first embodiment of the liquid treatment apparatus of the invention shown in FIG. 40, and comprises gas treatment units 302aF and 302aB communicating with washing units 302bF and 302bB.

More specifically, the washing system of the embodiment comprises a gas treating path 314 which, after bringing the treatment gas from an opening 306 shown in FIG. 40 into contact with the object to be treated 301, brings the treatment gas back to the opening 306, an introducing path 310 for introducing the treatment gas into the gas treating path 314, a discharging path 312 for discharging the treatment gas brought from the gas treating path 314 back to the opening 306, and gas treatment units 302aF and 302aB comprising light irradiating means 380 for irradiating a light onto the treatment gas in the gas treating path 314, which communicate with washing units 302bF and 302bB for washing the object to be treated 301, having been treated by the gas treatment units 302aF and 302aB, with a washing liquid.

This embodiment will be described further in detail below.

When composing a washing system with the use of the gas treatment unit 302 (302aF and 302aB in FIG. 50A) shown in FIG. 40, the openings 306 of the gas treatment units 302aF and 302aB is directed toward the object to be treated 301 as shown in FIG. 50A, and it suffices to provide means for causing relative displacement of the gas treatment units 302aF and 302aB and the object to be treated 301 in the arrow A direction, for example, a roller conveyor (not shown) of the substrate 301.

The washing system has a treatment gas source (not shown) and means (not shown) for feeding the treatment gas from the treatment gas source to the introducing ports 307 of the gas treatment units 302aF and 302aB. A heater, a temperature adjusting unit and a temperature holding unit should preferably be provided at appropriate positions to cope with the necessity to treat the object to be treated at a temperature of 70 to 80° C. as in a stripping step of resist.

With a view to simultaneously conducting gas treatment of both the surface and the back of the object to be treated 301, the gas treatment units 302aF and 302aB are arranged in pair with the object to be treated 301 in between in FIG. 50B.

As shown in FIG. 50B, the pair of gas treatment units 302aF and 302aB are in contact with each other at the both ends thereof to form a tunnel-shaped space, through which the object to be treated 301 travels. Therefore, even when the treatment fluid flows from the end face (a plane perpendicular to the surface of the sheet in the drawing), the flowing treatment fluid can be received by the fluid treatment unit 302aB in the downstream thereof.

Washing units 302bF and 302bB are further provided in the downstream in the travelling direction of the object to be treated 301.

The washing units 302bF and 302bB each comprises a washing treatment path which, after bringing the washing liquid from the opening into contact with the object to be treated, brings the washing liquid back to the opening, an introducing path for introducing the washing liquid into the washing treatment path, another introducing path for introducing the washing liquid brought from the washing treatment path back into the opening into the washing treatment path, and a discharging path for discharging the washing liquid brought from the washing treatment path back into the opening. The system is also provided with pressure control means (not shown). More particularly, the system has the same basic structure as that of the fluid treatment apparatus shown in FIG. 40, except however that the washing unit having an ultrasonic element attached thereto in place of the washing unit except for light irradiating means or the light irradiating means. Any other appropriate washing unit may of course be used.

Further in the downstream of the washing units 302bF and 302bB, there are provided extra-pure water rinsing units 302cF and 302cB for rinsing with extra-pure water, and IPA dryers 302dF and 302dB for IPA (isopropyl alcohol) drying. The extra-pure water rinsing units 302cF and 302cB and the IPA dryers 302dF and 302dB have the same structure as that of the washing units 302bF and 302bB. However, because the washing efficiency is high for the back (lower surface), the ultrasonic element is provided only for the surface (upper surface). When a single treatment fluid is used for all the purposes of treatment, pressure control may be accomplished with a single pressure controller.

Figure 51:
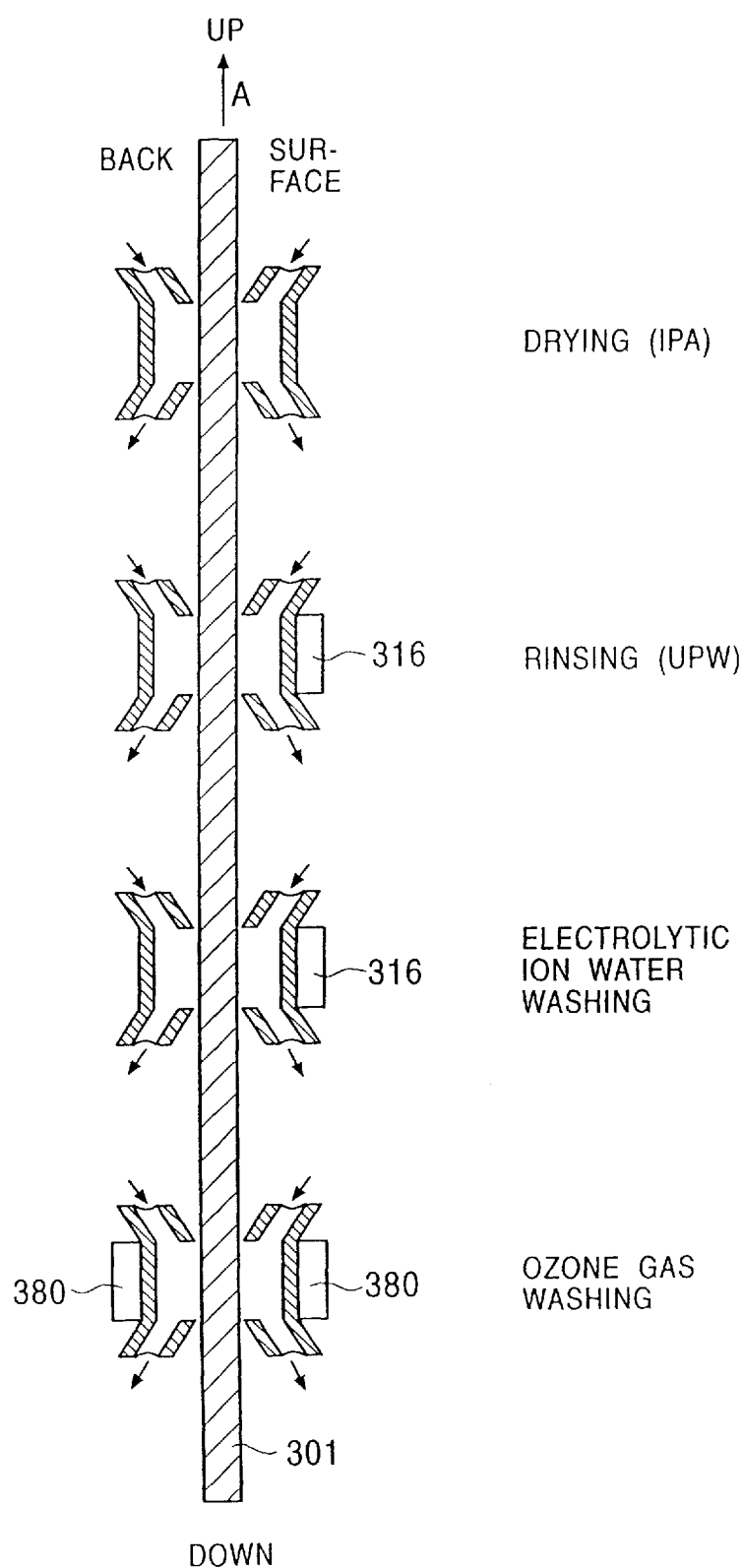
FIG. 51 is a sectional side view of a washing treatment system of another embodiment of the invention.

The case where the object to be treated 301 travels horizontally is shown in FIG. 50A. FIG. 51 illustrates a case where the object to be treated 301 is moved in the vertical direction (up-down direction). Since, in this case, the surface and the back of the object to be treated have no up-down relationship, the surface and the back are uniformly washed.

What is claimed is:

1. A wet treatment method comprising the steps of:
    gradually feeding a wet treatment liquid from an introducing port of a wet treatment liquid feed nozzle to a region opposing an object to be wet-treated, the wet treatment liquid feed nozzle opposing the object to be wet-treated and having the introducing port and a discharging port which are open toward the object to be wet-treated, while cause a relative displacement of the object to be wet-treated and the wet treatment liquid feed nozzle, and
    gradually discharging the wet treatment liquid fed from said wet treatment liquid feed nozzle to the object to be wet-treated through the discharging port without causing the wet treatment liquid to be in contact with portions other than the portion to which the wet treatment liquid has been fed, by controlling a difference between the pressure of the wet treatment liquid in contact with the object to be wet-treated and the atmospheric pressure so as to prevent the wet treatment liquid from flowing out from the region opposing the object to be wet-treated.

2. The wet treatment method of claim 1 wherein the wet treatment fluid is discharged from a discharging port of the wet treatment liquid feed nozzle, and the step of controlling a difference between the pressure of the treatment liquid in contact with the object to be wet treated and the atmospheric pressure includes:
    fluidly coupling a liquid discharge unit with the discharging port; and
    vertically displacing the liquid discharge unit.

3. The wet treatment method of claim 1 wherein the wet treatment fluid is gradually fed into an introducing port of the wet treatment nozzle using a feed pump fluidly coupled with the introducing port, and the wet treatment fluid is discharged from a discharging port of the wet treatment liquid feed nozzle using a reduced-pressure pump, wherein the step of controlling a difference between the pressure of the wet treatment liquid in contact with the object to be wet-treated and the atmospheric pressure includes:
    detecting the pressure of the wet treatment liquid in contact with at least the object to be wet treated; and
    controlling the reduced-pressure pump and the feed pump responsive to the detecting.

4. The wet treatment method of claim 1 further comprising the step of imparting an ultrasonic wave to the wet treatment liquid.

5. The wet treatment method of claim 1 further comprising the step of ejecting a contact preventing gas at least between the wet treatment liquid feed nozzle and the object to be wet-treated to prevent the wet treatment liquid feed nozzle from contacting the object to be wet treated.

6. The wet treatment method of claim 5 wherein the step of ejecting the contact preventing gas includes ejecting an inert gas between the wet treatment liquid feed nozzle and the object to be wet-treated.

7. The wet treatment of claim 1 further comprising irradiating light on the wet treatment liquid fed from the wet treatment liquid feed nozzle.

8. The wet treatment method of claim 1 wherein the treatment liquid feed nozzle comprises:
    a nozzle assembly which has at least one introducing path having an introducing port for introducing a wet treatment liquid at an end thereof, at least one discharging path having a discharging port for discharging the wet treatment liquid after a wet treatment to outside the wet treatment system, a box-shaped crossing section formed by causing said at least one introducing path and said at least one discharging path to cross at the other ends thereof, the introducing path extending upward from one of the sides of the box-shaped crossing section in the longitudinal direction thereof and the discharging path extending upward from the side of the box-shaped crossing section in the longitudinal direction thereof, and an opening section opening to an object to be wet-treated provided at the bottom side of the crossing section, and pressure control means for controlling a difference between pressure of the wet treatment liquid in contact with the object to be wet-treated and the atmospheric pressure so as to prevent the wet treatment liquid in contact with the object to be wet-treated via said opening section from flowing outside said discharging path.

* * * * *

UNITED STATES PATENT AND TRADEMARK OFFICE
CERTIFICATE OF CORRECTION

| | |
|---|---|
| PATENT NO. | : 6,517,635 B2 |
| APPLICATION NO. | : 09/803588 |
| DATED | : February 11, 2003 |
| INVENTOR(S) | : Kenichi Mitsumori et al. |

It is certified that error appears in the above-identified patent and that said Letters Patent is hereby corrected as shown below:

<u>Title page, item [75] Inventors</u>:

Change the name of listed inventor Takayuki Imaoka to Takashi Imaoka.

Signed and Sealed this

Twenty-seventh Day of April, 2010

David J. Kappos
*Director of the United States Patent and Trademark Office*